US011974406B2

(12) United States Patent
Lee et al.

(10) Patent No.: US 11,974,406 B2
(45) Date of Patent: Apr. 30, 2024

(54) ELECTRONIC DEVICE INCLUDING FLEXIBLE DISPLAY

(71) Applicant: Samsung Electronics Co., Ltd., Suwon-si (KR)

(72) Inventors: Seungjoon Lee, Suwon-si (KR); Youngmin Kang, Suwon-si (KR); Sangmin Kim, Suwon-si (KR); Daeyoung Noh, Suwon-si (KR); Moonchul Shin, Suwon-si (KR); Byounguk Yoon, Suwon-si (KR); Yeonggyu Yoon, Suwon-si (KR); Jongchul Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 248 days.

(21) Appl. No.: 17/497,617

(22) Filed: Oct. 8, 2021

(65) Prior Publication Data

US 2022/0117101 A1   Apr. 14, 2022

Related U.S. Application Data

(63) Continuation of application No. PCT/KR2021/012939, filed on Sep. 23, 2021.

(30) Foreign Application Priority Data

Oct. 12, 2020  (KR) .................. 10-2020-0131267
Jan. 15, 2021  (KR) .................. 10-2021-0005988

(51) Int. Cl.
*H05K 5/02*  (2006.01)
*H05K 5/00*  (2006.01)

(52) U.S. Cl.
CPC ......... *H05K 5/0217* (2013.01); *H05K 5/0017* (2013.01)

(58) Field of Classification Search
CPC .... G06F 1/1624; G06F 1/1681; G06F 1/1626; G06F 1/16; G06F 1/1675; G06F 1/1601;
(Continued)

(56) References Cited

U.S. PATENT DOCUMENTS 8,199,471 B2   6/2012   Bemelmans et al.
8,711,566 B2   4/2014   O'Brien
(Continued)

FOREIGN PATENT DOCUMENTS

KR   10-2015-0076119 A   7/2015
KR   10-2019-0077107 A   7/2019
(Continued)

OTHER PUBLICATIONS

International Search Report dated Jan. 19, 2022, issued in International Application No. PCT/KR2021/012939.
(Continued)

*Primary Examiner* — Michael A Matey
(74) *Attorney, Agent, or Firm* — Jefferson IP Law, LLP

(57) ABSTRACT

An electronic device is provided. The electronic device includes a first structure, a second structure coupled to the first structure so as to be slidable, a display including at least one portion disposed on the first structure and another portion accommodated in the second structure, the display being configured such that a size of an exposed region that forms a front side of the electronic device varies in response to a sliding motion of the second structure, a display support member disposed on a rear surface of a partial region of the display to support the partial region of the display, a first driving member that connects one side of the first structure and one side of the second structure and provides a first driving force to the second structure to move the second structure relative to the first structure, and a second driving member that is disposed on at least one of the first structure
(Continued)

or the display support member and that provides a second driving force to the display support member to move a portion of the display support member relative to the first structure.

20 Claims, 20 Drawing Sheets

(58) Field of Classification Search
CPC ............ H04M 1/0237; H04M 1/0235; H04M 2201/38; H04M 1/0277; H04M 1/0239; H04M 1/026; H04M 1/022; H04M 1/0266; H05K 1/148; H05K 2201/10128; H05K 5/0217; H05K 5/0017; H05K 5/0004; H05K 7/20954; E05D 3/18; E05D 1/04; F16C 29/00
See application file for complete search history.

(56) References Cited

U.S. PATENT DOCUMENTS

| | | | | |
|---|---|---|---|---|
| 9,195,272 | B2* | 11/2015 | O'Brien | H04M 1/0268 |
| 9,286,812 | B2* | 3/2016 | Bohn | H10K 50/84 |
| 9,514,573 | B2 | 12/2016 | Grimaud | |
| 9,678,539 | B2* | 6/2017 | Hayk | G06F 1/1624 |
| 10,742,784 | B1 | 8/2020 | Jo et al. | |
| 10,743,427 | B2 | 8/2020 | Huang | |
| 10,747,269 | B1* | 8/2020 | Choi | H04M 1/0237 |
| 10,820,433 | B2 | 10/2020 | Cha | |
| 10,880,417 | B1* | 12/2020 | Song | G06F 1/1652 |
| 10,887,438 | B2 | 1/2021 | Baek et al. | |
| 10,972,592 | B2 | 4/2021 | Song et al. | |
| 10,976,775 | B1* | 4/2021 | Cha | H05K 7/1401 |
| 10,993,338 | B2 | 4/2021 | Cha | |
| 11,003,207 | B2 | 5/2021 | Kim et al. | |
| 11,003,217 | B2 | 5/2021 | Cha | |
| 11,140,252 | B1* | 10/2021 | Choi | G06F 1/1624 |
| 11,165,897 | B2 | 11/2021 | Song et al. | |
| 11,212,379 | B2 | 12/2021 | Baek et al. | |
| 11,526,198 | B1* | 12/2022 | Kanas | G06F 1/1624 |
| 11,644,867 | B2* | 5/2023 | Ahn | G06F 1/1647 |
| | | | | 361/679.27 |
| 11,647,598 | B2* | 5/2023 | Zhang | G06F 1/1652 |
| | | | | 361/807 |
| 2010/0113109 | A1 | 5/2010 | Dai et al. | |
| 2010/0177020 | A1 | 7/2010 | Bemelmans et al. | |
| 2012/0314400 | A1* | 12/2012 | Bohn | H04M 1/0237 |
| | | | | 361/679.01 |
| 2014/0194165 | A1* | 7/2014 | Hwang | G06F 3/147 |
| | | | | 455/566 |
| 2015/0187136 | A1 | 7/2015 | Grimaud | |
| 2016/0147261 | A1* | 5/2016 | Bohn | G06F 1/1652 |
| | | | | 455/566 |
| 2018/0014417 | A1* | 1/2018 | Seo | H05K 7/20954 |
| 2018/0103550 | A1* | 4/2018 | Seo | G06F 1/1601 |
| 2018/0198896 | A1* | 7/2018 | Kang | G06F 1/1652 |
| 2019/0268455 | A1 | 8/2019 | Baek et al. | |
| 2019/0302841 | A1* | 10/2019 | Sun | G06F 1/1637 |
| 2019/0317550 | A1 | 10/2019 | Kim et al. | |
| 2019/0384438 | A1* | 12/2019 | Park | G06F 3/0482 |
| 2020/0033913 | A1* | 1/2020 | Yang | H04M 1/0268 |
| 2020/0120814 | A1 | 4/2020 | Huang | |
| 2020/0192434 | A1* | 6/2020 | Huang | G06F 1/1681 |
| 2020/0249722 | A1* | 8/2020 | Cha | G06F 1/1681 |
| 2020/0253069 | A1* | 8/2020 | Cha | G06F 1/1681 |
| 2020/0264660 | A1 | 8/2020 | Song et al. | |
| 2020/0267246 | A1 | 8/2020 | Song et al. | |
| 2020/0267838 | A1* | 8/2020 | An | H04M 1/0216 |
| 2020/0363841 | A1* | 11/2020 | Kim | G06F 1/1626 |
| 2021/0012751 | A1* | 1/2021 | An | G09G 5/00 |
| 2021/0099557 | A1* | 4/2021 | Cha | H04M 1/0268 |
| 2021/0103314 | A1* | 4/2021 | Ko | G06F 1/1624 |
| 2021/0120111 | A1* | 4/2021 | Choi | G06F 1/1624 |
| 2021/0126993 | A1 | 4/2021 | Baek et al. | |
| 2021/0135492 | A1* | 5/2021 | Kim | H02J 50/10 |
| 2021/0181801 | A1* | 6/2021 | Yin | H04M 1/0268 |
| 2021/0195009 | A1* | 6/2021 | Choi | H04M 1/0264 |
| 2021/0219437 | A1* | 7/2021 | Kim | H04M 1/0237 |
| 2021/0240294 | A1* | 8/2021 | Ko | G06F 3/0416 |
| 2021/0263552 | A1 | 8/2021 | Kim et al. | |
| 2021/0278878 | A1* | 9/2021 | Shim | G06F 1/1652 |
| 2021/0278886 | A1* | 9/2021 | Kim | H04M 1/0237 |
| 2021/0306446 | A1* | 9/2021 | Choi | G06F 1/1686 |
| 2021/0320992 | A1* | 10/2021 | Song | F16H 19/04 |
| 2021/0337049 | A1* | 10/2021 | Noh | H04M 1/0237 |
| 2021/0368634 | A1* | 11/2021 | Song | G06F 1/1652 |
| 2021/0375165 | A1* | 12/2021 | Feng | G09F 9/301 |
| 2021/0383727 | A1* | 12/2021 | Han | G06F 1/1624 |
| 2022/0091636 | A1* | 3/2022 | Cho | G06F 1/1637 |
| 2022/0253103 | A1* | 8/2022 | Choi | G06F 1/1652 |
| 2022/0263932 | A1* | 8/2022 | Jo | G06F 1/1681 |
| 2022/0311844 | A1* | 9/2022 | Lee | H04M 1/0268 |
| 2023/0017380 | A1* | 1/2023 | Kim | G06F 1/1652 |
| 2023/0097200 | A1* | 3/2023 | Feng | G06F 1/1652 |
| | | | | 361/679.01 |
| 2023/0164248 | A1* | 5/2023 | Park | H04M 1/0237 |
| | | | | 455/575.4 |
| 2023/0176622 | A1* | 6/2023 | Kim | G06F 1/1652 |
| | | | | 345/156 |
| 2023/0188630 | A1* | 6/2023 | Kim | G06F 1/16 |
| | | | | 455/575.4 |
| 2023/0283697 | A1* | 9/2023 | Kim | H04M 1/0268 |
| | | | | 455/575.4 |

FOREIGN PATENT DOCUMENTS

| | | |
|---|---|---|
| KR | 10-2019-0101605 A | 9/2019 |
| KR | 10-2019-0119719 A | 10/2019 |
| KR | 10-2020-0095301 A | 8/2020 |
| KR | 10-2020-0099455 A | 8/2020 |

OTHER PUBLICATIONS

European Search Report dated Jan. 3, 2024, issued in European Application No. 21880342.7.

* cited by examiner

ELECTRONIC DEVICE INCLUDING FLEXIBLE DISPLAY

CROSS-REFERENCE TO RELATED APPLICATION(S)

This application is a continuation application, claiming priority under § 365(c), of an International application No. PCT/KR2021/012939, filed on Sep. 23, 2021, which is based on and claims priority of a Korean patent application number 10-2020-0131267, filed on Oct. 12, 2020, in the Korean Intellectual Property Office, and of a Korean patent application number 10-2021-0005988, filed on Jan. 15, 2021, in the Korean Intellectual Property Office, the disclosure of each of which is incorporated by reference herein in its entirety.

TECHNICAL FIELD

The disclosure relates to an electronic device including a flexible display. More particularly, the disclosure relates to an electronic device including driving members capable of providing a plurality of driving forces in a partial interval of an expansion operation when a display of the electronic device is expanded.

BACKGROUND ART

An electronic device may include a flexible display. The electronic device may expand a display area visually exposed on the exterior of the electronic device. For example, the flexible display may be disposed in a curved, foldable, or rollable form in the electronic device.

The above information is presented as background information only to assist with an understanding of the disclosure. No determination has been made, and no assertion is made, as to whether any of the above might be applicable as prior art with regard to the disclosure.

DISCLOSURE

Technical Problem

Recently, various forms of electronic devices have been developed to ensure an expanded display area without affecting portability. For example, the electronic devices may include an electronic device of a slidable type in which a fixed structure and a sliding structure are developed relative to each other in a sliding manner or an electronic device of a foldable type in which a first housing and a second housing are disposed to be folded or unfolded.

In the case of the electronic device of the slidable type among the various forms of electronic devices, the area of a flexible display exposed on the front side of the electronic device may be expanded or reduced by a movement of the sliding structure relative to the fixed structure. The electronic device may include at least one drive source that provides a driving force required when the flexible display is expanded.

For example, the drive source may be implemented by using an elastic member. However, in the case of using the elastic member, a driving force may be lost due to friction by components of the electronic device, and therefore operation of the electronic device may be hindered. Furthermore, a user has to apply an external force to the electronic device when changing the state of the electronic device, and an excessive force may be required when the user wants to reduce the expanded electronic device.

Aspects of the disclosure are to address at least the above-mentioned problems and/or disadvantages and to provide at least the advantages described below. Accordingly, an aspect of the disclosure is to provide an electronic device including driving members capable of providing a plurality of driving forces in a partial interval of an expansion operation when a display of the electronic device is expanded.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a first structure, a second structure coupled to the first structure so as to be slidable in a first direction or a second direction opposite to the first direction, a display including one portion disposed on the first structure and another portion accommodated in the second structure, the display being configured such that a size of an exposed region that forms a front side of the electronic device varies in response to a sliding motion of the second structure, a display support member disposed on a rear surface of a partial region of the display to support the partial region of the display, a first driving member that connects one side of the first structure and one side of the second structure and provides a first driving force to the second structure to move the second structure in the first direction relative to the first structure, and a second driving member that is disposed on at least one of the first structure or the display support member and that provides a second driving force to the display support member to move a portion of the display support member in the first direction relative to the first structure.

In accordance with another aspect of the disclosure, an electronic device is provided. The electronic device includes a first structure, a second structure coupled to the first structure so as to be slidable in a first direction or a second direction opposite to the first direction, a display having an exposed region that forms a front side of the electronic device, the width of the exposed region being varied in response to a sliding motion of the second structure relative to the first structure, and the display being configured such that the width of the exposed region increases as the second structure slides in the first direction and the width of the exposed region decreases as the second structure slides in the second direction, a display support member disposed on a rear surface of a partial region of the display, a first driving member that provides a first driving force to the second structure, and a second driving member that provides a second driving force to a portion of the display support member. The electronic device includes a first state in which the width of the exposed region is a first width, a second state in which the width of the exposed region is a second width greater than the first width, and a third state in which the width of the exposed region is a third width greater than the first width and smaller than the second width. The first driving member provides the first driving force to the second structure in the first direction in a deformation interval defined between the first stat and the second state, when the electronic device is changed from the first state to the second state. The second driving member provides the second driving force to the display support member in the first direction in a first interval defined between the first state and the third state in the deformation interval, when the electronic device is changed from the first state to the second state.

Advantageous Effects

According to the various embodiments of the disclosure, when the electronic device is changed from the closed state to the open state, the first driving force and the second driving force may act together at the initial stage of the deformation operation. Accordingly, driving forces for deformation of the electronic device may be ensured, and the operation may be improved.

Furthermore, according to the various embodiments of the disclosure, when the electronic device is changed from the open state to the closed state, the first driving force may act at the initial stage of the deformation operation, and the second driving force may act together with the first driving force at the final stage of the deformation operation. Accordingly, an excessive force may be prevented from being required when the state of the electronic device is changed.

In addition, the disclosure may provide various effects that are directly or indirectly recognized.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the spirit and scope of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
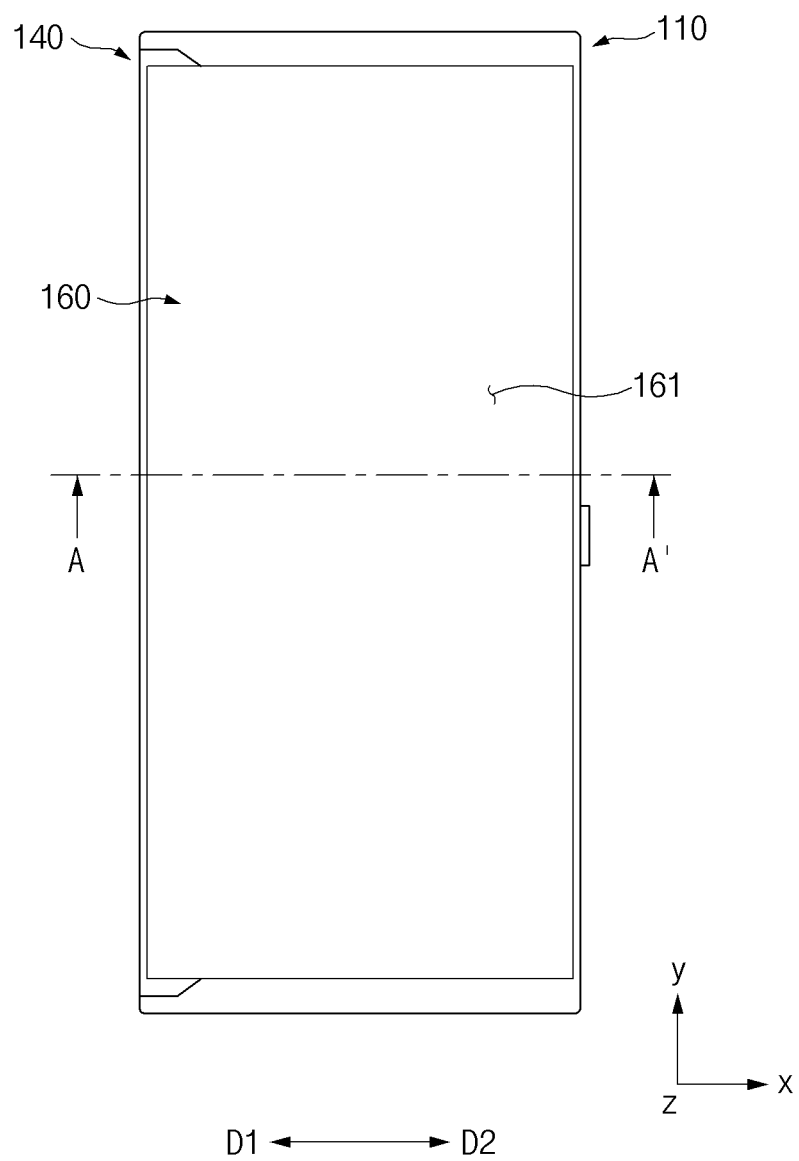
FIG. 1 is a view illustrating a first state of an electronic device according to an embodiment of the disclosure.
Figure 2:
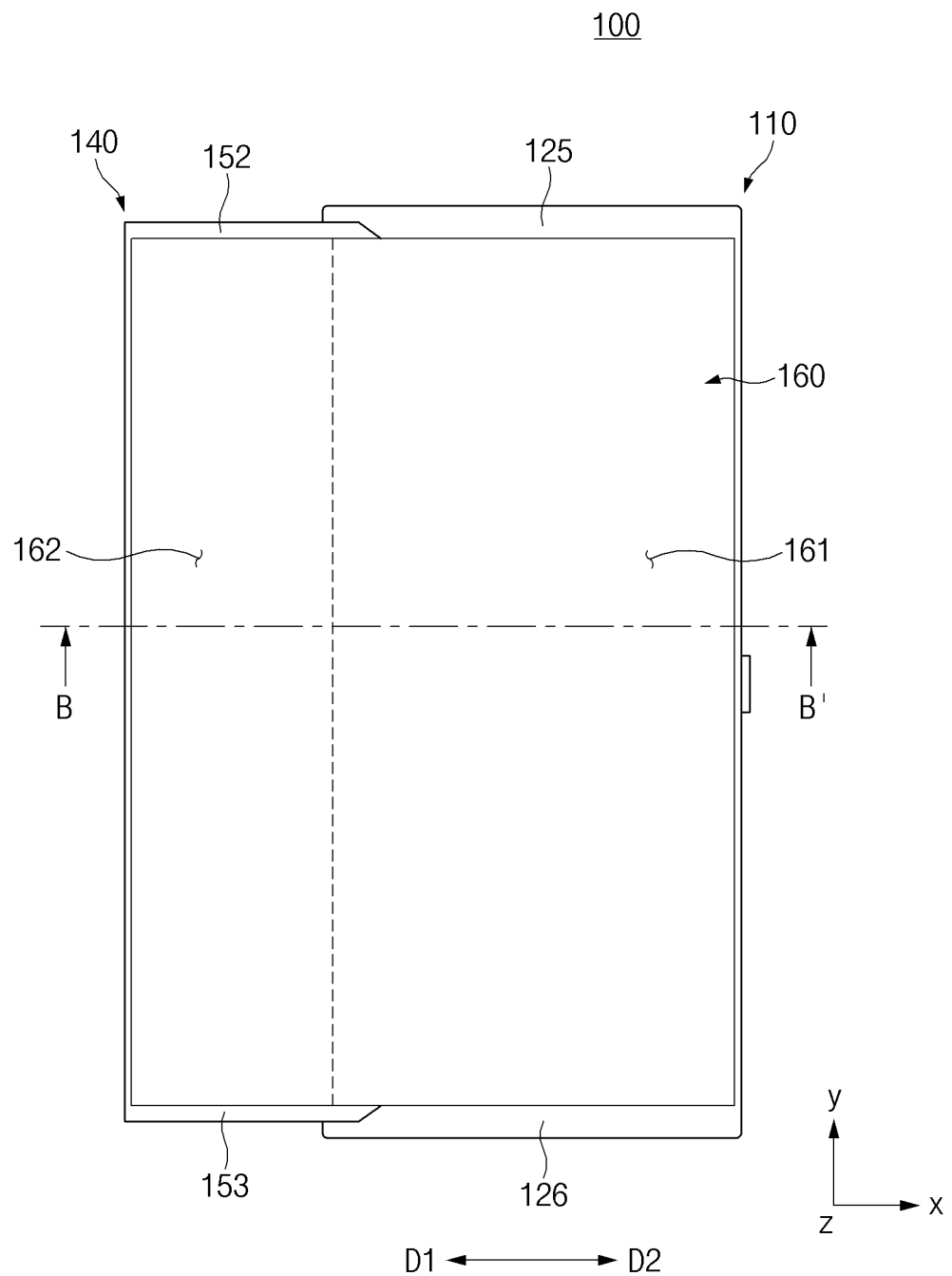
FIG. 2 is a view illustrating a second state of an electronic device according to an embodiment of the disclosure.

FIG. 1 is a view illustrating a first state of an electronic device according to an embodiment of the disclosure. FIG. 2 is a view illustrating a second state of an electronic device according to an embodiment of the disclosure.

Referring to FIGS. 1 and 2, the electronic device 100 according to an embodiment may include a first structure 110, a second structure 140, and a display 160.

In an embodiment of the disclosure, the electronic device 100 may be an electronic device of a slidable type or a rollable type and may include the first state (e.g., a closing mode or a reduction mode) and the second state (e.g., an opening mode or an expansion mode). The first state and the second state of the electronic device 100 may be determined depending on the position of the second structure 140 relative to the first structure 110. The electronic device 100 may be changed (or, switched) between the first state and the second state by a user operation or a mechanical operation.

In an embodiment of the disclosure, the first state may refer to a state in which the area (or, size) of the display 160 that is exposed on the front side (e.g., the side facing the +z-axis direction) of the electronic device 100 (or, that forms the front side) is relatively reduced (refer to FIG. 1). The second state may refer to a state in which the area (or, size) of the display 160 that is exposed on the front side of the electronic device 100 or forms the front side is relatively expanded (refer to FIG. 2). For example, the second state may be a state in which the area of the display 160 visually exposed on the front side of the electronic device 100 is larger than that in the first state, and the area of the display 160 exposed on the front side of the electronic device 100 may be largest when the electronic device 100 is in the second state. Furthermore, the first state may refer to a closed state in which part (e.g., at least part of a fourth sidewall 152 and at least part of a fifth sidewall 153) of the second structure 140 is located inward of decorative members 125 and 126 of the first structure 110 so that the second structure 140 is closed to the first structure 110. The second state may refer to an opened state in which part of the fourth sidewall 152 and part of the fifth sidewall 153 move out of the first structure 110 so that the second structure 140 is open to the first structure 110.

In an embodiment of the disclosure, the first structure 110 and the second structure 140 may be coupled so as to be slidable relative to each other. The second structure 140 may be slidably coupled to one side of the first structure 110. For example, the first structure 110 may be a fixed structure, and the second structure 140 may be a structure movable relative to the first structure 110. The second structure 140 may be coupled to the one side of the first structure 110 so as to be slidable relative to the first structure 110 in opposite directions D1 and D2 (e.g., the +x/−x-axis directions).

In an embodiment of the disclosure, the second structure 140 may slide relative to the first structure 110 to change the electronic device 100 to the first state and the second state. For example, the electronic device 100 may be changed to the second state (e.g., the state of FIG. 2) as the second structure 140 moves in the first direction D1 relative to the first structure 110 in the first state (e.g., the state of FIG. 1). In contrast, the electronic device 100 may be changed to the first state as the second structure 140 moves in the second direction D2 relative to the first structure 110 in the second state.

In an embodiment of the disclosure, the size (or, area) of a region of the display 160 visually exposed on the front side of the electronic device 100 may be changed in response to a sliding motion of the second structure 140. The display 160 may be configured such that the exposed region thereof is expanded or reduced as at least part of the display 160 turns and linearly moves depending on the sliding motion of the second structure 140 in the state in which the display 160 is supported by other components (e.g., a bracket 130 and a display support member 170 of FIG. 3) of the electronic device 100. The display 160 may at least partially include a flexible portion.

In an embodiment of the disclosure, the display 160 may include a first region 161 and a second region 162 extending from the first region 161. The first region 161 may form the front side of the electronic device 100. For example, the first region 161 may remain visually exposed on the front side of the electronic device 100 irrespective of the states of the electronic device 100. The second region 162 may form the front side of the electronic device 100 in the second state. For example, whether the second region 162 is exposed on the front side of the electronic device 100 may be determined depending on the states of the electronic device 100. The area by which the second region 162 is exposed on the front side of the electronic device 100 may vary depending on a sliding distance of the second structure 140.

In an embodiment of the disclosure, the second region 162 may extend from the first region 161 in one direction. For example, the direction in which the second region 162 extends from the first region may be substantially the same as the first direction D1 in which the second structure 140 moves when the electronic device 100 is expanded. For example, the first region 161 may refer to a partial region of the display 160 visually exposed on the front side of the electronic device 100 in the first state. The second region 162 may refer to a region that is located inside the electronic device 100 in the first state and that at least partially moves out of the electronic device 100 in the second state and is visually exposed on the front side of the electronic device 100.

In an embodiment of the disclosure, the first state may be a state in which the first region 161 forms the front side of the electronic device 100 and the second region 162 is located inside the second structure 140. The second state may be a state in which at least part of the second region 162, together with the first region 161, forms the front side of the electronic device 100. The display 160 may form a screen display area that is visually exposed on the front side of the electronic device 100 and on which predetermined visual information (or, a screen) is displayed. For example, in the first state, the screen display area may be formed by the first region 161. In the second state, the screen display area may be formed by part of the second region 162 and the first region 161. In the second state, the electronic device 100 may provide an expanded screen display area, as compared with when the electronic device 100 is in the first state.

Figure 3:
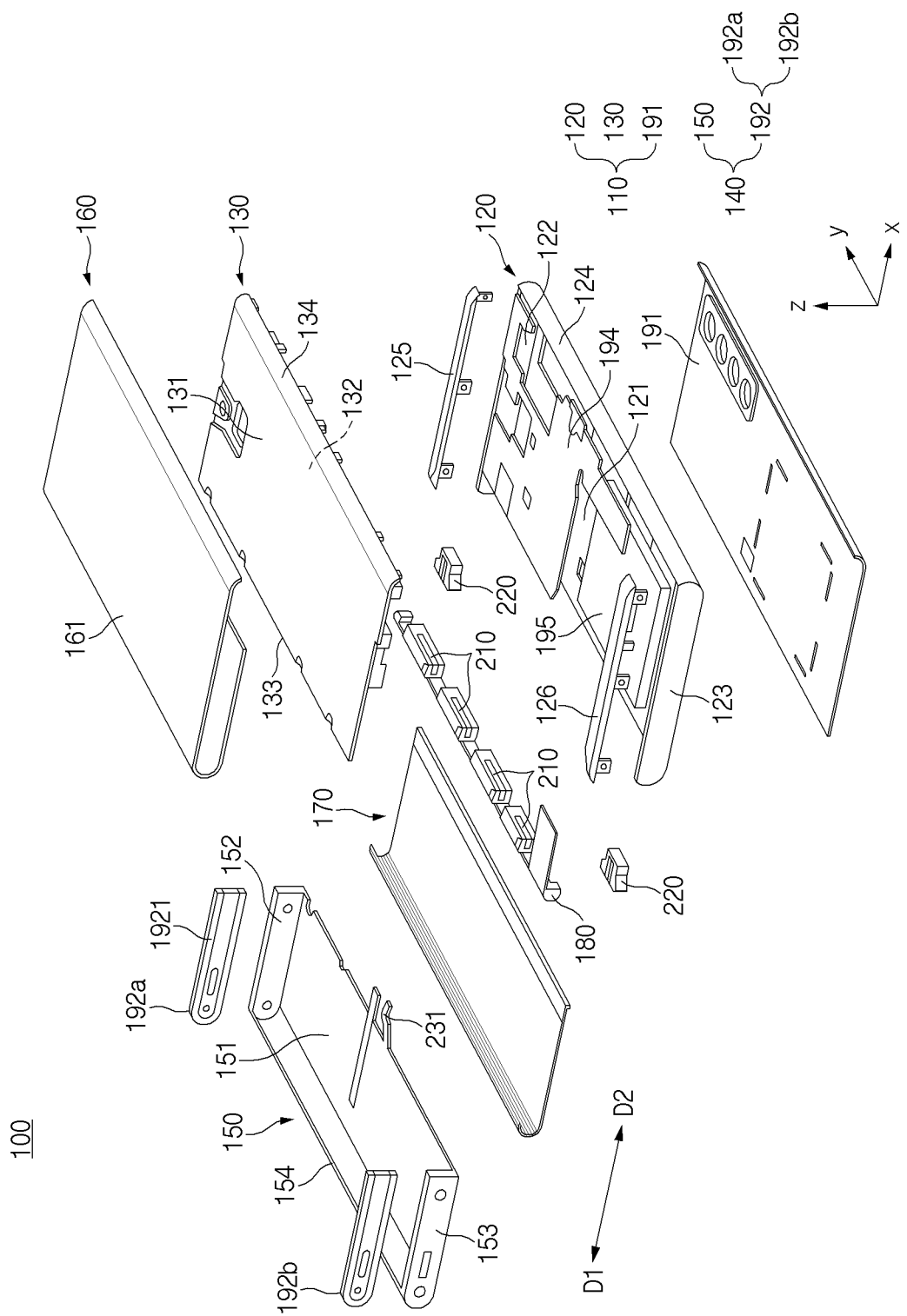
FIG. 3 is an exploded perspective view of an electronic device according to an embodiment of the disclosure.

FIG. 3 is an exploded perspective view of an electronic device according to an embodiment of the disclosure.

Referring to FIG. 3, the electronic device 100 according to an embodiment may include the first structure 110, the second structure 140, the display 160, the display support member 170, a support bar 180, a first driving member 210, a second driving member 220, a circuit board 194, and a battery 195.

In an embodiment of the disclosure, the first structure 110 may include a first case 120, a back cover 191, and the bracket 130. For example, the first structure 110 may be formed through a coupling structure in which the bracket 130 and the back cover 191 are coupled to the first case 120. The back cover 191 and the bracket 130 may be fixed to the first case 120, and the second structure 140 may move relative to the first case 120, the back cover 191, and the bracket 130. For example, the first structure 110 may be a fixed structure on which a relative movement of the second structure 140 is based. According to the illustrated embodiment of the disclosure, the first structure 110 may be configured such that the first case 120, the bracket 130, and the back cover 191 are assembled. However, this is illustrative, and the first structure 110 may be configured such that at least some of the first case 120, the bracket 130, and the back cover 191 are integrally formed.

In an embodiment of the disclosure, the first case 120 may be disposed between the bracket 130 and the back cover 191. The first case 120, together with the back cover 191, may form part of the exterior of the electronic device 100. The bracket 130 and the back cover 191 may be coupled to the first case 120. For example, the bracket 130 may be coupled to the front side (e.g., the side facing the +z-axis direction) of the first case 120, and the back cover 191 may be coupled to the rear side (e.g., the side facing the −z-axis direction) of the first case 120.

In an embodiment of the disclosure, the first case 120 may include a first plate portion 121 and a plurality of sidewalls 122, 123, and 124 extending from edges of the first plate portion 121.

In an embodiment of the disclosure, the first plate portion 121 may be formed to be substantially flat and may face the bracket 130 and the back cover 191. For example, the circuit board 194 or the battery 195 may be disposed between the first plate portion 121 and the bracket 130, and the back cover 191 may be coupled to the rear side of the first plate portion 121.

In an embodiment of the disclosure, the plurality of sidewalls 122, 123, and 124 may include the first sidewall 122 and the second sidewall 123 extending substantially vertically from the first plate portion 121 and facing each other, and the third sidewall 124 extending substantially perpendicular to the first sidewall 122 and the second sidewall 123. The first sidewall 122 may extend substantially vertically toward the bracket 130 from one longitudinal end portion (e.g., the peripheral portion facing the +y-axis direction) of the first plate portion 121. The second sidewall 123 may extend substantially vertically from an opposite longitudinal end portion (e.g., the peripheral portion facing the −y-axis direction) of the first plate portion 121 to face the first sidewall 122. The third sidewall 124 may extend substantially perpendicular to the first sidewall 122 and the second sidewall 123 to connect the first sidewall 122 and the second sidewall 123.

In an embodiment of the disclosure, the first sidewall 122 may form the side surface facing the +y-axis direction among the side surfaces of the electronic device 100, the second sidewall 123 may form the side surface facing the −y-axis direction among the side surfaces of the electronic device 100, and the third sidewall 124 may form the side surface facing the +x-axis direction among the side surfaces of the electronic device 100. The first case 120 may be formed in a form in which a portion facing the third sidewall 124 is open. The second structure 140 (e.g., a second case 150) may move in the first direction D1 and the second direction D2 with respect to the first case 120 through the open portion of the first case 120.

In an embodiment of the disclosure, the first case 120 may further include the decorative members 125 and 126 coupled to the first sidewall 122 and the second sidewall 123, respectively. The decorative members 125 and 126 may include the first decorative member 125 coupled to the first sidewall 122 and the second conductive member 126 coupled to the second sidewall 123. The decorative members 125 and 126 may improve the completeness of the electronic device 100 in appearance and the aesthetics thereof. For example, in the first state, the first decorative member 125 and the second decorative member 126 may hide part of the fourth sidewall 152 and part of the fifth sidewall 153 of the second structure 140 (e.g., refer to FIG. 1). According to various embodiments of the disclosure, the decorative members 125 and 126 may be integrally formed with the first sidewall 122 and the second sidewall 123.

In an embodiment of the disclosure, the back cover 191 may form the rear side (e.g., the side facing the −z-axis direction) of the electronic device 100. The back cover 191 may be coupled to the rear side of the first case 120. The back cover 191 may be formed in a shape substantially corresponding to the first plate portion 121 of the first case 120. According to various embodiments of the disclosure, the back cover 191 may be integrally formed with the first case 120.

In an embodiment of the disclosure, the bracket 130 may be coupled to the first case 120. For example, the bracket 130 coupled to the first case 120 may form, between the first plate portion 121 and the bracket 130, a space in which other components (e.g., the circuit board 194 or the battery 195) of the electronic device 100 are disposed. The bracket 130 may support part of the display 160, the circuit board 194, or the battery 195. The bracket 130 may have a substantially plate shape and may be formed of a material having a specified rigidity.

In an embodiment of the disclosure, the bracket 130 may include a first surface 131 facing the front side of the electronic device 100 (e.g., the +z-axis direction) and a second surface 132 facing away from the first surface 131 (e.g., the −z-axis direction). For example, the second surface 132 may face the first plate portion 121 of the first case 120.

In an embodiment of the disclosure, the first surface 131 of the bracket 130 may support at least a partial region of the display 160. The first surface 131 may be formed to be flat to support the display 160. Part of the first region 161 of the display 160 may be disposed on the first surface 131. For example, part of the first region 161 of the display 160 may be fixed to the bracket 130 by being attached to the first surface 131. The circuit board 194 and the battery 195 may be disposed on the second surface 132 of the bracket 130. The circuit board 194 and the battery 195 may be fixed to the bracket 130 by being coupled to the second surface 132.

In an embodiment of the disclosure, the first driving member 210 may be connected to one side of the bracket 130. For example, a structure (e.g., a connecting portion 135 of FIG. 4) to which the first driving member 210 is connected may be formed on the one side of the bracket 130. The bracket 130 may include a first edge portion 133 facing the first direction D1 and a second edge portion 134 facing the second direction D2. For example, the first edge portion 133 and the second edge portion 134 may extend substantially perpendicular to the sliding directions of the second structure 140. The first driving member 210 may be connected to the first edge portion 133 of the bracket 130.

In an embodiment of the disclosure, the second structure 140 may include the second case 150 and a guide member 192. For example, the second structure 140 may be formed through a coupling structure in which the guide member 192 is coupled to one side of the second case 150. The second case 150 and the guide member 192 may move together in the opposite directions D1 and D2 relative to the first structure 110.

In an embodiment of the disclosure, the second case 150 may move in the first direction D1 and the second direction D2 relative to the first case 120. The second case 150 may slide in the first direction D1 and the second direction D2 relative to the first case 120 in the state in which at least part of the second case 150 is disposed inside the first case 120. For example, part of the second case 150 may be surrounded by the first plate portion 121 and the plurality of sidewalls 122, 123, and 124 of the first case 120. The guide member 192 and the support bar 180 may be coupled to the second case 150. For example, the second case 150, together with the guide member 192 and the support bar 180, may move relative to the first case 120.

In an embodiment of the disclosure, the second case 150 may include a second plate portion 151 and a plurality of sidewalls 152, 153, and 154 extending from edges of the second plate portion 151.

In an embodiment of the disclosure, the second plate portion 151 may be formed to be substantially flat and may be substantially parallel to the first plate portion 121 of the first case 120. The second plate portion 151 may be disposed between the first plate portion 121 and the bracket 130. For example, the second case 150 may move relative to the first case 120 in the state in which the second plate portion 151 partially overlaps the first plate portion 121.

In an embodiment of the disclosure, a first stopping protrusion 231 may be formed on the second plate portion 151. The first stopping protrusion 231 may be stopped by a stopping structure (not illustrated) (e.g., a second stopping protrusion 232 of FIG. 10) that is formed on the first case 120 and may limit a movement of the second case 150 in the first direction D1. For example, the electronic device 100 may be locked by the first stopping protrusion 231 to maintain the first state. A locking structure by the first stopping protrusion 231 will be described below with reference to FIG. 10.

In an embodiment of the disclosure, the plurality of sidewalls 152, 153, and 154 may include the fourth sidewall 152 and the fifth sidewall 153 extending substantially vertically from the second plate portion 151 and facing each other, and the sixth sidewall 154 extending substantially perpendicular to the fourth sidewall 152 and the fifth sidewall 153. The fourth sidewall 152 may vertically extend from one longitudinal end portion (e.g., the peripheral portion facing the +y-axis direction) of the second plate portion 151. The fifth sidewall 153 may vertically extend from an opposite longitudinal end portion (e.g., the peripheral portion facing the −y-axis direction) of the second plate portion 151 to face the fourth sidewall 152. The sixth sidewall 154 may extend substantially perpendicular to the fourth sidewall 152 and the fifth sidewall 153 to connect the fourth sidewall 152 and the fifth sidewall 153. According to the illustrated embodiment of the disclosure, the sixth sidewall 154 may extend from the second plate portion 151 while forming a curved surface. However, this is illustrative, and the shape of the sixth sidewall 154 is not limited to the illustrated embodiment.

In an embodiment of the disclosure, the fourth sidewall 152 and the fifth sidewall 153 may extend substantially parallel to the sliding directions D1 and D2 of the second case 150, and the sixth sidewall 154 may extend substantially perpendicular to the sliding directions D1 and D2. The fourth sidewall 152 may extend parallel to the first sidewall 122 of the first case 120, and the fifth sidewall 153 may extend parallel to the second sidewall 123 of the first case 120. The second case 150 may be disposed inside the first case 120 such that the fourth sidewall 152 faces the inside surface of the first sidewall 122 and the fifth sidewall 153 faces the inside surface of the second sidewall 123. For example, the second case 150 may move relative to the first case 120 in the state in which the fourth sidewall 152 partially overlaps the first sidewall 122 and the fifth sidewall 153 partially overlaps the second sidewall 123.

In an embodiment of the disclosure, when the electronic device 100 is in the second state, the fourth sidewall 152 and the fifth sidewall 153 may form some of the side surfaces of the electronic device 100 together with the first sidewall 122 and the second sidewall 123. For example, in the second state, the fourth sidewall 152, together with the first sidewall 122, may form the side surface facing the +y-axis direction among the side surfaces of the electronic device 100. In the second state, the fifth sidewall 153, together with the second sidewall 123, may form the side surface facing the −y-axis direction among the side surfaces of the electronic device 100. When the electronic device 100 is in the first state, the fourth sidewall 152 and the fifth sidewall 153 may be hidden by the first sidewall 122 and the second sidewall 123 and may not be exposed in the lateral directions (e.g., the y-axis direction) of the electronic device 100. The sixth sidewall 154 may face the third sidewall 124 and may form the side surface facing the −x-axis direction among the side surfaces of the electronic device 100. The second case 150 may be formed in a form in which a portion facing the sixth sidewall 154 is open.

In an embodiment of the disclosure, the guide member 192 may guide a movement of the display 160 and the display support member 170. The guide member 192 may have guide grooves 1921 in which opposite end portions of the display support member 170 in the lengthwise direction (e.g., the y-axis direction) are disposed. For example, the display support member 170 may move along the guide grooves 1921 in response to a movement of the second case 150 and the guide member 192 in the state in which the opposite longitudinal end portions of the display support member 170 are inserted into the guide grooves 1921. The guide member 192 may guide a movement of the display support member 170 along a predetermined path (or, track) corresponding to the guide grooves 1921 and may support the display support member 170 such that the display support member 170 remains flat.

In an embodiment of the disclosure, the guide member 192 may include a first guide member 192*a* disposed on the fourth sidewall 152 of the second case 150 and a second guide member 192*b* disposed on the fifth sidewall 153 of the second case 150. The first guide member 192*a* and the second guide member 192*b* may be disposed inside the second case 150 to face each other. The first guide member 192*a* and the second guide member 192*b* may be formed in shapes corresponding to the fourth sidewall 152 and the fifth sidewall 153, respectively.

According to the illustrated embodiment of the disclosure, the guide member 192 may be formed as a separate component from the second case 150 and may be coupled to the second case 150. However, without being limited thereto, the guide member 192 may be integrally formed with the second case 150. For example, the guide member 192 may be integrally formed with the fourth sidewall 152 and the fifth sidewall 153, or the guide grooves 1921 may be formed on the inside surfaces of the fourth sidewall 152 and the fifth sidewall 153.

In an embodiment of the disclosure, the display 160 may be supported by the bracket 130 and the display support member 170. For example, a partial region of the display 160 may be fixed to the first structure 110 by being supported on the bracket 130, and another partial region of the display 160 may be configured to turn and linearly move in response to a sliding motion of the second structure 140 in the state of being supported by the display support member 170.

In an embodiment of the disclosure, the display 160 may include the first region 161 and the second region 162 extending from the first region 161. Part of the first region 161 may be disposed on the first surface 131 of the bracket 130. For example, part of the first region 161 may be fixed by being attached to the first surface 131 of the bracket 130. The second region 162 may be supported by the display support member 170. For example, the display support member 170 may be attached to the rear surface of the second region 162, and the second region 162 may move together with the display support member 170.

In an embodiment of the disclosure, the display support member 170 may support at least a partial region of the display 160. The display support member 170 may be attached to the rear surface of the display 160, and at least part of the display support member 170 may be curved (or, bent) in response to sliding of the second structure 140. For example, the display support member 170 may be implemented in a bendable form to partially form a curved surface in response to sliding of the second structure 140.

In an embodiment of the disclosure, the support bar 180 may be disposed in the second case 150 so as to move together with the second structure 140. For example, inside the second case 150, the support bar 180 may be located adjacent to the sixth sidewall 154, and opposite end portions of the support bar 180 may be coupled to the fourth sidewall 152 and the fifth sidewall 153, respectively. The support bar 180 may extend in a direction substantially perpendicular to the sliding directions D1 and D2 of the second structure 140. The first driving member 210 may be connected to one side of the support bar 180. At least part of the support bar 180 may be surrounded by the display support member 170. At least part of the display support member 170 may move along one surface of the support bar 180 in response to sliding of the second structure 140.

In an embodiment of the disclosure, the first driving member 210 may provide a driving force for moving the second structure 140 in the first direction D1 relative to the first structure 110. For example, one end of the first driving member 210 may be connected to the first edge portion 133 of the bracket 130, and an opposite end of the first driving member 210 may be connected to the support bar 180. The first driving member 210 may generate a driving force for pushing the support bar 180 in the first direction D1 with respect to the bracket 130. For example, the second case 150 may move in the first direction D1 relative to the bracket 130 as the first driving member 210 applies a driving force to the support bar 180 in the first direction D1.

In an embodiment of the disclosure, the second driving member 220 may provide a driving force for moving one end portion of the display support member 170 in the first direction D1. For example, the second driving member 220 may be disposed in the first case 120 of the first structure 110. The second driving member 220 may generate a driving force for pushing the one end portion of the display support member 170 in the first direction D1 with respect to the first case 120.

In an embodiment of the disclosure, the circuit board 194 may be disposed in the first structure 110. The circuit board 194 may be disposed between the bracket 130 and the first case 120. For example, the circuit board 194 may be supported by the bracket 130 and may be fixed to the first structure 110 accordingly. The circuit board 194, together with the first structure 110, may move relative to the second structure 140 when the second structure 140 slides.

In an embodiment of the disclosure, the circuit board 194 may include a printed circuit board (PCB), a flexible PCB (FPCB), or a rigid-flexible PCB (RFPCB). Various electronic components included in the electronic device 100 may be electrically connected to the circuit board 194. A processor (e.g., a processor 320 of FIG. 18), a memory (e.g., a memory 330 of FIG. 18), and/or an interface (e.g., an interface 377 of FIG. 18) may be mounted on the circuit board 194.

For example, the processor may include a main processor and/or an auxiliary processor, and the main processor and/or the auxiliary processor may include one or more of a central processing unit, an application processor, a graphic processing unit, an image signal processor, a sensor hub processor, or a communication processor. For example, the memory may include a volatile memory or a nonvolatile memory. For example, the interface may include a high definition multimedia interface (HDMI), a universal serial bus (USB) interface, a secure digital (SD) card interface, and/or an audio interface. Furthermore, the interface may electrically or physically connect the electronic device 100 with an external electronic device and may include a USB connector, an SD card/multimedia card (MMC) connector, or an audio connector.

In an embodiment of the disclosure, the battery 195 may supply power to at least one component of the electronic device 100. The battery 195 may be integrally disposed inside the electronic device 100, or may be disposed so as to be detachable from the electronic device 100. For example, the battery 195 may be disposed in the first structure 110. The battery 195, together with the circuit board 194, may be supported by the bracket 130 and may be fixed to the first structure 110 accordingly. The battery 195, together with the first structure 110, may move relative to the second structure 140 when the second structure 140 slides.

The electronic device 100 illustrated in FIG. 3 may be an embodiment of a slidable (or, rollerable) electronic device, and structures of electronic devices 100 according to various embodiments of the disclosure are not limited to the illustrated embodiment. For example, the electronic devices 100 according to the various embodiments of the disclosure may be implemented with various forms of slidable (or, rollable) electronic devices that include a fixed structure and a movable structure movable relative to the fixed structure and in which a display area is expanded or reduced as a flexible display moves together with the movable structure.

Figure 4:
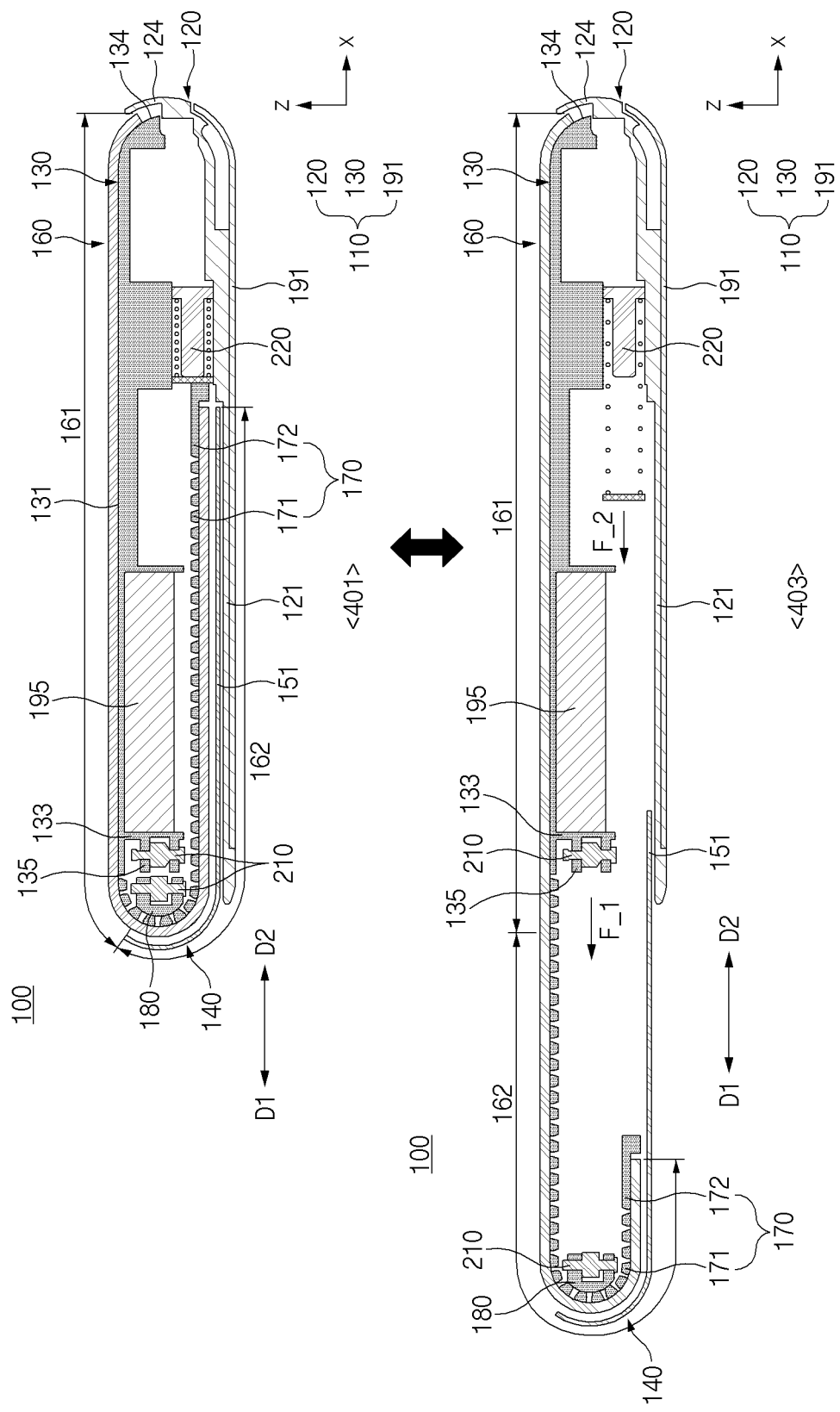
FIG. 4 is a sectional view of an electronic device according to an embodiment of the disclosure.

FIG. 4 is a sectional view of an electronic device according to an embodiment of the disclosure.

Referring to FIG. 4, <401> is a sectional view illustrating the first state of the electronic device, and <403> is a sectional view illustrating the second state of the electronic device.

<401> may be a sectional view of the electronic device taken along line A-A' in FIGS. 1, and <403> may be a sectional view of the electronic device taken along line B-B' in FIG. 2.

Referring to FIG. 4, the electronic device 100 according to an embodiment may include the first structure 110, the second structure 140, the display 160, the display support member 170, the support bar 180, the first driving member 210, the second driving member 220, and the battery 195.

Some of the components of the electronic device 100 illustrated in FIG. 4 are identical or similar to some of the components of the electronic device 100 illustrated in FIGS. 1 to 3, and therefore repetitive descriptions will hereinafter be omitted.

In an embodiment of the disclosure, the electronic device 100 may be changed to the first state (e.g., FIG. 1 or <401> of FIG. 4) and the second state (e.g., FIG. 2 or <403> of FIG. 4) by a sliding motion of the second structure 140 relative to the first structure 110. The first structure 110 may be a relatively fixed structure with respect to the sliding of the second structure 140.

In an embodiment of the disclosure, the first structure 110 may include the first case 120, the back cover 191, and the bracket 130. For example, the second structure 140 may move in the first direction D1 and the second direction D2 relative to the first case 120, the back cover 191, and the bracket 130.

In an embodiment of the disclosure, the connecting portion 135, to which the first driving member 210 is connected, may be formed on the one side of the bracket 130. The first driving member 210 may be connected to the bracket 130. For example, the bracket 130 may include the first edge portion 133 facing the support bar 180 and the second edge portion 134 facing the third sidewall 124 of the first case 120. The connecting portion 135 may be formed on the first edge portion 133. For example, the connecting portion 135 may protrude from the first edge portion 133 toward the support bar 180. For example, the connecting portion 135 may extend from the first edge portion 133 in the first direction D1.

In an embodiment of the disclosure, when the first surface 131 of the bracket 130 is viewed from above, the first plate portion 121 and the second plate portion 151 may partially overlap each other. The size of the area or width by which the first plate portion 121 and the second plate portion 151 overlap each other may be changed in response to a sliding motion of the second structure 140. For example, the area by which the first plate portion 121 and the second plate portion 151 overlap each other may be relatively smaller in the second state than in the first state.

In an embodiment of the disclosure, the second structure 140 may be configured to move in the first direction D1 and the second direction D2 relative to the first structure 110. For example, the second plate portion 151 of the second structure 140 (e.g., the second plate portion 151 of the second case 150 of FIG. 3) may move between the bracket 130 and the first plate portion 121. The second plate portion 151 may form the rear side of the electronic device 100 together with the first plate portion 121 or the back cover 191 in the second state (e.g., <403> of FIG. 4). The support bar 180 may be coupled to the second structure 140 and may move together with the second structure 140 when the second structure 140 moves.

In an embodiment of the disclosure, at least part of the display 160 may be disposed inside the second structure 140. Depending on a sliding motion of the second structure 140, at least part of the display 160 may be located inside the second structure 140, or may move out of the second structure 140. For example, part of the display 160 facing the rear side of the electronic device 100 (e.g., the -z-axis direction) so as to be opposite the first plate portion 121 of the first case 120 in the first state may be exposed on the front side of the electronic device 100 while moving out of the second structure 140 when the second structure 140 moves in the first direction D1. Furthermore, when the second structure 140 moves in the second direction D2 in the second state, the part of the display 160 exposed on the front side of the electronic device 100 may be located to face the rear side of the electronic device 100 while moving into the second structure 140.

According to various embodiments (not illustrated) of the disclosure, transparent regions (not illustrated) may be formed in the first case 120, the back cover 191, and the second structure 140 such that the display 160 is visually exposed on the rear side of the electronic device 100. For example, the first plate portion 121, the back cover 191, and the second plate portion 151 may have transparent regions formed in corresponding positions, and in the first state, part of the display 160 (e.g., part of the second region 162) may be visually exposed on the rear side of the electronic device 100 through the transparent regions of the first plate portion 121, the second plate portion 151, and the back cover 191. According to this, when the electronic device 100 is in the first state, the screen display area of the display 160 may be formed on at least a portion of the front side of the electronic device 100 and at least a portion of the rear side thereof.

In an embodiment of the disclosure, the display 160 may include the first region 161 that forms the front side of the electronic device 100 in the first state and the second region 162 that extends from the first region 161 and forms the front side of the electronic device 100 together with the first region 161 in the second. For example, in the first state, the second region 162 may be located inside the first structure 140, and in the second state, at least part of the second region 162 may move out of the second structure 140 to form the front side of the electronic device 100.

In an embodiment of the disclosure, the first region 161 and the second region 162 of the display 160 may be distinguished from each other, depending on whether the first region 161 and the second region 162 are exposed on the front side of the electronic device 100 in the first state. The position of the border between the first region 161 and the second region 162 is not limited to a specific position according to the illustrated embodiment. For example, when part (e.g., the sixth sidewall 154 of FIG. 3) of the second structure 140 surrounding the display 160 is formed in a higher or lower position than that in the illustrated embodiment of the disclosure, the positions of the first region 161 and the second region 162 may be changed accordingly.

In an embodiment of the disclosure, the display 160 may be configured such that at least part of the first region 161 is fixed to the first structure 110 (e.g., the bracket 130) and as the second structure 140 moves relative to the first structure 110 in the opposite directions D1 and D2, part of the second region 162 is located inside the second structure 140 to face the first region 161, or part of the second region 162 move out of the second structure 140 to form substantially the same plane as the first region 161. Part of the first region 161 may be supported by the first surface 131 of the bracket 130, and another part of the first region 161 may be supported by the display support member 170. The second region 162 may be supported by the display support member 170.

In an embodiment of the disclosure, the portion of the display 160 supported by the first surface 131 of the bracket 130 may remain substantially flat irrespective of a movement of the second structure 140. Furthermore, the portion of the display 160 supported by the display support member 170 may be deformed to be curved or flat depending on a movement of the second structure 140. For example, the portion of the display 160 supported by the bracket 130 may be a rigid portion, and the portion of the display 160 supported by the display support member 170 may be a flexible portion. According to the illustrated embodiment of the disclosure, the first region 161 may include the rigid portion and part of the flexible portion, and the second region 162 may include the remaining part of the flexible portion. However, without being limited thereto, the entire display 160 may be formed of a flexible material according to various embodiments of the disclosure. Furthermore, according to various embodiments of the disclosure, the display 160 may be formed such that rigid portions are located on opposite sides of a flexible portion.

In an embodiment of the disclosure, the display support member 170 may support part of the first region 161 and the second region 162. For example, the display support member 170 may be attached to portions of the rear surface of the display 160 that correspond to the part of the first region 161 and the second region 162. The display support member 170 may move together with a partial region of the display 160.

In an embodiment of the disclosure, the display support member 170 may include a plurality of bars (or, protrusions) extending in a direction substantially perpendicular to the sliding directions D1 and D2 of the second structure 140. For example, the display support member 170 may be formed in a form (e.g., a multi joint module or a multi-bar) in which the plurality of bars extending substantially parallel to the support bar 180 are disposed at predetermined intervals. For example, the display support member 170 may include a flexible track or a hinge rail. The display support member 170 may be bent at portions having a relatively small thickness between the plurality of bars.

According to the illustrated embodiment of the disclosure, the display support member 170 may include a first portion 171 and a second portion 172 extending from the first portion 171. The first portion 171 may include the plurality of bars and may be a multi joint portion (or, a multi-bar portion) that can be partially bent. The second portion 172 may extend from the first portion 171 in the second direction D2 and may form the one end portion of the display support member 170. The second portion 172 may be formed in a substantially plate shape and may have a specified rigidity. The second portion 172 may be formed to surround corner portions of the second region 162 of the display 160. For example, the second portion 172 may provide a function of protecting or supporting the peripheral portion of the display 160. The second portion 172 may receive a driving force from the second driving member 220. According to various embodiments (not illustrated) of the disclosure, the second driving member 220 may be disposed on the second portion 172 of the display support member 170 (e.g., refer to FIGS. 15A and 15B).

In an embodiment of the disclosure, the display support member 170 may surround at least part of the support bar 180 and may partially make contact with the support bar 180. For example, the display support member 170 (or, the display 160) may be bent with respect to the support bar 180. Part of the display support member 170 may be disposed between the second structure 140 and the support bar 180 and may move along one surface of the support bar 180 in response to sliding of the second structure 140. For example, when the second structure 140 moves in the first direction D1 in the first state, part of the display support member 170 (or, the second region 162) may move out of the space between the second structure 140 and the support bar 180. In contrast, when the second structure 140 moves in the second direction D2 in the second state, the part of the display support member 170 (or, the second region 162) may move into the space between the second structure 140 and the support bar 180.

In an embodiment of the disclosure, the support bar 180 may guide a turning motion of the display support member 170 and the display 160. The support bar 180, together with the second structure 140, may move in the first direction D1 and the second direction D2 relative to the first structure 110. The support bar 180 may be surrounded by the display support member 170 (or, the display 160). For example, one surface of the support bar 180 that makes contact with the display support member 170 may be formed to be substantially curved such that at least part of the display support member 170 turns along the one surface of the support bar 180.

In an embodiment of the disclosure, the first driving member 210 may be disposed between the bracket 130 and the support bar 180. For example, the one end of the first driving member 210 may be connected to the connecting portion 135 of the bracket 130, and the opposite end of the first driving member 210 may be connected to the support bar 180. The first driving member 210 may provide a driving force to move the support bar 180 in the first direction D1 from the bracket 130, by using a force by which the opposite ends of the first driving member 210 move away from each other. For example, the first driving member 210 may transmit a first driving force $F\_1$ to the support bar 180 in the first direction D1 with respect to the bracket 130. Accordingly, the second structure 140, together with the support bar 180, may move relative to the first structure 110 in the first direction D1.

In an embodiment of the disclosure, the first driving member 210 may be implemented by using an elastic member. In the first state, the first driving member 210 may be in a state in which the opposite end portions are located close to each other and therefore the elastic member is compressed. As the elastic member is uncompressed and therefore the opposite end portions of the first driving member 210 move away from each other, the first driving member 210 may apply an elastic force (e.g., the first driving force $F\_1$) to the support bar 180 (e.g., the second structure 140) in the first direction D1 with respect to the bracket 130 (e.g., the first structure 110). The structure and operation of the first driving member 210 will be described below with reference to FIGS. 5A, 5B, and 6.

In an embodiment of the disclosure, the second driving member 220 may be disposed in the first structure 110 and may be configured to be brought into contact with, or spaced apart from, the one end portion of the display support member 170 depending on the states of the electronic device 100. For example, the second driving member 220 may be fixed to the first plate portion 121 of the first case 120, and the second driving member 220 may be configured to generate a force to push the second portion 172 of the display support member 170 in the first direction D1.

In an embodiment of the disclosure, the second driving member 220 may be brought into contact with the second portion 172 of the display support member 170 in the first state. When the electronic device 100 is changed from the first state to the second state, the second driving member 220 may apply a second driving force $F\_2$ to the one end portion (or, the second portion 172) of the display support member 170 in the first direction D1 with respect to the first case 120. As the second driving force $F\_2$ is directly applied to the second portion 172 of the display support member 170, the second driving force $F\_2$ may act as a rotational force by which the display support member 170 (or, the display 160) turns along the support bar 180. According to the illustrated embodiment of the disclosure, the second driving member 220 may be implemented by using an elastic member, but is not limited thereto. The structure and operation of the second driving member 220 will be described below with reference to FIGS. 7A, 7B, 8A, 8B, 9A, and 9B.

Figure 5A:
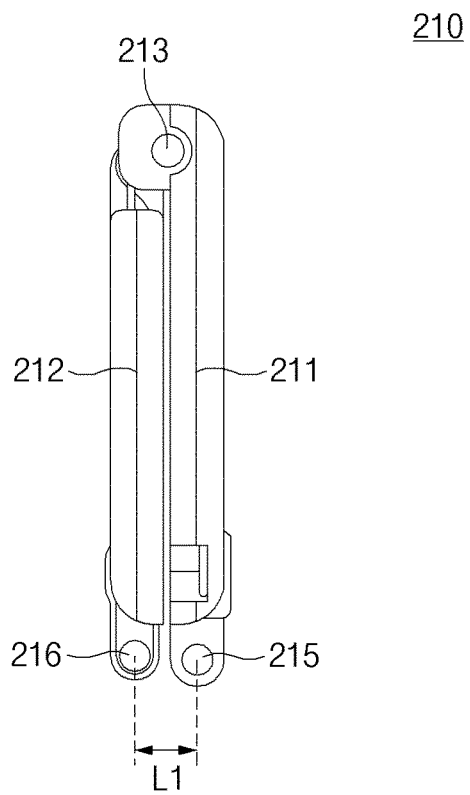
FIG. 5A illustrates a first driving member of an electronic device according to an embodiment of the disclosure.
Figure 5B:
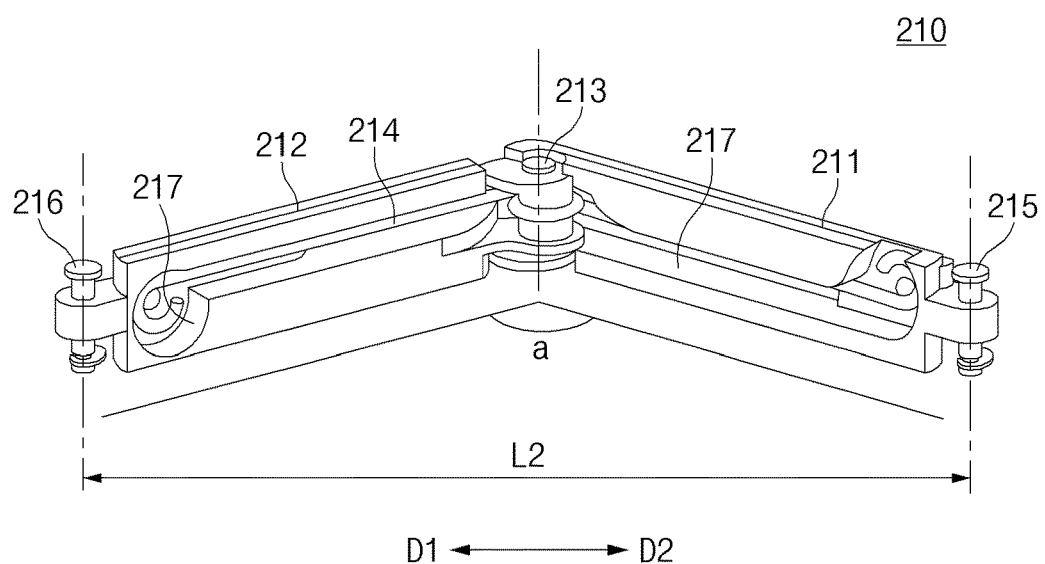
FIG. 5B illustrates a first driving member of an electronic device according to an embodiment of the disclosure.
Figure 6:
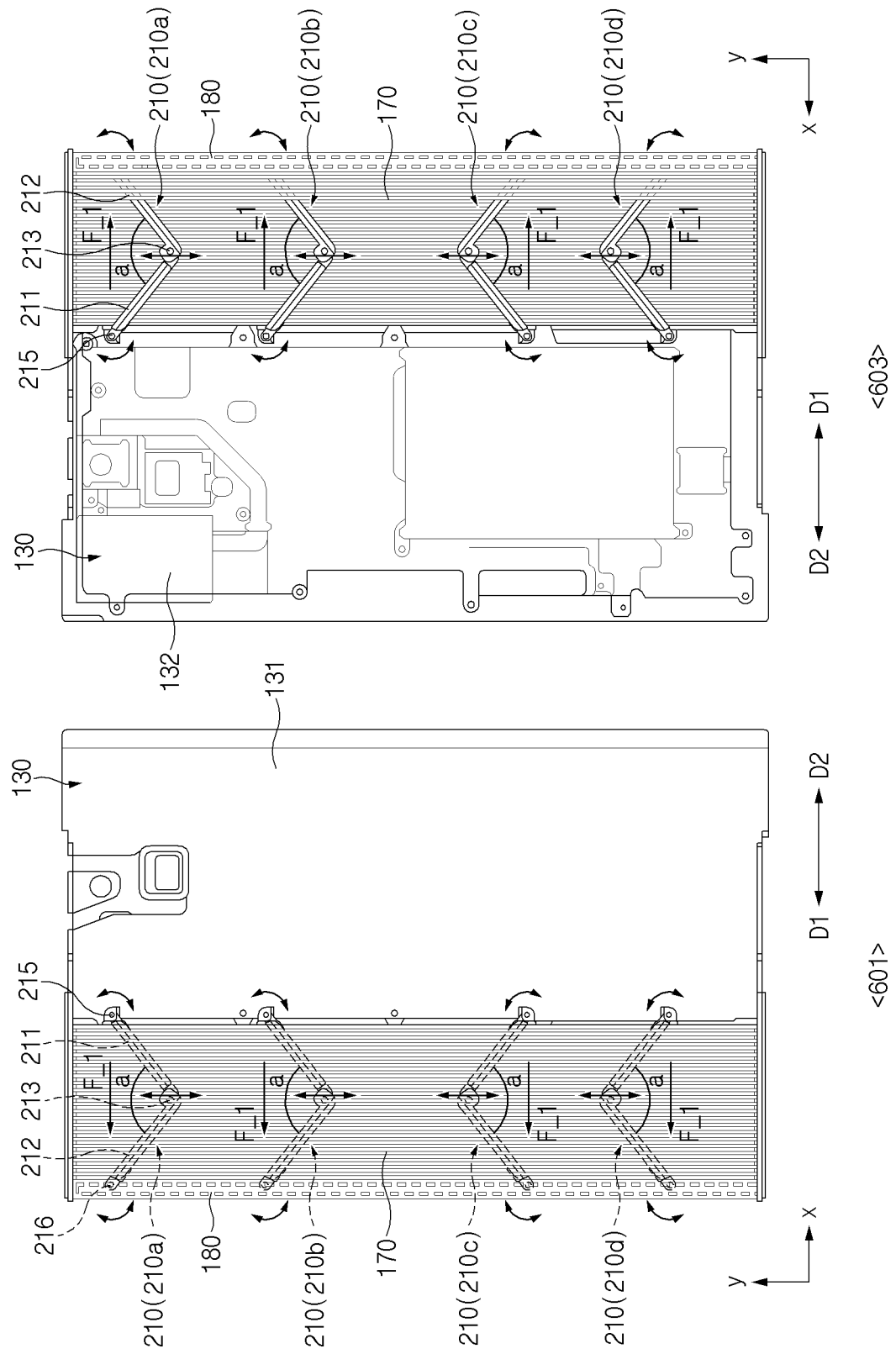
FIG. 6 illustrates an operation of a first driving member of an electronic device according to an embodiment of the disclosure.

FIGS. 5A and 5B illustrate a first driving member of an electronic device according to various embodiments of the disclosure. FIG. 6 illustrates an operation of a first driving member of an electronic device according to an embodiment of the disclosure.

Referring to FIG. 5A, it may be a view illustrating a state of the first driving member 210 when the electronic device 100 is in the first state (e.g., <401> of FIG. 4), and referring to FIG. 5B, it may be a view illustrating a state of the first driving member 210 when the electronic device 100 is in the second state (e.g., <403> of FIG. 4).

Referring to FIG. 6, <601> may be a view of the first surface 131 of the bracket 130 as viewed from above, and <603> of FIG. 6 may be a view of the second surface 132 of the bracket 130 as viewed from above.

Referring to FIGS. 5A, 5B, and 6, the first driving member 210 of the electronic device 100 according to an embodiment may include a first arm 211, a second arm 212, a rotary shaft 213, and a first elastic member 214. The first driving member 210 may be configured such that the first arm 211 and the second arm 212 are rotatable about the rotary shaft 213 relative to each other.

In an embodiment of the disclosure, the first arm 211 and the second arm 212 may be connected through the rotary shaft 213 so as to be rotatable. For example, one end of the first arm 211 and one end of the second arm 212 may be connected through the rotary shaft 213. The first arm 211 and the second arm 212 may rotate about the rotary shaft 213 within a specified range. The rotary shaft 213 may be substantially perpendicular to the sliding directions D1 and D2 of the second structure 140.

In an embodiment of the disclosure, the first arm 211 may include a first connecting shaft 215 formed at an opposite end of the first arm 211. The second arm 212 may include a second connecting shaft 216 formed at an opposite end of the second arm 212. The first connecting shaft 215 of the first arm 211 and the second connecting shaft 216 of the second arm 212 may move toward or away from each other depending on rotation of the first arm 211 and the second arm 212.

As described above, the first driving member 210 may connect the bracket 130 and the support bar 180. The first connecting shaft 215 may be connected to part of a first edge portion (e.g., the first edge portion 133 of FIGS. 3 and 4) of the bracket 130 or a connecting portion (e.g., the connecting portion 135 of FIG. 4) of the bracket 130, and the second connecting shaft 216 may be connected to the support bar 180 (e.g., FIG. 6). For example, the first connecting shaft 215 may be rotatably coupled to the bracket 130, and the second connecting shaft 216 may be rotatably coupled to the support bar 180. When the first connecting shaft 215 and the second connecting shaft 216 move toward each other, the bracket 130 and the support bar 180 may move toward each other, and when the first connecting shaft 215 and the second connecting shaft 216 move away from each other, the bracket 130 and the support bar 180 may move away from each other.

In an embodiment of the disclosure, the distance between the first connecting shaft 215 and the second connecting shaft 216 may be a first length L1 in the first state and a second length L2 longer than the first length L1 in the second state. The operating distance by which the support bar 180 moves relative to the bracket 130 (e.g., the operating distance by which the second structure 140 moves relative to the first structure 110 in the first direction D1 or the second direction D1 in FIG. 4) may be substantially the same as the difference between the second length L2 and the first length L1.

According to the embodiment illustrated in FIGS. 5A and 5B, the first connecting shaft 215 and the second connecting shaft 216 are illustrated as being integrally formed with the first arm 211 and the second arm 212, respectively. However, the disclosure is not limited thereto. For example, in various embodiments of the disclosure, the first connecting shaft 215 may be rotatably coupled to the first arm 211 and the bracket 230, and the second connecting shaft 216 may be rotatably coupled to the second arm 212 and the support bar 180.

In an embodiment of the disclosure, the first elastic member 214 may be configured to provide an elastic force to the first arm 211 and the second arm 212. For example, the first elastic member 214 may provide an elastic force to the first arm 211 and the second arm 212 such that the first connecting shaft 215 and the second connecting shaft 216 move away from each other.

In an embodiment of the disclosure, the first elastic members 214 may include a torsion spring. For example, the first elastic member 214 may include a portion at least partially wound around the portion to which the rotary shaft 213 is coupled and portions extending from the wound portion along the first arm 211 and the second arm 212. The wound portion may have a form wound around the rotary shaft 213. As illustrated in FIGS. 5A and 5B, the first elastic member 214 may be at least partially accommodated in recesses 217 formed on opposite surfaces of the first arm 211 and the second arm 212 that face each other.

In an embodiment of the disclosure, one end portion of the first elastic member 214 may be fixed to the first arm 211, and an opposite end portion of the first elastic member 214 may be fixed to the second arm 212. Between the first arm 211 and the second arm 212, the first elastic member 214 may generate an elastic force in the directions in which the first connecting shaft 215 of the first arm 211 and the second connecting shaft 216 of the second arm 212 move away from each other. For example, the first driving force F_1 provided by the first driving member 210 may refer to the elastic force of the first elastic member 214.

According to the illustrated embodiment of the disclosure, the first driving member 210 including the torsion spring may be configured to apply a driving force by a rotary motion of the first arm 211 and the second arm 212. However, the disclosure is not limited thereto. According to various embodiments (not illustrated) of the disclosure, the first elastic member 214 may include a coil spring (not illustrated). For example, the first elastic member 214 may directly connect the first connecting shaft 215 and the second connecting shaft 216. The first elastic member 214 may have a form extending in a direction parallel to the sliding directions. For example, the one end portion of the first elastic member 214 may be coupled to the first connecting shaft 215 or the portion where the first connecting shaft 215 of the first arm 211 is located, and the opposite end portion of the first elastic member 214 may be coupled to the second connecting shaft 216 or the portion where the second connecting shaft 216 of the second arm 212 is located.

In an embodiment of the disclosure, the first elastic member 214 may be compressed when the first arm 211 and the second arm 212 are disposed in parallel to face each other (e.g., FIG. 5A) and may be uncompressed when the first arm 211 and the second arm 212 form a predetermined angle (e.g., a predetermined angle "a" of FIG. 6) (e.g., FIG. 5B).

In an embodiment of the disclosure, the first arm 211 and the second arm 212 may form the predetermined angle "a". The predetermined angle "a" may be the included angle defined between the first arm 211 and the second arm 212 when the bracket 130 is viewed from above.

In an embodiment of the disclosure, the first connecting shaft 215 and the second connecting shaft 216 may be spaced apart from each other by a predetermined distance (e.g., L1 or L2). For example, the predetermined distance may be the distance between the first connecting shaft 215 and the second connecting shaft 216 that is measured in a direction parallel to the sliding directions D1 and D2.

In an embodiment of the disclosure, the first driving member 210 may be configured such that the first arm 211 rotates about the first connecting shaft 215 in a first rotational direction, the second arm 212 rotates about the second connecting shaft 216 in a second rotational direction opposite to the first rotational direction, and the rotary shaft 213 moves in a direction perpendicular to the sliding directions D1 and D2. For example, the first arm 211 and the second arm 212 may rotate about the rotary shaft 213. The included angle "a" defined between the first arm 211 and the second arm 212 may increase or decrease.

In an embodiment of the disclosure, the first driving member 210 may be configured such that the first connecting shaft 215 and the second connecting shaft 216 move in a direction parallel to the sliding directions D1 and D2. For example, the first connecting shaft 215 and the second connecting shaft 216 may be aligned in the direction parallel to the sliding directions D1 and D2.

Referring to FIG. 6, when the electronic device 100 is changed from the first state (e.g., FIG. 5A) to the second state (e.g., FIG. 5B), the first arm 211 may rotate about the first connecting shaft 215 in the clockwise direction, the second arm 212 may rotate about the second connecting shaft 216 in the counterclockwise direction, and the included angle may increase. For example, the distance between the first connecting shaft 215 and the second connecting shaft 216 may increase. In contrast, when the electronic device 100 is changed from the second state (e.g., FIG. 5B) to the first state (e.g., FIG. 5A), the first arm 211 may rotate about the first connecting shaft 215 in the counterclockwise direction, the second arm 212 may rotate about the second connecting shaft 216 in the clockwise direction, and the included angle may decrease. For example, the distance between the first connecting shaft 215 and the second connecting shaft 216 may decrease.

Referring to FIG. 6, the electronic device 100 may include a plurality of first driving members 210. For example, the plurality of first driving members 210 may include driving member 1-1 210a, driving member 1-2 210b, driving member 1-3 210c, and driving member 1-4 210d. Some of the plurality of first driving members 210 may be disposed such that rotary shafts 213 thereof face different directions. For example, driving member 1-1 210a and driving member 1-2 210b may be disposed such that connecting shafts 215 and 216 face the +y-axis direction and a rotary shaft 213 faces the −y-axis direction. For example, driving member 1-3 210c and driving member 1-4 210d may be disposed such that connecting shafts 215 and 216 face the −y-axis direction and a rotary shaft 213 faces the +y-axis direction. However, the number and/or arrangement of first driving members 210 are not limited to the illustrated embodiment.

Referring to FIG. 6, when the electronic device 100 is changed from the first state (e.g., FIG. 5A) to the second state (e.g., FIG. 5B), the rotary shafts 213 included in some of the first driving members 210 (e.g., driving member 1-1 210a and driving member 1-2 210b) may move upward (e.g., in the +y-axis direction) based on FIG. 6, and the rotary shafts 213 included in the other first driving members 210 (e.g., driving member 1-3 210c and driving member 1-4 210d) may move downward (e.g., in the −y-axis direction) based on FIG. 6. In contrast, when the electronic device 100 is changed from the second state (e.g., FIG. 5B) to the first state (e.g., FIG. 5A), the rotary shafts 213 included in some of the first driving members 210 (e.g., driving member 1-1 210a and driving member 1-2 210b) may move downward (e.g., in the −y-axis direction) based on FIG. 6, and the rotary shafts 213 included in the other first driving members 210 (e.g., driving member 1-3 210c and driving member 1-4 210d) may move upward (e.g., in the +y-axis direction) based on FIG. 6.

In an embodiment of the disclosure, as the first arm 211 and the second arm 212 operate in the state of being connected to the bracket 130 and the support bar 180, respectively, the first driving member 210 may continually apply the first driving force F_1 to the support bar 180 while the support bar 180 and the bracket 130 move relative to each other. For example, the first driving member 210 may apply the first driving force F_1 from the moment when the second structure 140 starts to move relative to the first structure 110 in the first direction 110 to the moment when the second structure 140 completely moves a specified distance (e.g., the difference between the first length L1 and the second length L2) (e.g., in the entire interval of the operation in which the electronic device 100 is changed from the first state to the second state).

In an embodiment of the disclosure, the magnitude of the first driving force F_1 applied by the first driving member 210 may vary depending on the distance between the first connecting shaft 215 and the second connecting shaft 216 (or, the distance between the bracket 130 and the support bar 180). The magnitude of the first driving force F_1 may vary depending on the degree to which the first elastic member 214 is compressed. For example, in the process in which the distance between the first connecting shaft 215 and the second connecting shaft 216 is changed from the first length L1 to the second length L2, the magnitude of the first driving force F_1 may decrease as the compressed first elastic member 214 is uncompressed. According to various embodiments of the disclosure, the magnitude of the first driving force F_1 may linearly decrease with an increase in the distance between a first bracket (or, the first structure 110) and a support bar (or, the second structure 140) (e.g., refer to the graph of FIG. 13).

In an embodiment of the disclosure, the first driving member 210 may support the display support member 170 when the electronic device 100 is in the second state. As illustrated in FIG. 6, in the second state, part of the display support member 170 may form substantially the same plane as the first surface 131 of the bracket 130. For example, when the first surface 131 of the bracket 130 is viewed from above, the first driving member 210 may overlap the display support member 170. The first driving member 210 may be located on the rear surface of the display support member 170 and may prevent sagging of the display support member 170. Accordingly, the electronic device 100 may be configured such that in the second state, the display support member 170 (or, the display 160) is maintained in a flat state by the first driving member 210.

In an embodiment of the disclosure, one or more first driving members 210 may be disposed between the bracket 130 and the support bar 180. When a plurality of first driving members 210 are disposed, the driving force applied to the support bar 180 may be increased. In addition, an effect of preventing sagging of the display support member 170 may be improved. The number and/or positions of first driving members 210 are not limited to the illustrated embodiment and may be appropriately changed according to various embodiments of the disclosure.

Figure 7A:
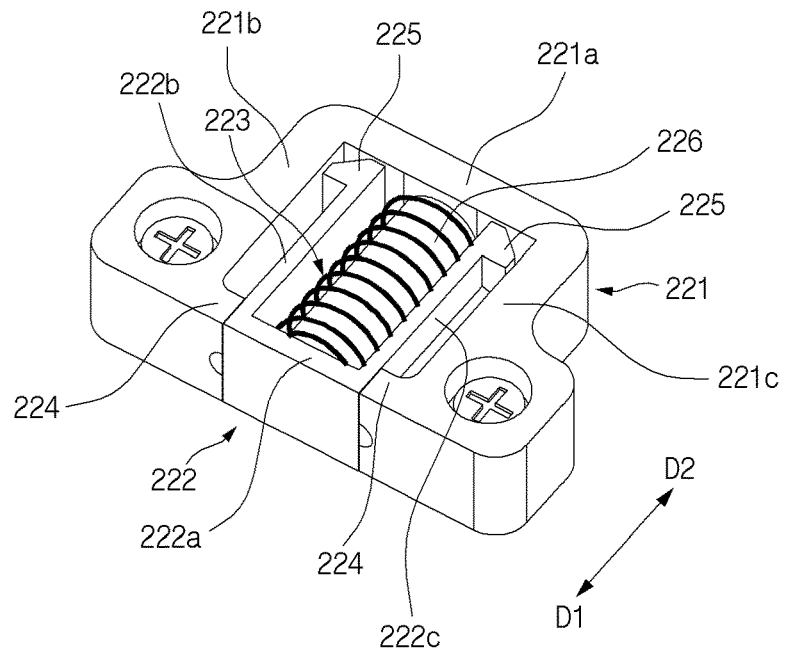
FIG. 7A illustrates a second driving member of an electronic device according to an embodiment of the disclosure.
Figure 7B:
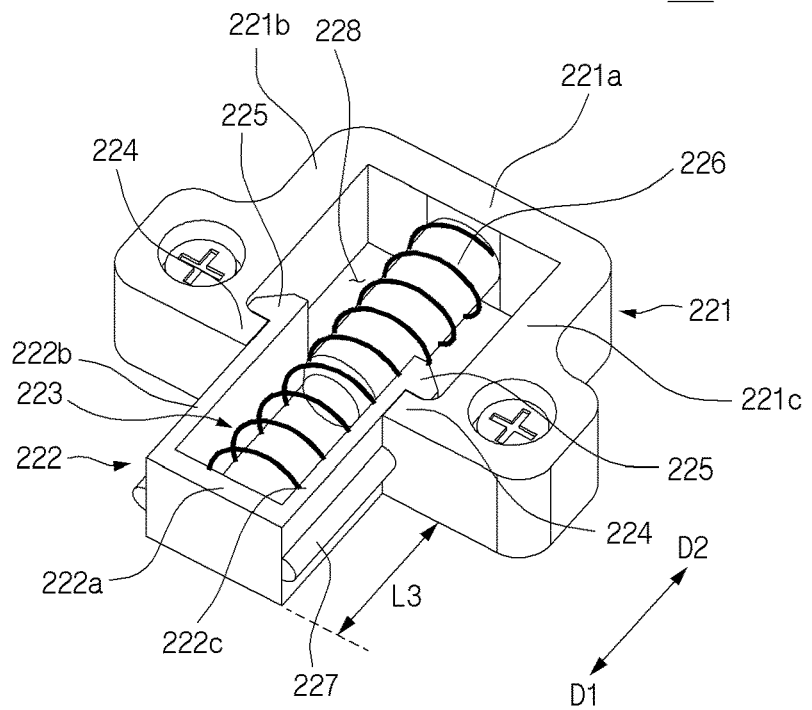
FIG. 7B illustrates a second driving member of an electronic device according to an embodiment of the disclosure.
Figure 8A:
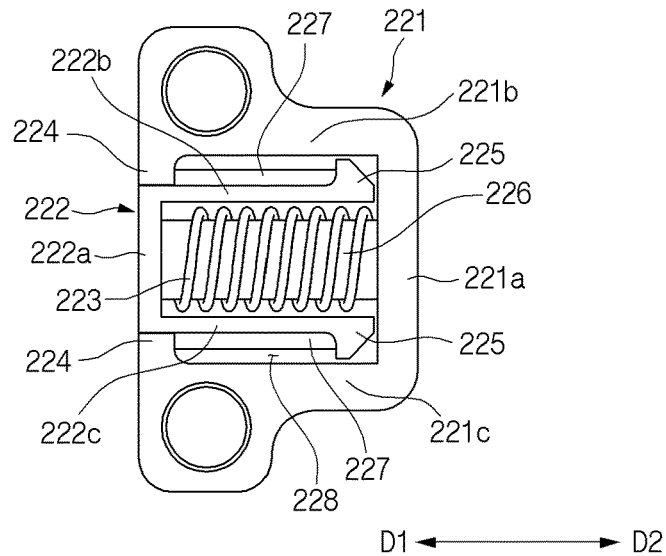
FIG. 8A illustrates a second driving member of an electronic device according to an embodiment of the disclosure.
Figure 8B:
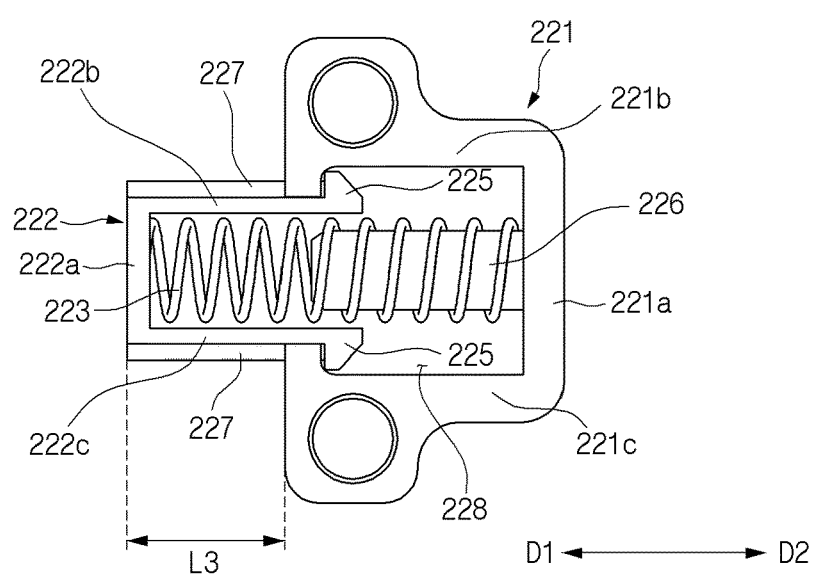
FIG. 8B illustrates a second driving member of an electronic device according to an embodiment of the disclosure.
Figure 9A:
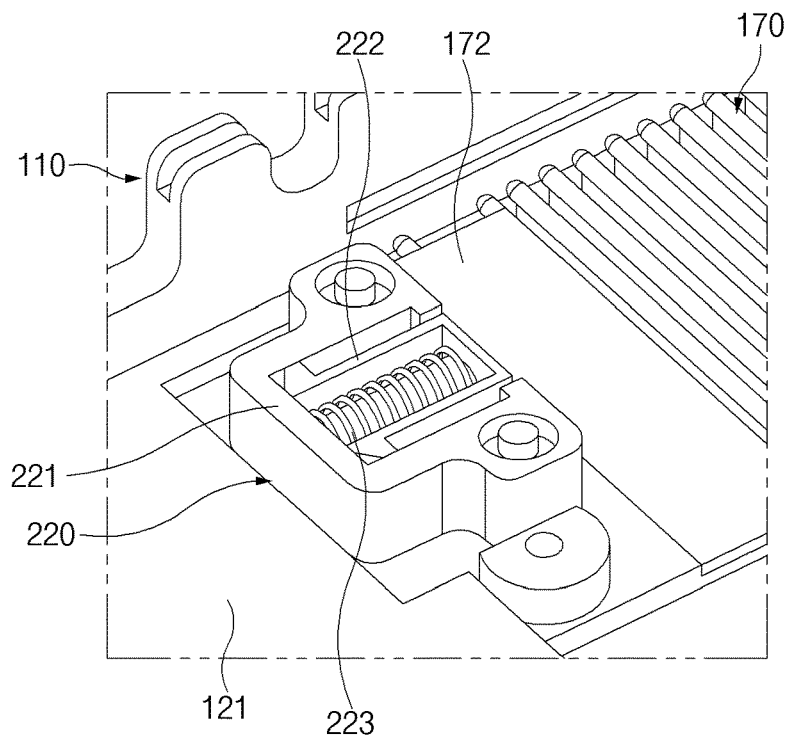
FIG. 9A illustrates an operation of a second driving member of an electronic device according to an embodiment of the disclosure.
Figure 9B:
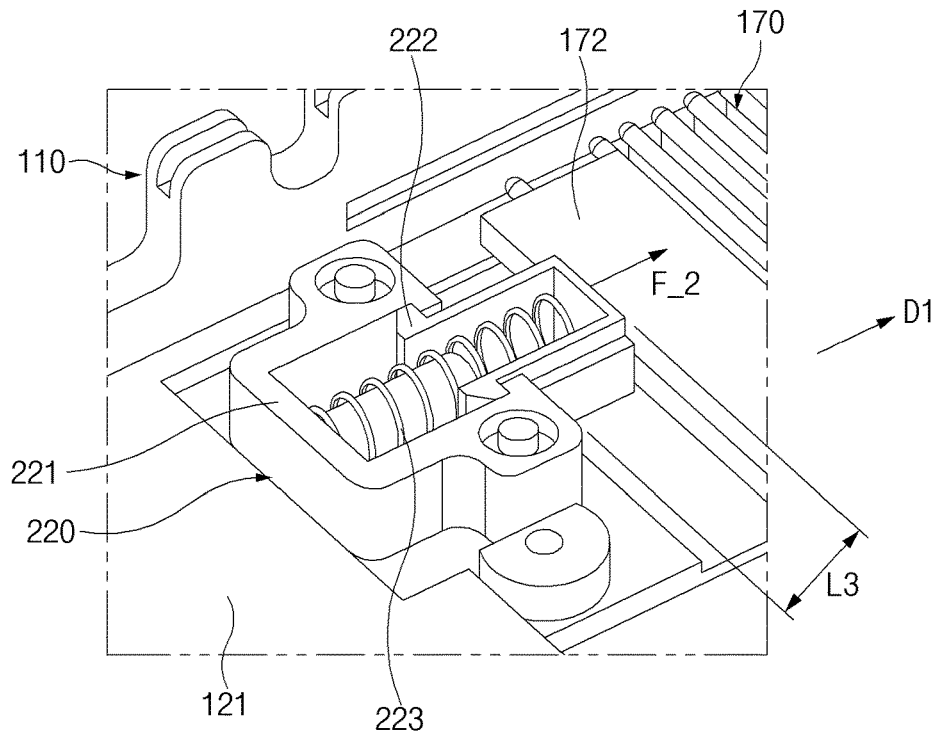
FIG. 9B illustrates an operation of a second driving member of an electronic device according to an embodiment of the disclosure.

FIGS. 7A and 7B illustrate a second driving member of an electronic device according to various embodiments of the disclosure. FIGS. 8A and 8B illustrate a second driving member of an electronic device according to various embodiments of the disclosure. FIGS. 9A and 9B illustrate an operation of a second driving member of an electronic device according to various embodiments of the disclosure.

For example, FIGS. 7A and 7B may be a perspective view of the second driving member 220. FIGS. 8A and 8B may be a plan view of the second driving member 220. FIGS. 9A and 9B may be a view illustrating an operation of applying, by the second driving member 220, the second driving force F_2 to the display support member 170.

Referring to FIGS. 7A, 7B, 8A, and 8B, the second driving member 220 of the electronic device 100 according to an embodiment may include a fixed member 221, a movable member 222, and a second elastic member 223. The second driving member 220 may be configured such that the movable member 222 linearly moves inside the fixed member 221 by a predetermined distance (e.g., a third length L3). For example, the fixed member 221 may be fixed to the second case 150, and the movable member 222 may move relative to the fixed member 221 and the second case 150.

In an embodiment of the disclosure, the movable member 222 may be coupled to the inside of the fixed member 221 so as to be movable relative to the fixed member 221. At least part of the movable member 222 may be accommodated in the fixed member 221. For example, the fixed member 221 may have an opening 228 into which the movable member 222 is inserted, and the movable member 222 may move relative to the fixed member 221 inside the opening 228. For example, the second driving member 220 may be configured such that the movable member 222 moves relative to the fixed member 221 in the sliding directions D1 and D2 by the third length L3.

In an embodiment of the disclosure, the fixed member 221 may include a first base portion 221a supporting the second elastic member 223, and a first extending portion 221b and a second extending portion 221c extending from the first base portion 221a in the sliding directions D1 and D2. For example, a rod 226 may be formed on the first base portion 221a. For example, the first extending portion 221b and the second extending portion 221c may face each other. First steps 224 may be formed on the first extending portion 221b and the second extending portion 221c. The rod 226 and/or the second elastic member 223 may be located between the first extending portion 221b and the second extending portion 221c. For example, the first extending portion 221b and the second extending portion 221c may extend perpendicular to the first base portion 221a.

In an embodiment of the disclosure, the fixed member 221 may have the first steps 224 for limiting the distance the movable member 222 moves. For example, the first steps 224 may protrude from the first extending portion 221b and the second extending portion 221c toward the second elastic member 223 and/or the rod 226. The first steps 224 may be engaged with second steps 225 of the movable member 222 and may prevent separation of the movable member 222 from the fixed member 221 in the first direction D1.

In an embodiment of the disclosure, the rod for supporting the second elastic member 223 may be formed on the fixed member 221. The rod 226 may be inserted into the second elastic member 223. The rod 226 may extend from the first base portion 221a in the sliding directions D1 and D2 so as to be located inside the opening 228. For example, the rod 226 may extend toward a second base portion 222a of the movable member 222.

In an embodiment of the disclosure, the movable member 222 may be disposed in the opening 228 of the fixed member 221 and may surround the second elastic member 223 and the rod 226. For example, the movable member 222 may include the second base portion 222a connected to the second elastic member 223, and a third extending portion 222b and a fourth extending portion 222c extending from the second base portion 222a in the sliding directions D1 and D2. For example, the third extending portion 222b and the fourth extending portion 222c may face each other. The second steps 225 may be formed on the third extending portion 222b and the fourth extending portion 222c. The rod 226 and/or the second elastic member 223 may be located between the third extending portion 222b and the fourth extending portion 222c. For example, the second base portion 222a may face the first base portion 221a of the fixed member 221, the third extending portion 222b may face the first extending portion 221b, and the fourth extending portion 222c may face the second extending portion 221c.

In an embodiment of the disclosure, the second steps 225 engaged with the first steps 224 may be formed on the movable member 222 to limit the distance the movable member 222 moves. For example, the second steps 225 may protrude from the third extending portion 222b and the fourth extending portion 222c toward the first extending portion 221b and the second extending portion 221c. The second steps 225 may at least partially make contact with the first steps 224 to prevent the movable member 222 moving in the first direction D1 from being separated from the fixed member 221.

In an embodiment of the disclosure, protrusions 227 for guiding a linear movement of the movable member 222 relative to the fixed member 221 may be formed on the movable member 222. The fixed member 221 may have recesses (not illustrated) that correspond to the protrusions 227 and into which the protrusions 227 are inserted. For example, the protrusions 227 may protrude from outside surfaces of the third extending portion 222b and the fourth extending portion 222c. The protrusions 227 may extend in a direction parallel to the sliding directions D1 and D2. The recesses may extend from the first steps 224 of the first extending portion 221b and the second extending portion 221c in the sliding directions D1 and D2 such that the protrusions 227 are inserted into the recesses. As the protrusions 227 are inserted into the recesses, the movable member 222 may be prevented from being moved or separated in a direction perpendicular to the first direction D1 or the second direction D2.

In an embodiment of the disclosure, the second elastic member 223 may be supported on the fixed member 221 and may be configured to provide an elastic force to the movable member 222. For example, the second elastic member 223 may be located between the second base portion 222a of the movable member 222 and the first base portion 221a of the fixed member 221. The second elastic member 223 may be compressed or uncompressed between the second base portion 222a and the first base portion 221a.

In an embodiment of the disclosure, one end portion of the second elastic member 223 may be supported on the first base portion 221a of the fixed member 221, and an opposite end portion of the second elastic member 223 may be supported on the second base portion 222a of the movable member 222. For example, the second elastic member 223 may provide an elastic force acting in the first direction D1 to the movable member 222 in the state in which the one end portion is supported on the fixed member 221. The second driving force F_2 provided by the second driving member 220 may refer to the elastic force of the first elastic member 214. For example, the second elastic member 223 may include a coil spring.

According to the illustrated embodiment of the disclosure, the second driving member 220 may be implemented by using the second elastic member 223 having the form of a coil spring and may be configured to apply a driving force to the display support member 170 by a linear motion between the fixed member 221 and the movable member 222. However, this is illustrative, and the structure of the second driving member 220 and/or the shape of the second elastic member 223 are not limited to the illustrated embodiment. According to various embodiments (not illustrated) of the disclosure, the second driving member 220 may include a torsion spring (not illustrated). For example, the second driving member 220 may be configured such that the movable member 222 is rotated relative to the fixed member 221 by the torsion spring to apply a driving force.

Referring to FIGS. 9A and 9B, the second driving member 220 may move the second portion 172 of the display support member 170 in the first direction D1 by using the elastic force of the second elastic member 223. For example, the movable member 222 may push the second portion 172 of the display support member 170 in the first direction D1 while being moved relative to the fixed member 221 in the first direction D1 by a predetermined distance (e.g., the third length L3) by the elastic force of the second elastic member 223.

In an embodiment of the disclosure, the second driving member 220 may be coupled to the first structure 110. For example, the fixed member 221 may be fixed to the first plate portion 121 of the first structure 110 (e.g., the first case 120 of FIG. 3), and the movable member 222 may be movable relative to the first structure 110 and the fixed member 221.

Referring to FIG. 9A, when the electronic device 100 is in the first state, the second driving member 220 may maintain the state (e.g., FIGS. 7A and 8A) in which the second elastic member 223 is compressed. Referring to FIG. 9B, in the process in which the electronic device 100 is changed from the first state to the second state, the second driving member 220 may move the movable member 222 relative to the fixed member 221 in the first direction D1 by the third length L3 as the compressed second elastic member 223 is uncompressed (e.g., FIGS. 7B and 8B). In the process in which the movable member 222 moves in the first direction D1 by the third length L3, the second driving force F_2 facing the first direction D1 may be applied to the second portion 172 of the display support member 170.

In an embodiment of the disclosure, the magnitude of the second driving force F_2 applied by the second driving member 220 may vary depending on the distance between the fixed member 221 and the movable member 222 (or, the degree of deformation of the second elastic member 223). The magnitude of the second driving force F_2 may vary depending on the degree to which the second elastic member 223 is compressed. For example, in the process in which the movable member 222 moves from the fixed member 221 by the third length L3, the magnitude of the second driving force F_2 may decrease as the compressed second elastic member 223 is uncompressed. According to various embodiments of the disclosure, the magnitude of the second driving force f_2 may linearly decrease with an increase in the distance the movable member 222 moves (e.g., refer to the graph of FIG. 13).

In an embodiment of the disclosure, the driving force of the second driving member 220 may be applied only while the contact between the display support member 170 and the movable member 222 is maintained. For example, in the process in which the electronic device 100 is changed from the first state to the second state, the second portion 172 of the display support member 170 may be spaced apart from the movable member 222 when the second portion 172 of the display support member 170 moves more than the third length L3 in the first direction D1. The second driving force F_2 of the second driving member 220 may not act on the display support member 170 when the movable member 222 and the second portion 172 of the display support member 170 are spaced apart from each other.

According to the illustrated embodiment of the disclosure, the second driving member 220 may be fixed to the first structure 110 and may be configured to push the second portion 172 of the display support member 170. However, the position and/or structure of the second driving member 220 are not limited to the illustrated embodiment. According to various embodiments (e.g., refer to FIG. 15B) of the disclosure, the second driving member (e.g., a second driving member 220 of FIG. 15B) may be disposed on the second portion 172 of the display support member 170 and may be configured to make contact with one side of the first structure 110. In this case, the second elastic member 223 of the second driving member 220 may move the second portion 172 of the display support member 170 in the first direction D1 by applying an elastic force to the one side of the first structure 110 in the second direction D2.

According to the illustrated embodiment of the disclosure, the second driving member 220 may be configured to provide a driving force using the elastic force of the second elastic member 223. However, this is illustrative, and the disclosure is not limited thereto. According to various embodiments (not illustrated) of the disclosure, a second driving member (not illustrated) may be configured to provide a driving force using a magnetic force.

For example, a first magnet (not illustrated) may be disposed on the first structure 110, and a second magnet (not illustrated) that faces the first magnet may be disposed on the second portion 172 of the display support member 170. The first magnet and the second magnet may be disposed such that identical magnetic poles face each other, and thus a repulsive force may be generated between the first magnet and the second magnet. In this case, the second portion 172 of the display support member 170 may be moved in the first direction D1 by the force by which the first magnet pushes the second magnet in the first direction D1. Furthermore, when the second driving member 200 includes a plurality of magnets, the repulsive force generated between the first magnet and the second magnet may decrease with an increase in the distance between the first magnet and the second magnet, and when the first magnet and the second magnet are spaced apart from each other by a predetermined distance or more, no repulsive force may act. Likewise to the second driving member 220 using the elastic force, the second driving member (not illustrated) using the magnetic force may be configured such that the driving force by the first magnet and the second magnet is generated only in a partial interval when the state of the electronic device 100 is changed.

Figure 10:
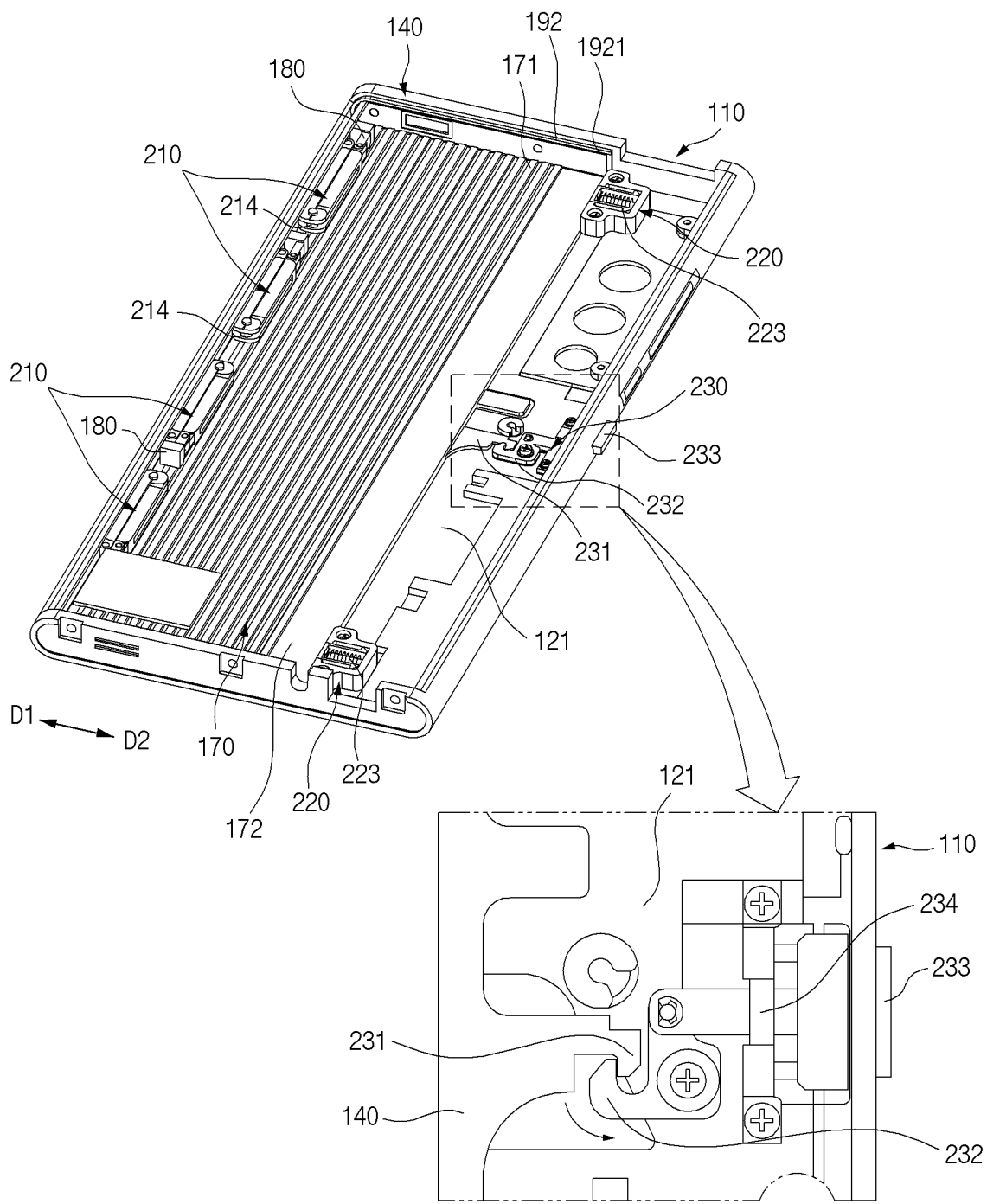
FIG. 10 illustrates a locking structure between a first structure and a second structure of an electronic device according to an embodiment of the disclosure.

FIG. 10 illustrates a locking structure between a first structure and a second structure of an electronic device according to an embodiment of the disclosure.

Referring to FIG. 10, the electronic device 100 according to an embodiment may include the first structure 110, the second structure 140, the display support member 170, the support bar 180, the first driving member 210, the second driving member 220, and a locking structure 230.

FIG. 10 illustrates some of the components of the electronic device 100 when the electronic device 100 is in the first state. FIG. 10 may be a view in which a bracket (e.g., the bracket 130 of FIGS. 3 and 4) of the first structure 110 and the display 160 are omitted, and the first structure 110 illustrated in FIG. 10 may be referred to as a first case (e.g., the first case 120 of FIGS. 3 and 4) and a back cover (e.g., the back cover 191 of FIGS. 3 and 4).

Some of the components of the electronic device 100 illustrated in FIG. 10 are identical or similar to some of the components of the electronic device 100 described above, and therefore repetitive descriptions will hereinafter be omitted.

In an embodiment of the disclosure, the display support member 170 may include the first portion 171 including a multi joint structure and the second portion 172 extending from the first portion 171 in the second direction D2. The first portion 171 may include the plurality of bars extending in the direction perpendicular to the sliding directions D1 and D2 of the second structure 140 (or, the direction parallel to the support bar 180). The opposite end portions of the first portion 171 and the opposite end portions of the second portion 172 in the lengthwise direction (e.g., the direction perpendicular to the sliding directions D1 and D2) may be inserted into the guide grooves 1921 of the guide member 192.

In an embodiment of the disclosure, the locking structure 230 may be a locking device that limits sliding of the first structure 110 and the second structure 40 such that the electronic device 100 is maintained in the first state.

In an embodiment of the disclosure, the locking structure 230 may include the first stopping protrusion 231 disposed on the second structure 140, the second stopping protrusion 232 that is disposed on the first structure 110 and to which the first stopping protrusion 231 is fastened, and an operating button 233 for operating the second stopping protrusion 232. For example, the first stopping protrusion 231 may be stopped by the second stopping protrusion 232 so that the electronic device 100 may be in a locked state in which the second structure 140 is not able to slide relative to the first structure 110.

In an embodiment of the disclosure, the first stopping protrusion 231 (e.g., the first stopping protrusion 231 of FIG. 3) may extend from part (e.g., the second plate portion 151 of the second case 150 of FIG. 3) of the second structure 140 (e.g., refer to FIG. 3). The second stopping protrusion 232 may be disposed on the first plate portion 121 of the first structure 110 such that the first stopping protrusion 231 is engaged with the second stopping protrusion 232. At least part of the operating button 233 may be exposed outside the first structure 110, and the operating button 233 may be connected with the second stopping protrusion 232 to operate the second stopping protrusion 232. For example, the operating button 233 may be disposed in at least one of a plurality of holes (not illustrated) that are formed in a side surface of the first structure 110 (e.g., the third side surface 124 of the first case 120 of FIG. 3) and may be pressed by a user in a direction toward the inside of the first structure 110 (e.g., the first direction D1).

In an embodiment of the disclosure, the second stopping protrusion 232 may be configured to rotate in one direction depending on an operation of pressing the operating button 233. For example, the second stopping protrusion 232 may be connected with the operating button 233 through an interlocking structure 234 so as to operate in conjunction with the operating button 233. The second stopping protrusion 232 may be configured to rotate in the counterclockwise direction by a specified angle when the operating button 233 is pressed and to return to the previous position before the rotation when the operating button 233 is released. Accordingly, when the operating button 233 is pressed in the state in which the first stopping protrusion 231 and the second stopping protrusion 232 are engaged with each other, the second stopping protrusion 232 may rotate in the counterclockwise direction so that the first stopping protrusion 231 may be separated from the second stopping protrusion 232. For example, the locking structure 230 may be configured such that the first structure 110 and the second structure 140 are unlocked by pressing the operating button 233. The shape and/or position of the locking structure 230 illustrated in FIG. 10 are illustrative, and a device for locking the first structure 110 and the second structure 140 is not limited to the illustrated embodiment.

When the operating button 233 is pressed in the first state, the second structure 140 may move in the first direction D1, and the electronic device 100 may be changed to the second state accordingly, and when the second structure 140 is moved in the second direction D2 in the second state, the first structure 110 and the second structure 140 may be locked, and the electronic device 100 may be changed to the first state accordingly.

In an embodiment of the disclosure, when the electronic device 100 is in the first state, the first structure 110 and the second structure 140 may be locked by the locking structure 230, and the first elastic member 214 of the first driving member 210 and the second elastic member 223 of the second driving member 220 remain compressed. For example, the first driving member 210 may apply a predetermined force toward the support bar 180 with respect to the first structure 110 as the first elastic member 214 is compressed. Furthermore, the second driving member 220 may apply a predetermined force toward the second portion 172 of the display support member 170 with respect to the first structure 110 as the second elastic member 223 is compressed.

In an embodiment of the disclosure, when the user presses the operating button 233 in the first state to unlock the first structure 110 and the second structure 140, the electronic device 100 may be changed to the second state by elastic forces generated by the first elastic member 214 of the first driving member 210 and the second elastic member 223 of the second driving member 220. For example, the first driving member 210 may provide a driving force for moving the second structure 140 in the first direction D1, by pushing the support bar 180 in the first direction D1 with respect to the first structure 110 (e.g., refer to FIG. 6). The second driving member 220 may provide a driving force for turning part of the display support member 170 in response to the movement of the second structure 140, by pushing the second portion 172 of the display support member 170 in the first direction D1 with respect to the first structure 110. As described above, the driving force generated by the second driving member 220 may act only while the display support member 170 moves a predetermined distance (e.g., the third length L3 of FIGS. 7A, 7B, 8A, 8B, 9A, and 9B).

In an embodiment of the disclosure, when the user presses the second structure 140 in the second direction D2 while the electronic device 100 is in the second state, the first stopping protrusion 231 may be stopped by the second stopping protrusion 232, and the first structure 110 and the second structure 140 may be locked accordingly. The electronic device 100 may be changed to the first state as the first structure 110 and the second structure 140 are locked. When the user presses the second structure 140 in the second direction D2, the driving forces of the first driving member 210 and the second driving member 220 may act as forces that hamper the movement of the second structure 140 in the second direction D2.

According to an embodiment of the disclosure, when the user wants to change the electronic device 100 from the second state to the first state, the user has to apply, to the second structure 140, a force for compressing the first elastic member 214 of the first driving member 210 and the second elastic member 223 of the second driving member 220. As described above, the driving force generated by the second driving member 220 may act only while the display support member 170 makes contact with the second driving member 220. Accordingly, at the initial stage of the operation in which the electronic device 100 is changed from the second state to the first state, only the elastic force of the first elastic member 214 may act as a force resisting the movement of the second structure 140, and right before the electronic device 100 is completely changed to the first state, the elastic force of the second elastic member 223 may act together as a force resisting the movement of the second structure 140 (e.g., refer to FIG. 14).

Figure 11:
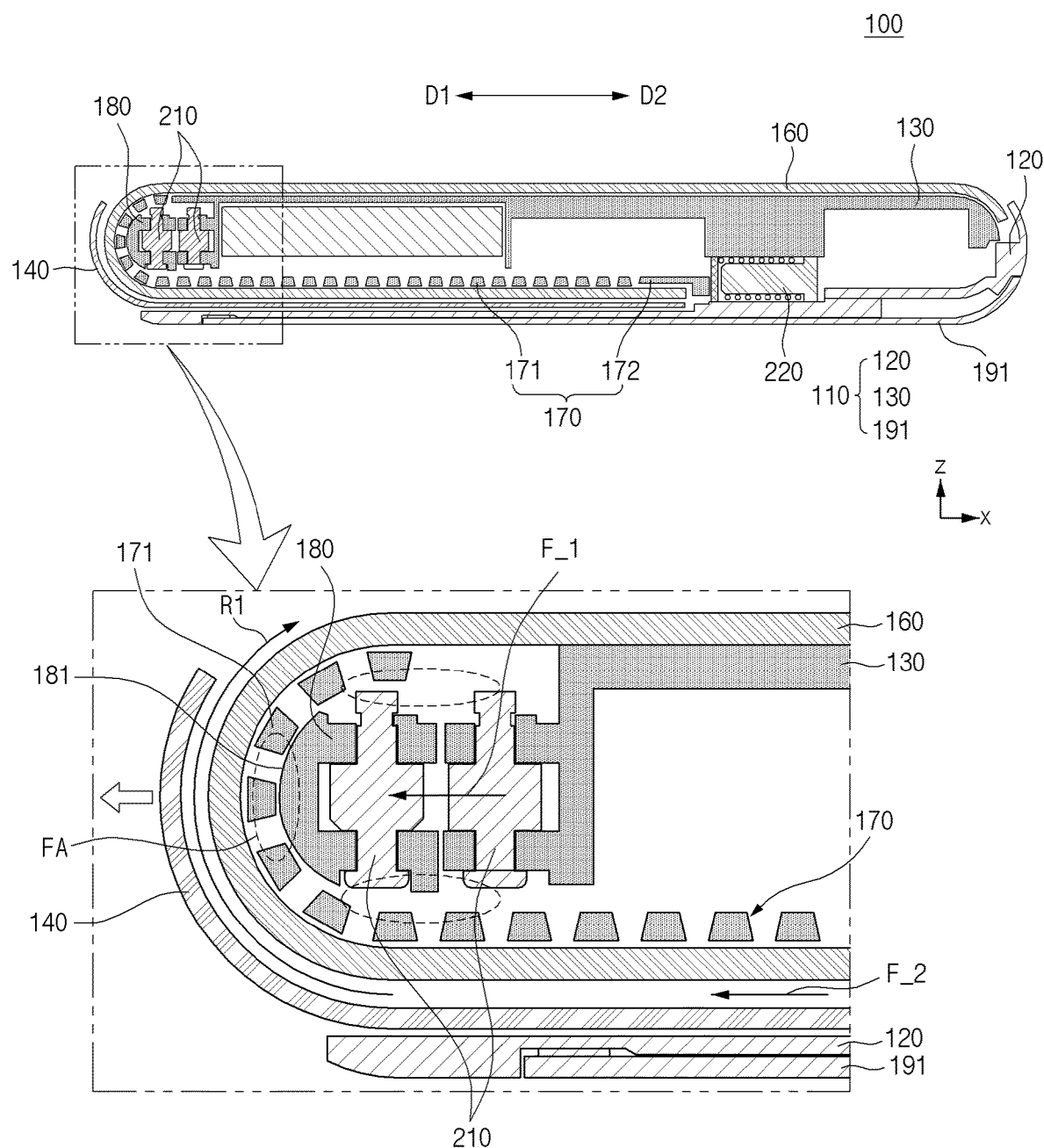
FIG. 11 illustrates an operation in which driving forces of a first driving member and a second driving member of an electronic device act according to an embodiment of the disclosure.

FIG. 11 illustrates an operation in which driving forces of a first driving member and a second driving member of an electronic device act according to an embodiment of the disclosure.

Referring to FIG. 11, the electronic device 100 according to an embodiment may include the first structure 110, the second structure 140, the display 160, the display support member 170, the support bar 180, the first driving member 210, and the second driving member 220.

Some of the components of the electronic device 100 illustrated in FIG. 11 are identical or similar to some of the components of the electronic device 100 described above, and therefore repetitive descriptions will hereinafter be omitted.

In an embodiment of the disclosure, when the electronic device 100 is changed from the first state to the second state, a linear motion may occur between the first structure 110 and the second structure 140, and at least part of the display 160 and at least part of the display support member 170 may perform a turning motion. For example, the second structure 140 and the support bar 180 may linearly move relative to the first structure 110 in the first direction D1 in the process in which the electronic device 100 is changed from the first state to the second state. At least part of the display 160 and at least part of the display support member 170 may perform a turning motion along the support bar 180 in response to the linear motion of the support bar 180.

In an embodiment of the disclosure, at least part of the display 160 and at least part of the display support member 170 may move along a curved surface 181 of the support bar 180 and may perform a turning motion along a predetermined path R1. For example, the display 160 and the display support member 170 may be configured such that as the support bar 180 moves in the first direction D1 in the state of being surrounded by the display 160 and the display support member 170, a bent portion is unbent while a portion performs a turning motion by the curved surface 181 of the support bar 180.

In an embodiment of the disclosure, the first driving force F_1 generated by the first driving member 210 may act on the support bar 180 in the first direction D1 with respect to the bracket 130. The first driving force F_1 may linearly move the support bar 180 and the second structure 140 in the first direction D1.

In an embodiment of the disclosure, the second driving force F_2 generated by the second driving member 220 may act on the second portion 172 of the display support member 170 in the first direction D1 with respect to the first case 120. By directly pushing the second portion 172 of the display support member 170, the second driving member 220 may provide the second driving force F_2 to enable the display 160 and the display support member 170 to perform a turning motion along the rotational path R1.

In the electronic device 100 according to an embodiment of the disclosure, the driving members 210 and 220 for expanding the electronic device 100 (e.g., changing the electronic device 100 from the first state to the second state) may include the first driving member 210 and the second driving member 220, and the positions and/or functions of the driving members 210 and 220 may differ from each other. Accordingly, the expansion operation of the electronic device 100 may be improved. For example, the first driving member 210 may function as a drive source for substantially moving the second structure 140 in the first direction D1, by transmitting the first driving force F_1 to the support bar 180. The second driving member 220 may function as a drive source for substantially turning part of the display 160 and part of the first portion 171 of the display support member 170, by transmitting the second driving force F_2 to the second portion 172 of the display support member 170.

According to an embodiment of the disclosure, when the support bar 180 is linearly moved in the first direction D1 by the first driving force F_1, a friction area FA where friction occurs may be formed between the display support member 170 (e.g., the first portion 171) and the support bar 180. For example, because the support bar 180 located inward of a bent portion of the display 160 moves while pushing the display 160 and the display support member 170 in the first direction D1 in the state in which part of the display 160 is fixed to the bracket 130, friction may occur in the partial area FA between the support bar 180 and the first portion 171 when the first portion 171 of the display support member 170 turns along the curved surface of the support bar 180. The second driving member 220 may transmit the second driving force F_2 to the second portion 172 of the display support member 170 in the direction coinciding with the rotational direction of the first portion 171, thereby preventing the force for extending the second structure 140 from being lost by the friction and enabling the extension operation to be more smoothly performed.

Figure 12:
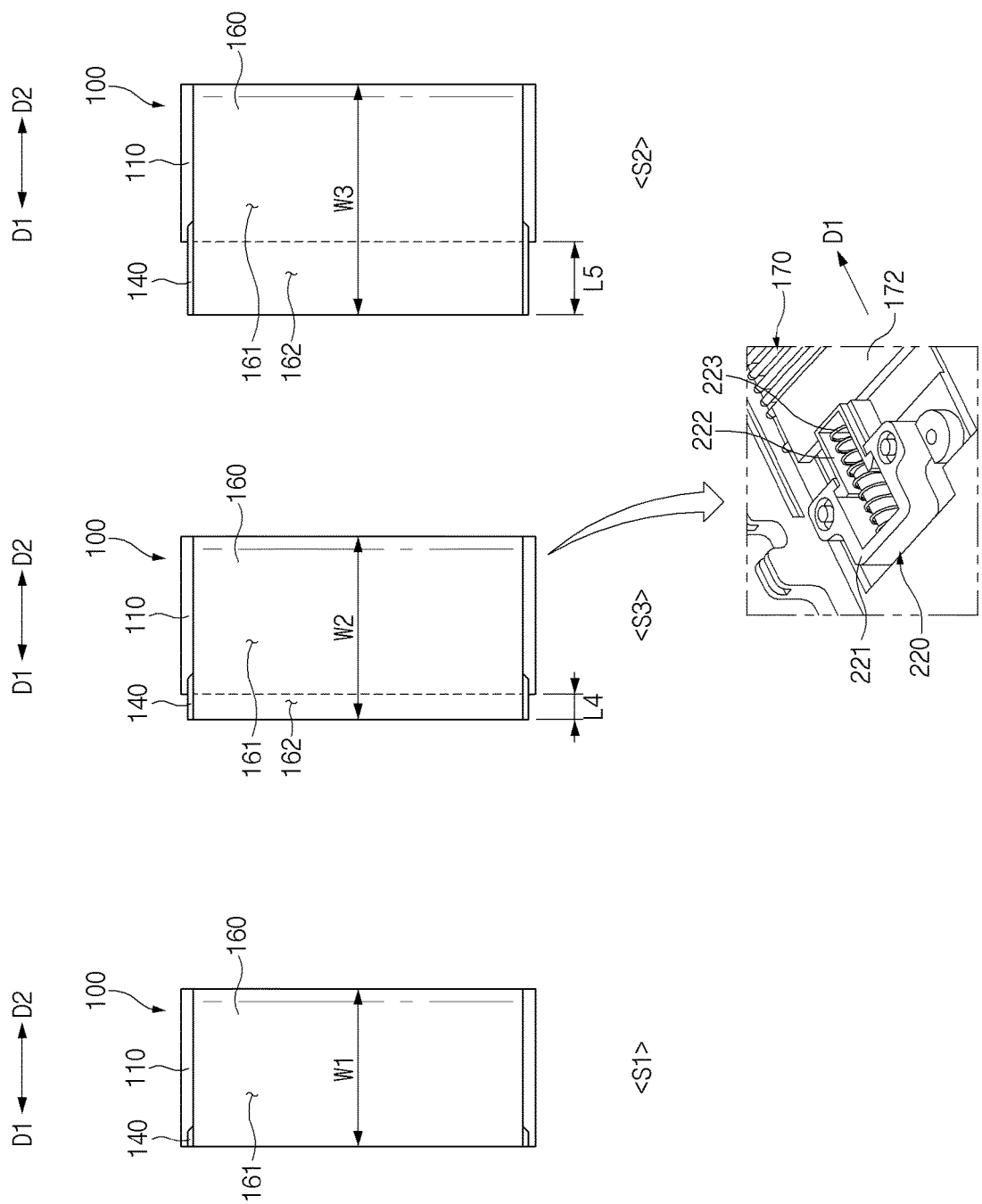
FIG. 12 illustrates an operation in which a state of an electronic device is changed according to an embodiment of the disclosure.

FIG. 12 illustrates an operation in which a state of an electronic device is changed according to an embodiment of the disclosure.

Referring to FIG. 12, the electronic device 100, according to an embodiment of the disclosure, may include the first structure 110, the second structure 140, the display 160, the display support member 170, the first driving member 210, and the second driving member 220.

Some of the components of the electronic device 100 illustrated in FIG. 12 are identical or similar to some of the components of the electronic device 100 described above, and therefore repetitive descriptions will hereinafter be omitted.

In an embodiment of the disclosure, the electronic device 100 may include a first state S1 (e.g., a default state, a reduced state, or a closed state), a second state S2 (e.g., an expanded state or an open state), and a third state S3 (e.g., an intermediate state or a deformed state) that is an arbitrary state between the first state S1 and the second state S2. The electronic device 100 may be changed between the first state S1 and the second state S2 by a user operation. For example, the electronic device 100 may be changed from the first state S1 to the second state S2 through the third state S3, or may be changed from the second state S2 to the first state S1 through the third state S3.

In an embodiment of the disclosure, the first state S1 may be a state in which the width (or, size) of an exposed region of the display 160 that is exposed on the front side of the electronic device 100 (or, forms the front side of the electronic device 100) has a first width W1 (or, a first size), and the second state S2 may be a state in which the width of the exposed region has a second width W2 (or, a second size) greater than the first width W1. The third state S3 may be a state in which the width of the exposed region has a third width W3 (or, a third size) greater than the first width W1 and smaller than the second width W2. For example, the width of the exposed region may be defined as the length of the display 160 exposed on the front side of the electronic device that is measured in the direction parallel to the sliding directions D1 and D2.

In an embodiment of the disclosure, the first state S1 may be a state in which the size of the display 160 exposed on the front side of the electronic device 100 is reduced to the minimum, and the second state S2 may be a state in which the size of the display 160 exposed on the front side of the electronic device 100 is expanded to the maximum. For example, the first width W1 may be defined as the width when the exposed region has a minimum size, and the second width W2 may be defined as the width when the exposed region has a maximum size. The width of the exposed region of the display 160 may increase from the first width W1 to the second width W2 when the electronic device 100 is changed from the first state S1 to the second state S2. In contrast, the width of the exposed region of the display 160 may decrease from the second width W2 to the first width W1 when the electronic device 100 is changed from the second state S2 to the first state S1.

In an embodiment of the disclosure, the electronic device 100 may be changed from the first state S1 to the second state S2 or from the second state S2 to the first state S1 through a plurality of intermediate states, and the third state S3 may be one of the plurality of intermediate states.

In an embodiment of the disclosure, the third state S3 may be a state in which the movable member 222 of the second driving member 220 moves relative to the fixed member 221 in the first direction D1 by a maximum travel distance (e.g., the third length L3 of FIGS. 7A, 7B, 8A, 8B, 9A, and 9B). For example, the third state S3 may refer to a state right before the second portion 172 of the display support member 170 is separated from the second driving member 220 or a state immediately after the second portion 172 of the display support member 170 makes contact with the second driving member 220. The second elastic member 223 of the second driving member 220 may be uncompressed by a predetermined length (e.g., the third length L3) while the electronic device 100 is changed from the first state S1 to the third state S3 and may no longer be uncompressed while the electronic device 100 is changed from the third state S3 to the second state S2. For example, the second elastic member 223 may be in equilibrium from the third state S3 to the second state S2.

In an embodiment of the disclosure, the third state S3 may be defined as a state in which whether the elastic force (or, the driving force) of the second driving member 220 acts is changed in the process in which the electronic device 100 is changed between the first state S1 and the second state S2. For example, between the first state S1 and the third state S3, the second driving member 220 may transmit an elastic force (e.g., the second driving force) to the display support member 170 while maintaining contact with the second portion 172 of the display support member 170, and between the third state S3 and the second state S2, the second driving member 220 may be separated from the second portion 172 of the display support member 170 and may not transmit an elastic force to the display support member 170. An operation in which the magnitude of a sliding driving force for sliding the second structure 140 varies depending on whether the elastic force of the second driving member 220 acts will be described below with reference to FIGS. 13 and 14.

In an embodiment of the disclosure, the third state S3 may refer to a state of the electronic device 100 at a specific moment when whether the driving force of the second driving member 220 acts is changed. For example, the first state S1 and the second state S2 may be states in which the electronic device 100 is completely changed, and the electronic device 100 may maintain the first state S1 and the second state S2 even though an external force is not applied. In contrast, the third state S3 may be an arbitrary state in the process in which the state of the electronic device 100 is changed, and when an external force is not applied, the electronic device 100 may be changed to the first state S1 or the second state S2 without maintaining the third state S3.

In an embodiment of the disclosure, the electronic device 100 may be changed to the first state S1, the third state S3, and the second state S2 by a movement of the second structure 140 relative to the first structure 110. As the second structure 140 moves in the first direction D1 in the first state S1, the electronic device 100 may be changed to the second state S2 through the third state S3 while the area of the display 160 exposed on the front side of the electronic device 100 is increased. For example, when the electronic device 100 is in the third state S3, the distance by which the second structure 140 moves relative to the first structure 110 in the first direction D1 may be a fourth length L4. For example, when the electronic device 100 is in the second state S2, the distance by which the second structure 140 moves relative to the first structure 110 in the first direction D1 may be a fifth length L5 greater than the fourth length L4.

As illustrated in FIG. 12, the display 160 may be configured such that in the first state S1, the first region 161 is exposed on the front side of the electronic device 100 and in the third state S3 and the second state S2, part of the second region 162 is exposed on the front side of the electronic device 100. The size of the second region 162 exposed on the front side of the electronic device 100 may increase from the third state S3 toward the second state S2.

Figure 13:
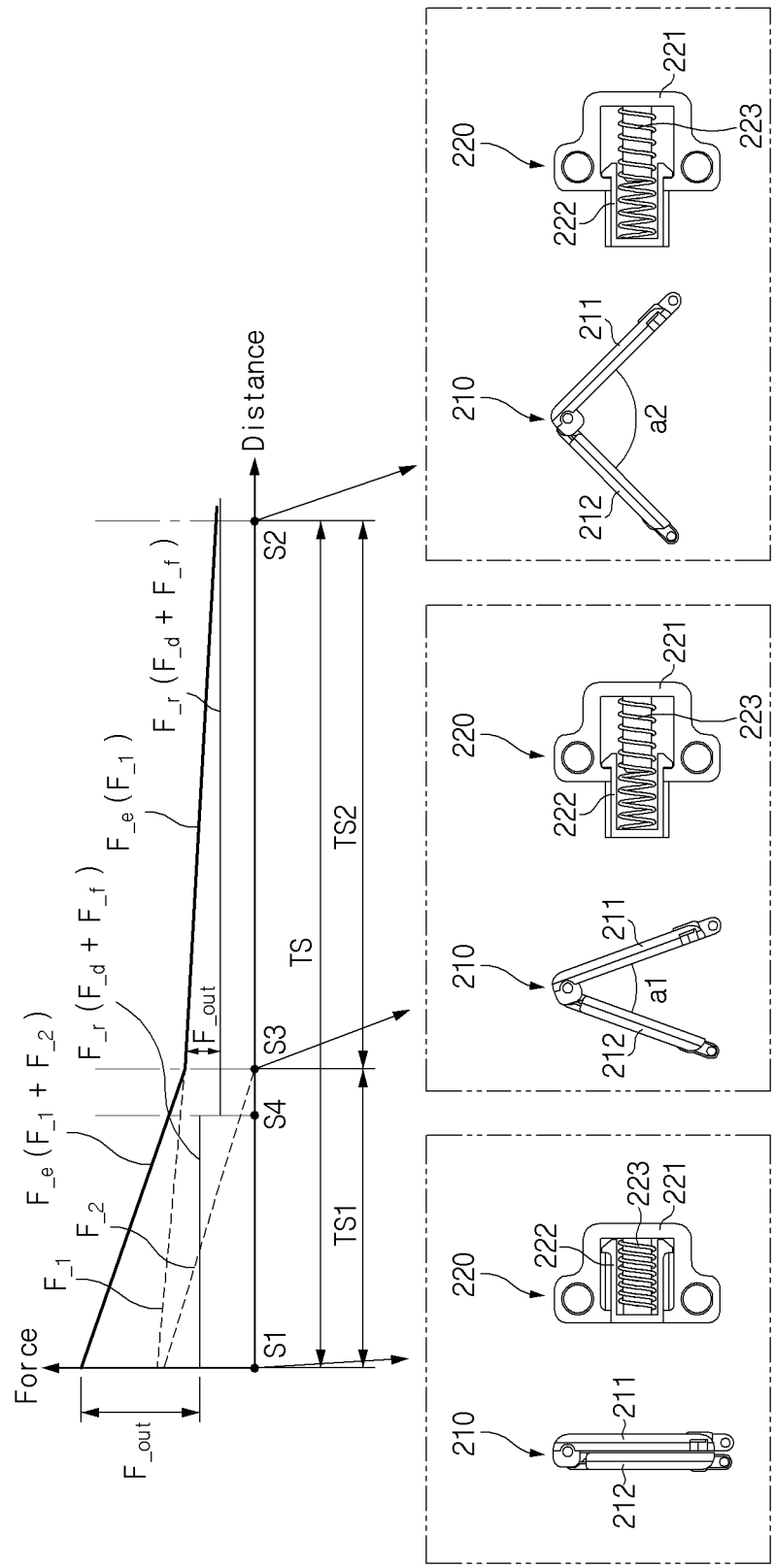
FIG. 13 illustrates a change of a sliding driving force in an operation in which an electronic device is changed from a first state to a second state according to an embodiment of the disclosure.
Figure 14:
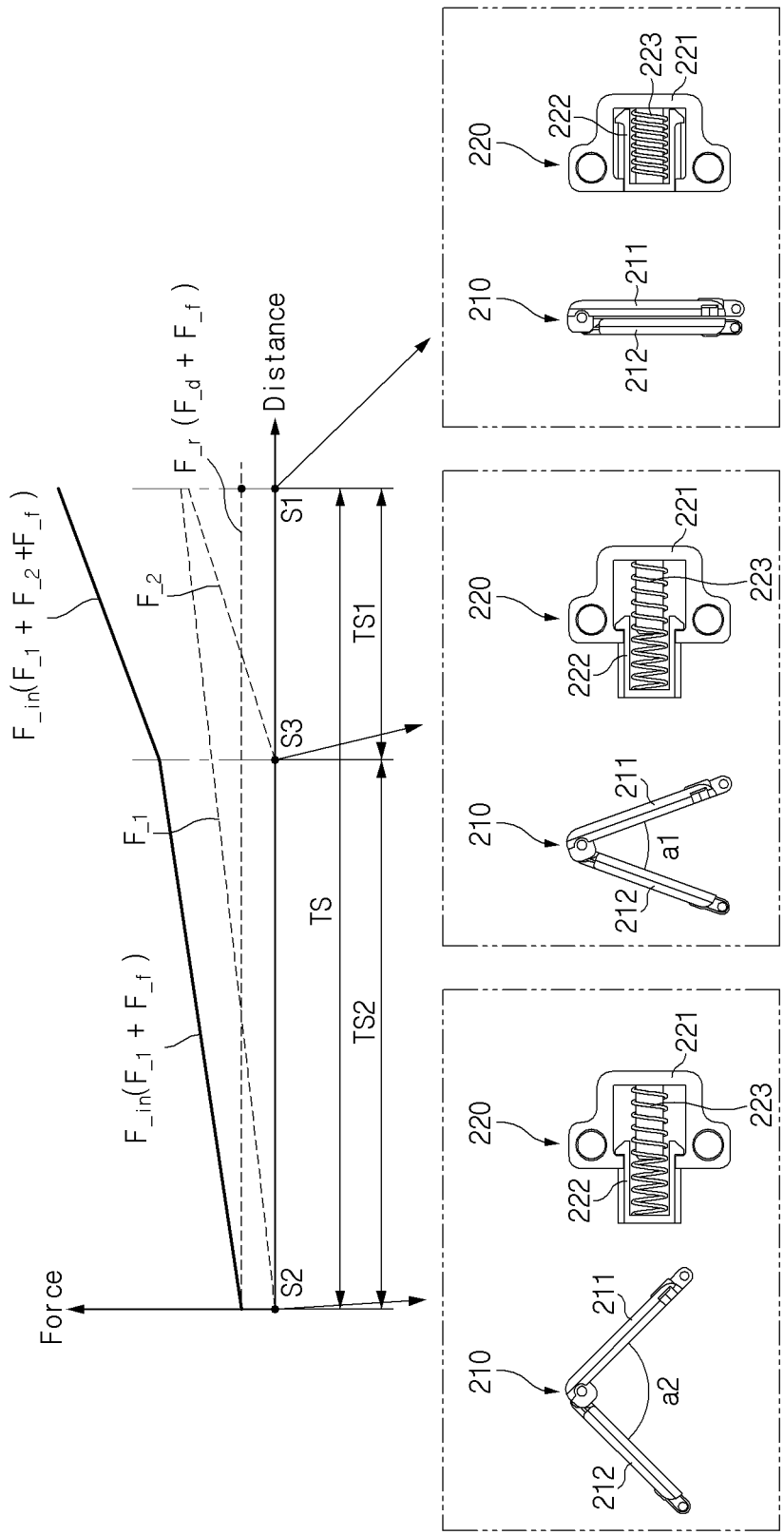
FIG. 14 illustrates a change of a sliding driving force in an operation in which an electronic device is changed from a second state to a first state according to an embodiment of the disclosure.

FIG. 13 illustrates a change of a sliding driving force in an operation in which an electronic device is changed from a first state to a second state according to an embodiment of the disclosure. FIG. 14 illustrates a change of a sliding driving force in an operation in which an electronic device is changed from a second state to a first state according to an embodiment of the disclosure.

As described above, the electronic device according to an embodiment (e.g., the electronic device 100 of FIGS. 1 to 4 and 12) may be changed to the first state S1 and the second state S2 by a sliding motion of a second structure (e.g., the second structure 140 of FIGS. 1 to 4 and 12) relative to a first structure (e.g., the first structure 110 of FIGS. 1 to 4 and 12). For example, the electronic device 100 may be changed from the first state S1 to the second state S2 by a driving force of a first driving member 210 or a second driving member 220 and may be changed from the second state S2 to the first state S1 by an external force applied by a user.

Referring to FIG. 13, the horizontal axis in the graph may refer to the width W of an exposed region of a display (e.g., the display 160 of FIG. 12) forming the front side of the electronic device 100 when the electronic device (e.g., the electronic device 100 of FIG. 12) is changed from the first state S1 (e.g., the first state S1 of FIG. 12) to the second state S2 (e.g., the second state S2 of FIG. 12). The vertical axis in the graph may refer to the magnitude F of each of a driving force $F\_e$ and a resistance force $F\_r$.

Referring to FIG. 14, the horizontal axis in the graph may refer to the width W of the exposed region of the display (e.g., the display 160 of FIG. 12) forming the front side of the electronic device 100 when the electronic device (e.g., the electronic device 100 of FIG. 12) is changed from the second state S2 (e.g., the second state S2 of FIG. 12) to the first state S1 (e.g., the first state S1 of FIG. 12). The vertical axis in the graph may refer to the magnitude F of each of the driving force $F\_e$ and the resistance force $F\_r$.

Referring to FIGS. 13 and 14, the first state S1, the second state S2, and the third state S3 may be referred to as the first state S1, the second state S2, and the third state S3 of the electronic device 100 illustrated in FIG. 12. Furthermore, the first width W1, the second width W2, and the third width W3 may be referred to as the first width W1, the second width W2, and the third width W3 of the exposed region of the display 160 illustrated in FIG. 12.

The electronic device 100 according to an embodiment may include the first state S1 in which the width W of the exposed region of the display (e.g., the display 160 of FIG. 12) is the first width W1, the third state S3 in which the width W of the exposed region is the third width W3, and the second state S2 in which the width W of the exposed region is the second width W2. The second width W2 may be greater than the third width W3, and the third width W3 may be greater than the first width W1.

The electronic device 100 according to an embodiment may include a deformation interval TS defined between the first state S1 and the second state S1. The deformation interval TS may include the third state S3 defined as a predetermined point in the deformation interval TS, a first interval TS1 defined between the first state S1 and the third state S3, and a second interval TS2 defined between the second state S2 and the third state S3. For example, in the first interval TS1, the first driving member 210 and the second driving member 220 may simultaneously operate, and in the second interval TS2, the second driving member 220 may not operate and only the first driving member 210 may operate.

The electronic device 100 according to an embodiment may be configured such that the degree of change in the magnitude of the driving force $F\_e$ in the first interval TS1 differs from that in the second interval TS2. The degree of change in the magnitude of the driving force $F\_e$ may be changed with respect to the third state S3. For example, the ratio (slope) of the amount of change in the driving force $F\_e$ to the amount of change in the width W of the exposed region may be defined, and the ratio may have a first ratio (a first slope) in the first interval TS1 and a second ratio (a second slope) smaller than the first ratio in the second interval TS2.

Referring to FIG. 13, the electronic device 100 according to an embodiment may be changed from the first state S1 to the second state S2 by a first sliding force $F\_out$. The first sliding force $F\_out$ may refer to the force required for the electronic device 100 to be changed from the first state S1 to the second state S2.

In an embodiment of the disclosure, the magnitude of the first sliding force $F\_out$ may be determined by the driving force $F\_e$ of the driving members 210 and 220 and the resistance force $F\_r$ of components included in the electronic device 100. The first sliding force $F\_out$ may be defined as the difference (e.g., $F\_out = F\_e - F\_r$) between the driving force $F\_e$ and the resistance force $F\_r$. For example, the electronic device 100 may be configured such that the driving force $F\_e$ of the driving members 210 and 220 is greater than the resistance force $F\_r$ (e.g., $F\_e > F\_r$) for the purpose of a change from the first state S1 to the second state S2.

In an embodiment of the disclosure, the driving members 210 and 220 may include the first driving member 210 and the second driving member 220, and the driving force $F\_e$ may include a first driving force $F\_1$ generated by the first driving member 210 and a second driving force $F\_2$ generated by the second driving member 220. For example, the driving force $F\_e$ may be defined as the sum (e.g., $F\_e = F\_1 + F\_2$) of the first driving force $F\_1$ and the second driving force $F\_2$. The magnitude of the first driving force $F\_1$ and the magnitude of the second driving force $F\_2$ may linearly decrease depending on a travel distance of the second structure 140 in the operation in which the electronic device 100 is changed from the first state S1 to the second state S2. For example, the magnitude of the first driving force $F\_1$ and the magnitude of the second driving force $F\_2$ may be inversely proportional to the travel distance of the second structure 140. According to the illustrated embodiment of the disclosure, the degree (e.g., the slope of $F\_1$) to which the magnitude of the first driving force $F\_1$ decreases may differ from the degree (e.g., the slope of $F\_2$) to which the magnitude of the second driving force $F\_2$ decreases. However, the slope of the first driving force $F\_1$ and the slope of the second driving force $F\_2$ are not limited to the illustrated embodiment.

In an embodiment of the disclosure, the first driving force $F\_1$ may act in the entire interval of the operation in which the electronic device 100 is changed from the first state S1 to the second state S2. For example, the first driving force $F\_1$ may act in the first state S1, the deformation interval TS, and/or the second state S2. The magnitude of the first driving force $F\_1$ may linearly decrease from the first state Si toward the second state S2. For example, the magnitude of the first driving force $F\_1$ may decrease with an increase in the included angle formed by a first arm 211 and a second arm 212. When the electronic device 100 is in the first state, the first driving member 210 may be in a state in which the first arm 211 and the second arm 212 are parallel to each other and face each other, and the first arm 211 and the second arm 212 may form an included angle of substantially 0 degrees. When the electronic device 100 is in the third state S3 between the first state S1 and the second state S2, the first arm 211 and the second arm 212 may form a first included angle al. When the electronic device 100 is in the second state S2, the first arm 211 and the second arm 212 may form a second included angle a2 greater than the first included angle a1.

In an embodiment of the disclosure, the second driving force F_2 may act in a partial interval of the operation in which the electronic device 100 is changed from the first state S1 to the second state S2. For example, the second driving force F_2 may act in the first state S1 and the first interval TS1. As described above with reference to FIG. 12, a movable member 222 of the second driving member 220 may be separated from a display support member (e.g., the display support member 170 of FIG. 12) after the third state S3 and may not apply the second driving force F_2 to the display support member 170.

In an embodiment of the disclosure, the magnitude of the second driving force F_2 may linearly decrease from the first state S1 toward the third state S3. For example, the magnitude of the second driving force F_2 may decrease with an increase in the distance the movable member 222 moves relative to a fixed member 221 (or, with an increase in the length of a second elastic member 223).

In an embodiment of the disclosure, the magnitude of the second driving force F_2 may be substantially 0 in the third state S3 and the second interval TS2. For example, the second driving member 220 may maintain substantially the same form in the third state S3, the second interval TS2, and the second state S2. For example, while the width of the exposed region increases from the third width W3 to the second width W2, the second elastic member 223 may no longer be uncompressed and may be in equilibrium.

In an embodiment of the disclosure, the magnitude of the driving force F_e of the driving members 210 and 220 may be equal to the sum of the first driving force F_1 and the second driving force F_2 between the first state S1 and the third state S3 (e.g., in the first interval TS1) and may be equal to the magnitude of the first driving force F_1 between the third state S3 and the second state S2 (e.g., in the second interval TS2). In an embodiment of the disclosure, when the electronic device 100 is changed from the first state S1 to the second state S2, the driving force F_e may have a negative slope. The degree (e.g., the slope of F_e) to which the magnitude of the driving force F_e decreases may be smaller in the second interval TS2 than in the first interval TS1. The slope of the driving force F_e may be changed with respect to the third state S3.

In an embodiment of the disclosure, the resistance force F_r may include a friction force F_f caused by friction between mechanical components included in the electronic device 100 and a display resistance force F_d caused by characteristics of the display (e.g., the display 160 of FIG. 12). For example, the resistance force F_r may be defined as the sum (e.g., F_r=F_f+F_d) of the friction force F_f between the mechanical components and the display resistance force F_d.

In an embodiment of the disclosure, the friction force F_f between the mechanical components may be defined as the sum of friction forces generated among components included in the electronic device 100 when the state of the electronic device 100 is changed. For example, the friction force F_f may include a friction force between the first structure (e.g., the first structure 110 of FIG. 12) and the second structure (e.g., the second structure 140 of FIG. 12), a friction force between the display support member (e.g., the display support member 170 of FIGS. 10 and 12) and a guide member (e.g., the guide member 192 of FIG. 10), or a friction force (e.g., refer to FIG. 11) between the display support member 170 and the support bar 180.

In an embodiment of the disclosure, the display resistance force F_d may be a resistance force caused by flexible physical characteristics of the display 160. For example, the display resistance force F_d may be determined by the thickness of the display 160, the radius of curvature of the bent portion, and/or physical characteristics of a plurality of layers included in the display 160.

In an embodiment of the disclosure, the display resistance force F_d may include the elastic deformation repulsion force and the plastic deformation restoring force of the display 160. For example, the elastic deformation repulsion force may be a force generated as the display 160 is elastically deformed in the process in which the form of the display 160 is deformed. The plastic deformation restoring force may be a force required in a predetermined initial interval to deform the shape of the display 160 in the state in which the display 160 maintains a predetermined shape for a predetermined period of time. The plastic deformation restoring force may be generated in the predetermined initial interval when the electronic device 100 is changed from the first state S1 to the second state S2 and may cause deterioration in the feeling of operation.

For example, when the electronic device 100 is changed from the first state S1 to the second state S2, the electronic device 100 may include a fourth state S4 that is an arbitrary state between the first state S1 and the third state S3. The fourth state S4 may be an arbitrary state in which the width W of the exposed region of the display 160 is a fourth width W4 greater than the first width W1 and smaller than the third width W3. The magnitude of the display resistance force F_d may be equal to the sum of the elastic deformation repulsion force and the plastic deformation restoring force between the first state S1 and the fourth state S4 and may be equal to the magnitude of the elastic deformation repulsion force between the fourth state S4 and the second state S2.

In an embodiment of the disclosure, the magnitude of the resistance force F_r may be variable in the process in which the electronic device 100 is changed from the first state S1 to the second state S2. For example, when the electronic device 100 is changed from the first state S1 to the second state S2, the friction force F_r between the mechanical components may act with a predetermined magnitude in the entire interval between the first state S1 and the second state S2. The display resistance force F_d may constantly act with a first magnitude (e.g., the sum of the elastic deformation repulsion force and the plastic deformation restoring force) in the interval between the first state S1 and the fourth state S4 and may constantly act with a second magnitude (e.g., the elastic deformation repulsion force) smaller than the first magnitude in the interval between the fourth state S4 and the second state S2. Accordingly, the resistance force F_r may be smaller by a predetermined magnitude in the interval between the fourth state S4 and the second state S2 than in the interval between the first state S1 and the fourth state S4.

Referring to FIG. 13, when the electronic device 100 is changed from the first state S1 to the second state S2, the electronic device 100 according to an embodiment may additionally secure the first sliding force F_out at the initial stage of the deformation operation (e.g., in the first interval TS1) as the second driving force F_2 acts in a predetermined interval (e.g., the first interval TS1) of the deformation interval TS between the first state S1 and the second state S2. Accordingly, when the electronic device 100 is changed to the second state S2 after stored in the first state S1 for a long period of time, the feeling of operation at the initial stage of deformation may be improved.

Referring to FIG. 14, the electronic device 100 according to an embodiment may be changed from the second state S2 to the first state S1 by a second sliding force F_in. The second sliding force F_in may refer to the force required for the electronic device 100 to be changed from the second state S2 to the first state S1.

In an embodiment of the disclosure, the magnitude of the second sliding force F_in may be determined by the driving forces F_1 and F_2 of the driving members 210 and 220 and the resistance force F_r of the components included in the electronic device 100. The second sliding force F_in may be defined as the sum (e.g., F_in=F_1+F_2+F_r) of the driving forces F_1 and F_2 and the resistance force F_r. The user may change the electronic device 100 to the first state S1 by applying an external force of a magnitude corresponding to the second sliding force F_in to the second structure (e.g., the second structure 140 of FIG. 12) in the second direction (e.g., the second direction D2 of FIG. 12).

In an embodiment of the disclosure, when the electronic device 100 is changed from the second state S2 to the first state S1, the first driving force F_1 and the second driving force F_2, together with the resistance force F_r, may act as a force against the external force applied by the user. The user has to apply a force corresponding to the resultant force of the first driving force F_1, the second driving force F_2, and the resistance force F_r to change the electronic device 100 from the second state S2 to the first state S1.

In an embodiment of the disclosure, the magnitude of the second sliding force F_in may increase from the second state S2 toward the first state S1. For example, the electronic device 100, when changed from the second state S2 to the first state S2, may require a greater force later in the deformation operation. The second sliding force F_in may have a positive slope when the electronic device 100 is changed from the second state S2 to the first state S1. The degree (e.g., the slope of F_in) to which the magnitude of the second sliding force F_in increases may be greater in the first interval TS1 than in the second interval TS2. The slope of the second sliding force F_in may be changed with respect to the third state S3.

In an embodiment of the disclosure, the first driving force F_1 may act in the second state S2, the deformation interval TS, and/or the first state S1. The magnitude of the first driving force F_1 may linearly increase from the second state S2 toward the first state S1. For example, the magnitude of the first driving force F_1 may increase with a decrease in the included angle formed by the first arm 211 and the second arm 212.

In an embodiment of the disclosure, when the electronic device 100 is changed from the second state S2 to the first state S1, the second driving force F_2 may not act in an initial interval (e.g., the second interval TS2) in which deformation starts and may act in a partial interval (e.g., the first interval TS1) before the deformation is completed. As described above with reference to FIG. 13, the second driving force F_2 may not act in the second state S2, the second interval TS2, and the third state S3 and may act in the interval between the first interval TS1 and the first state S1. For example, the second driving member 220 may generate the second driving force F_2 while the second elastic member 223 is compressed from the moment when the electronic device 100 passes the third state S3. The magnitude of the second driving force F_2 may linearly increase as the length of the second elastic member 223 is decreased (or, the degree of compression of the second elastic member 223 is increased) from the third state S3 toward the first state S1.

In an embodiment of the disclosure, the magnitude of the resistance force F_r may remain constant in the entire interval of the operation in which the electronic device 100 is changed from the second state S2 to the first state S1. For example, when the electronic device 100 is changed from the second state S2 to the first state S1, the display resistance force F_d may not include the plastic deformation repulsion force, as compared with when the electronic device 100 is changed from the first state S1 to the second state S2.

According to the illustrated embodiment of the disclosure, the second sliding force F_in may be equal to the resultant force (e.g., F_in=F_r+F_1) of the resistance force F_r and the first driving force F_1 in the second state S2 and the second interval TS2 and may be equal to the resultant force (e.g., F_in=F_r+F_1+F_2) of the resistance force F_r, the first driving force F_1, and the second driving force F_2 in the third state S3, the first interval TS1, and the first state S1.

Referring to FIG. 14, when the electronic device 100 is changed from the second state S2 to the first state S1, the electronic device 100 according to an embodiment may prevent action of an excessive force at the initial stage of deformation (e.g., in the second interval TS2) as the second driving force F_2 acts in a predetermined interval (e.g., the first interval TS1) of the deformation interval TS between the second state S2 and the first state S1. Accordingly, when the electronic device 100 is changed from the second state S2 to the first state S1, the time during which an excessive force acts may be reduced. For example, the electronic device 100 according to the disclosure may be configured such that the amount of physical work required when the electronic device 100 is changed to the first state S1 is the same and resistance forces of different magnitudes separately act in a partial interval of the deformation operation. Accordingly, as compared with when a relatively strong resistance force uniformly acts in the entire interval of the deformation operation, a load or a sense of fatigue that the user feels when using the electronic device 100 may be reduced, which may lead to an improvement in the quality of experience of a product.

The second driving member 220 illustrated in FIGS. 13 and 14, including the elastic member 223, may be referred to as the second driving member 220 of FIGS. 7A, 7B, 8A, 8B, 9A, and 9B. However, the type of second driving member 220 is not limited thereto. As described above with reference to FIGS. 7A, 7B, 8A, and 8B, in various embodiments (not illustrated) of the disclosure, a second driving member (not illustrated) may include a plurality of magnets (not illustrated) and may provide a driving force using a magnetic force. Even in the case of the embodiment in which the second driving member (not illustrated) includes the magnets, the second driving force F_2 may act only in a partial interval (e.g., the first interval TS1) of the deformation operation of the electronic device 100. In the case of the embodiment in which the second driving member (not illustrated) includes the magnets, the graphs of FIGS. 13 and 14 may be changed to at least partially form a curve in the first interval TS1.

Hereinafter, embodiments in which second driving members are formed in various forms will be described with reference to FIGS. 15A and 15B.

Figure 15A:
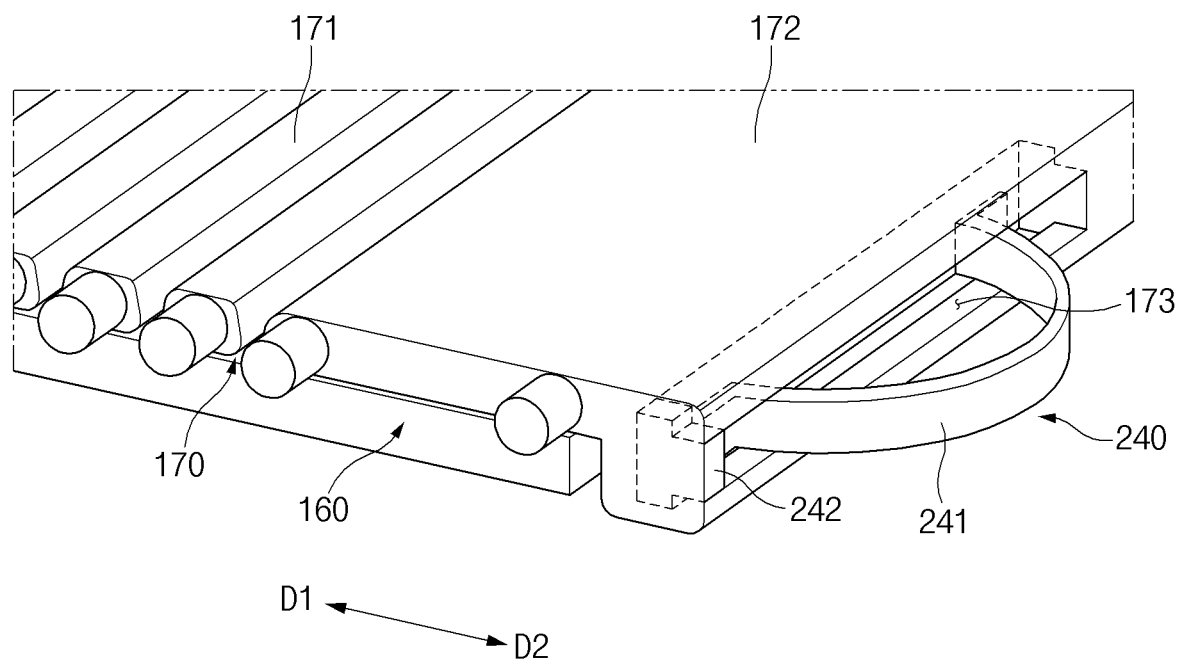
FIG. 15A illustrates a second driving member of an electronic device according to an embodiment of the disclosure.

FIG. 15A illustrates a second driving member of an electronic device according to an embodiment of the disclosure.

Referring to FIG. 15A, the electronic device 100 according to an embodiment may include a display 160, a display support member 170 disposed on the rear surface of the display 160, and the second driving member 240 disposed on a second portion 172 of the display support member 170.

FIG. 15A illustrates another embodiment in which the structure or shape of the second driving member (e.g., the second driving member 220 of FIGS. 7A, 7B, 8A, 8B, 9A, 9B, 10, 11, and 12) is changed, when compared with the electronic device described above, and repetitive descriptions will hereinafter be omitted.

In an embodiment of the disclosure, the display support member 170 may include a first portion 171 (e.g., a multi joint portion) and the second portion 172 extending from the first portion 171. A receiving recess 173 in which the second driving member 240 is accommodated may be formed on the second portion 172 of the display support member 170.

In an embodiment of the disclosure, the second driving member 240 may be disposed on the display support member 170. For example, the second driving member 240 may be coupled to the second portion 172 of the display support member 170. The second driving member 220 illustrated in FIGS. 7A, 7B, 8A, 8B, 9A, 9B, 10, 11, and 12 may be fixed to the first structure (e.g., the first structure 110 of FIGS. 9A, 9B, 10, 11, and 12), whereas the second driving member 240 illustrated in FIG. 15A may be fixed to the display support member 170.

In an embodiment of the disclosure, the second driving member 240 may include a third elastic member 241 that is elastically deformable and a fastening member 242 for fastening the third elastic member 241 to the display support member 170. The third elastic member 241 may be configured to be elastically deformed in the state in which at least part of the third elastic member 241 is disposed in the receiving recess 173, and the fastening member 242 may prevent separation of the third elastic member 241 from the receiving recess 173.

In an embodiment of the disclosure, the third elastic members 241 may include a leaf spring. The third elastic member 241 may generate an elastic force in a second direction D2. As illustrated in FIG. 15A, the third elastic member 241 may have a shape that is curved with a predetermined curvature. When an external force is applied to the third elastic member 241 in a first direction D1, the third elastic member 241 may be deformed while the curved portion is flattened (or, the curvature of the curved portion is increased), and when the external force is removed, the third elastic member 241 may generate an elastic force in the second direction D2 while being elastically deformed to the original shape before the deformation of the third elastic member 241 by the external force. For example, opposite end portions of the third elastic member 241 may move in a direction perpendicular to the sliding directions D1 and D2 inside the receiving recess 173, and a central portion of the third elastic member 241 may move in a direction parallel to the sliding directions D1 and D2.

The electronic device 100 according to an embodiment may be configured such that in a first state, the second portion 172 of the display support member 170 remains supported by one side of a first structure (e.g., the first structure 110 of FIGS. 1 to 4). For example, the first structure 110 may include a support surface (not illustrated) for supporting the third elastic member 241. When the electronic device 100 is in the first state, the third elastic member 241 may be deformed by an external force applied thereto in the first direction D1 by the first structure 110. When the electronic device 100 is changed from the first state to the second state, the third elastic member 241 may be returned (e.g., elastically deformed or elastically recovered) to the original shape to generate an elastic force in the second direction D2. Accordingly, the second driving member 240 may provide a driving force to push the second portion 172 of the display support member 170 in the first direction D1 with respect to the first structure 110.

According to the illustrated embodiment of the disclosure, the third elastic member 241 may be implemented with a leaf spring. However, the type of third elastic member 241 is not limited to the illustrated embodiment. According to various embodiments (not illustrated) of the disclosure, the third elastic member 241 may include a coil spring and a torsion spring.

Likewise to the second driving member 240 described above, the second driving member 240 according to the embodiment illustrated in FIG. 15A may be configured to apply a driving force only in a partial interval (e.g., the interval between the first state S1 and the third state S3 of FIGS. 12 to 14) of a deformation operation when the state of the electronic device 100 is changed. For example, in the process in which the state of the electronic device 100 is changed, a change of the driving force of the second driving member 240 illustrated in FIG. 15A may be substantially the same as the graph illustrated in FIGS. 13 and 14.

Figure 15B:
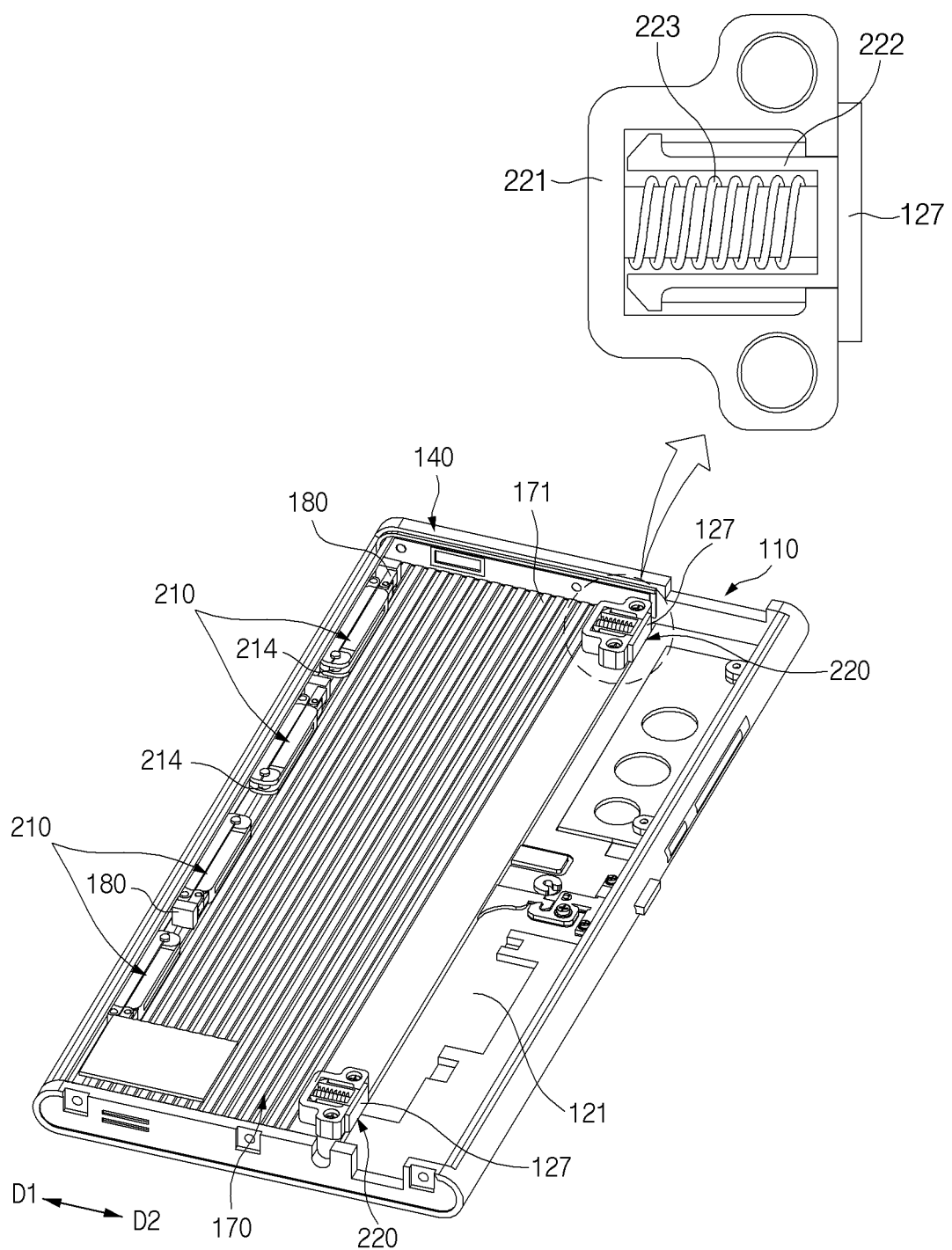
FIG. 15B illustrates a second driving member of an electronic device according to an embodiment of the disclosure.

FIG. 15B illustrates a second driving member of an electronic device according to an embodiment of the disclosure.

Referring to FIG. 15B, the electronic device 100 according to an embodiment may include a first structure 110, a second structure 140, a display support member 170, a support bar 180, a first driving member 210, and the second driving member 220.

FIG. 15B illustrates another embodiment in which the second driving member 220 is disposed on the display support member 170, when compared with the electronic device described above. The second driving member 220 illustrated in FIG. 15B may be substantially the same as the second driving member 220 described above with reference to FIGS. 7A, 7B, 8A, 8B, 9A, and 9B, and repetitive descriptions will hereinafter be omitted.

In an embodiment of the disclosure, the second driving member 220 may be disposed on the display support member 170. For example, the second driving member 220 may be disposed on a second portion 172 of the display support member 170 and may move together with the second driving member 220. For example, a fixed member 221 of the second driving member 220 may be fixedly disposed on the second portion 172 of the display support member 10, and a movable member 222 may move in sliding directions D1 and D2 inside the fixed member 221.

In an embodiment of the disclosure, the second driving member 220 may be configured to apply an elastic force to part of the first structure 110 in the second direction D2. For example, the first structure 110 may include a support wall 127 that supports the second driving member 220, and at least part of the second driving member 220 may be brought into contact with, or spaced apart from, the support wall 127. For example, the support wall 127 may protrude from a first plate portion 121 of the first structure 110. The second driving member 220 may be configured such that a second elastic member 223 remains in a compressed state as the movable member 222 is brought into contact with the support wall.

In an embodiment of the disclosure, the second driving member 220 may be configured to move the second portion 172 of the display support member 170 in the first direction D1 by applying an elastic force to the support wall 127 of the first structure 110 in the second direction D2. For example, when the electronic device 100 is in a first state, the movable member 222 may be supported on the support wall 127, and accordingly the second elastic member 223 may remain compressed. In the process in which the electronic device 100 is changed from the first state to the second state, the second driving member 220 may push the movable member 222 in the second direction D2 by a predetermined length with respect to the fixed member 221 as the compressed second elastic member 223 is uncompressed. As the second elastic member 223 pushes the movable member 222 in the second direction D2, the fixed member 221 fixed to the display support member 170 may move in the first direction D1 from the support wall 127. Accordingly, a second driving force (not illustrated) facing the first direction D1 may be applied to the second portion 172 of the display support member 170.

Figure 16:
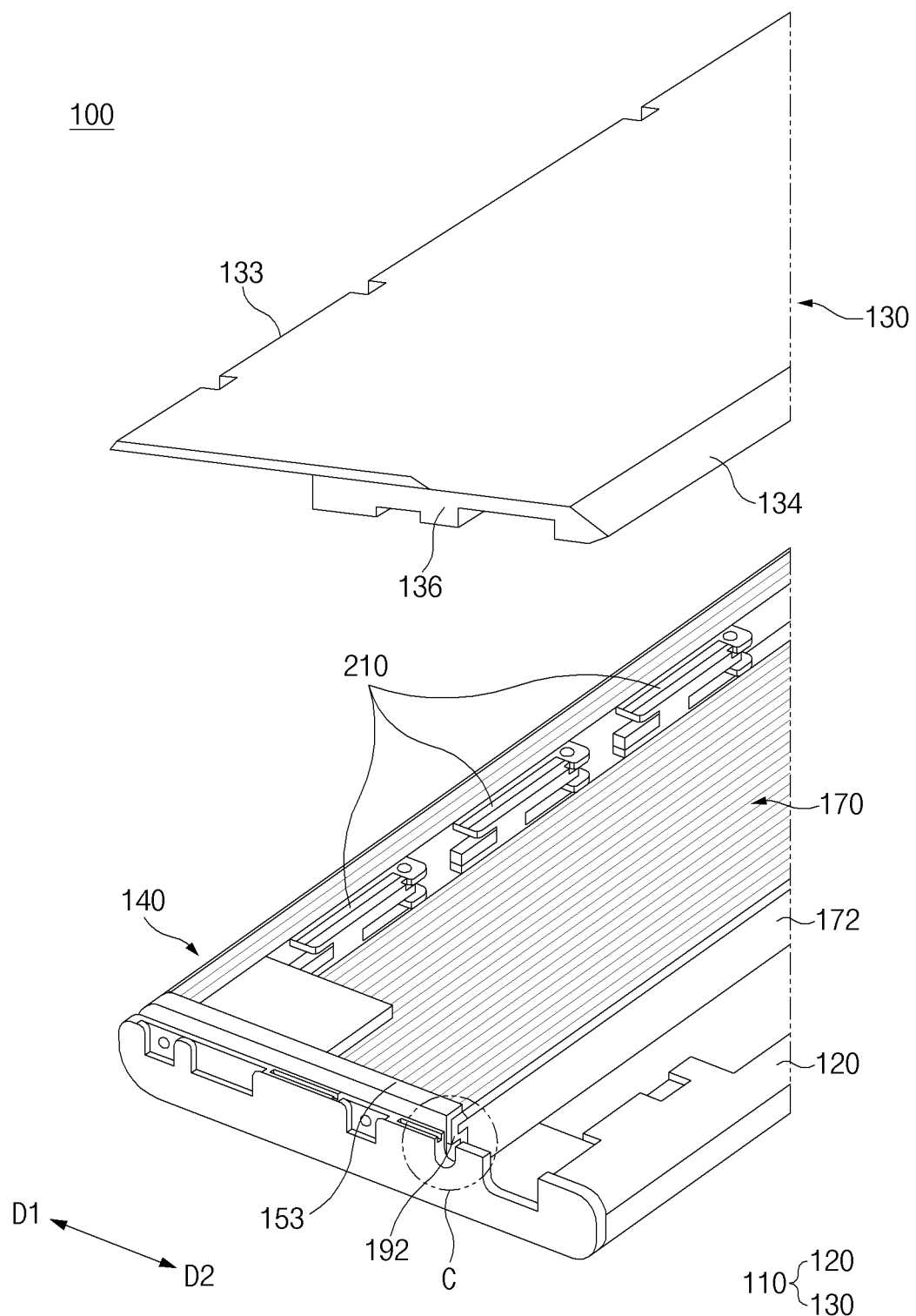
FIG. 16 is an exploded perspective view of some components of an electronic device according to an embodiment of the disclosure.
Figure 17A:
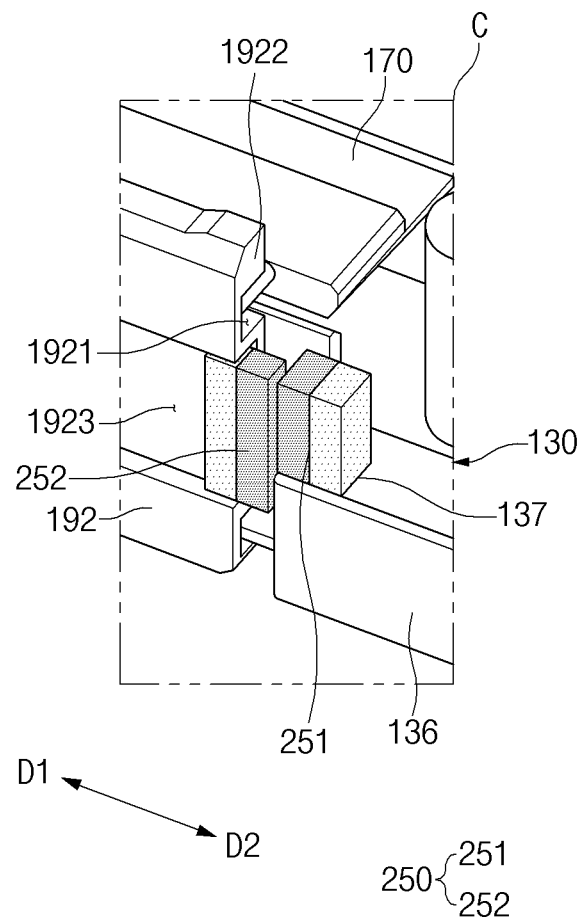
FIG. 17A illustrates a third driving member of an electronic device according to an embodiment of the disclosure.
Figure 17B:
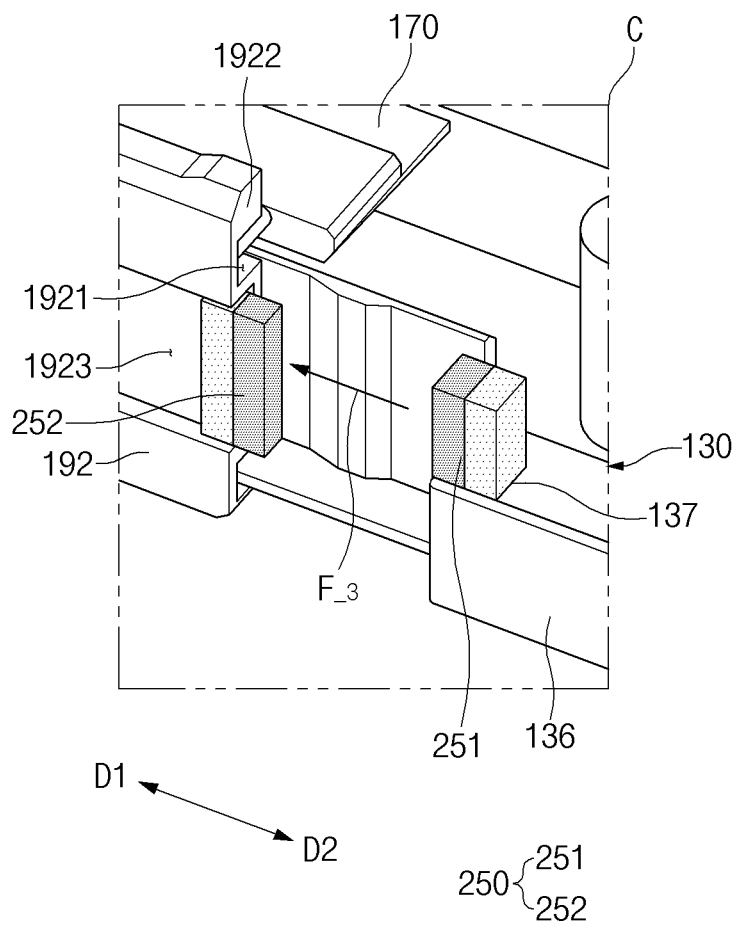
FIG. 17B illustrates the third driving member of an electronic device according to an embodiment of the disclosure.

FIG. 16 is an exploded perspective view of some components of an electronic device according to an embodiment of the disclosure. FIGS. 17A and 17B illustrate a third driving member of an electronic device according to an embodiment of the disclosure.

Referring to FIGS. 16, 17A, and 17B, the electronic device 100 according to an embodiment may include a first structure 110, a second structure 140, a display support member 170, a first driving member 210, and the second driving member 250.

FIGS. 17A and 17B illustrate an embodiment additionally and/or alternatively including the third driving member 250. FIGS. 17A and 17B may be an enlarged view of portion C where the third driving member 250 is disposed in the state in which the first structure 110 and the second structure 140 are coupled in the electronic device 100 illustrated in FIG. 16.

Some of the components of the electronic device 100 illustrated in FIGS. 16, 17A, and 17B are identical or similar to some of the components of the electronic device 100 described above, and therefore repetitive descriptions will hereinafter be omitted.

In an embodiment of the disclosure, the first structure 110 may include a first case 120 and a bracket 130 coupled to the first case 120. The second structure 140 may include a guide member 192 coupled to the inside surface of a sidewall 153 (e.g., the fifth sidewall 153 of FIG. 3) of the second structure 140. The guide member 192 may include a guide groove 1921 into which part of the display support member 170 is inserted.

In an embodiment of the disclosure, the third driving member 250 may include a first magnet 251 and a second magnet 252. For example, the first magnet 251 may be coupled to one side of the bracket 130, and the second magnet 252 may be coupled to one side of the guide member 192 to face the first magnet 251. The first magnet 251 and the second magnet 252 may be disposed such that identical magnetic poles face each other, and a repulsive force may be generated between the first magnet 251 and the second magnet 252.

In an embodiment of the disclosure, the bracket 130 may include a support portion 136 on which the first magnet 251 is disposed. The support portion 136 may face an end portion 1922 of the guide member 192 when the bracket 130 is coupled to the first case 120. The support portion 136 may extend from a second edge portion 134 toward a first edge portion 133 by a predetermined length. For example, a first recess 137 in which the first magnet 251 is disposed may be formed on the support portion 136. At least part of the first magnet 251 may be disposed in the first recess 137.

In an embodiment of the disclosure, the guide member 192 may include a second recess 1923 in which the second magnet 252 is disposed. The second recess 1923 may be formed to face away from the guide groove 1921. The second magnet 252 may be located adjacent to the end portion 1922 of the guide member 192 to face the first magnet 251, and at least part of the second magnet 252 may be disposed in the second recess 1923.

In an embodiment of the disclosure, the third driving member 250 may provide a third driving force F_3 for moving the guide member 192. The third driving member 250 may be configured to move the guide member 192 in a first direction D1 with respect to the bracket 130 by using the repulsive force generated between the first magnet 251 and the second magnet 252. The third driving member 250 may help a rotary motion of part of the display support member 170 moving along the guide groove 1921, by moving the guide member 192 in the first direction D1. For example, the third driving force F_3 may refer to the repulsive force between the first magnet 251 and the second magnet 252.

According to the embodiment illustrated in FIGS. 17A and 17B, when the electronic device 100 is in a first state (e.g., FIG. 17A), the first magnet 251 and the second magnet 252 may be disposed such that the identical magnetic poles make contact with each other or face each other at close positions, and the repulsive force may be generated between the first magnet 251 and the second magnet 252. When the electronic device 100 is changed to a second state (e.g., FIG. 17B), the second magnet 252 may be moved away from the first magnet 251 in the first direction D1 by the repulsive force generated between the first magnet 251 and the second magnet 252, and accordingly the guide member 192 (or, the second structure 140) may move in the first direction D1 relative to the bracket 130 (or, the first structure 110).

In an embodiment of the disclosure, the magnitude of the third driving force F_3 may vary depending on the separation distance between the first magnet 251 and the second magnet 252. For example, the magnitude of the third driving force F_3 may decrease with an increase in the distance between the first magnet 251 and the second magnet 252.

In an embodiment of the disclosure, the third driving force F_3 may not act when the first magnet 251 and the second magnet 252 are spaced apart from each other by a predetermined distance or more. The third driving force F_3 may act only in a partial interval of a deformation operation when the state of the electronic device 100 is changed. For example, when the electronic device 100 is changed from a first state S1 to a second state S2, the third driving force F_3 may act up to an interval in which the second structure 140 moves relative to the first structure 110 in the first direction D1 by a predetermined distance and may not act after the second structure 140 moves more than the predetermined distance. In contrast, when the electronic device 100 is changed from the second state S2 to the first state S1, the third driving force F_3 may act after the second structure 140 moves relative to the first structure 110 in the second direction D2 by a predetermined distance or more. The third driving force F_3 may not act when the second structure 140 moves less than the predetermined distance.

According to the illustrated embodiment of the disclosure, the third driving member 250 may be configured to provide the driving force using the magnetic force. However, the third driving member 250 is not limited to the illustrated embodiment. According to various embodiments (not illustrated) of the disclosure, a third driving member (not illustrated) may include an elastic member (not illustrated) that is disposed on one of the end portion 1922 of the guide member 192 and the support portion 136 of the bracket 130 and that applies an elastic force to the other one of the end portion 1922 of the guide member 192 and the support portion 136 of the bracket 130.

In various embodiments of the disclosure, the electronic device 100 may further include the third driving member 250, in addition to the first driving member 210 and the second driving member 220. Furthermore, in various embodiments of the disclosure, the electronic device 100 may include the third driving member 250 instead of the second driving member 220.

Figure 18:
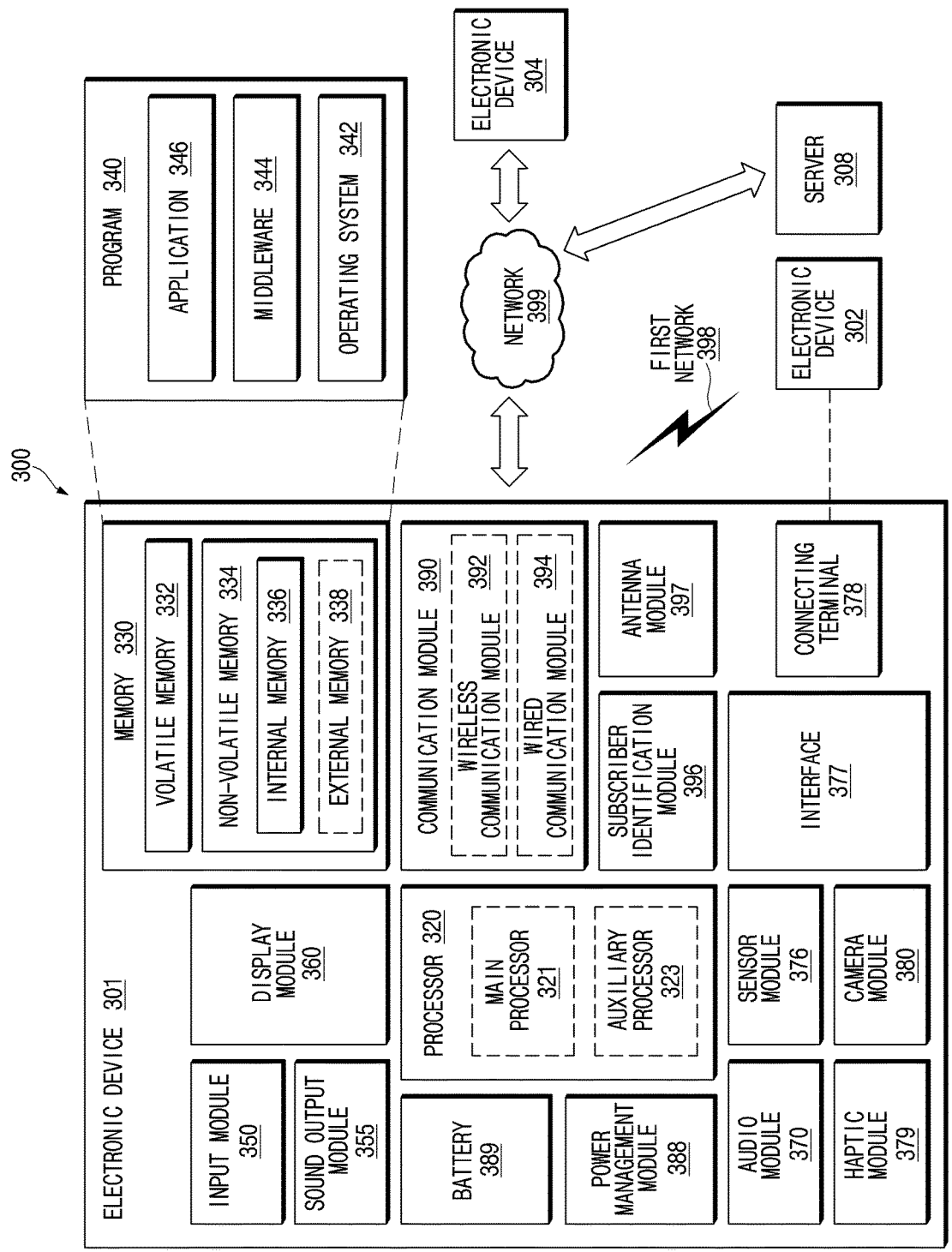
FIG. 18 is a block diagram of an electronic device in a network environment according to an embodiment of the disclosure.

FIG. 18 is a block diagram of an electronic device in a network environment according to an embodiment of the disclosure.

Referring to FIG. 18, the electronic device 301 (e.g., the electronic device 100 of FIGS. 1 and 2) in a network environment 300 according to the embodiment may communicate with an electronic device 302 via a first network 398 (e.g., a short-range wireless communication network), or at least one of an electronic device 304 or a server 308 via a second network 399 (e.g., a long-range wireless communication network). According to an embodiment of the disclosure, the electronic device 301 may communicate with the electronic device 304 via the server 308.

According to an embodiment of the disclosure, the electronic device 301 may include a processor 320, memory 330, an input module 350, a sound output module 355, a display module 360, an audio module 370, a sensor module 376, an interface 377, a connecting terminal 378, a haptic module 379, a camera module 380, a power management module 388, a battery 389, a communication module 390, a subscriber identification module (SIM) 396, or an antenna module 397. In some embodiments of the disclosure, at least one of the components (e.g., the connecting terminal 378) may be omitted from the electronic device 301, or one or more other components may be added in the electronic device 301. In some embodiments of the disclosure, some of the components (e.g., the sensor module 376, the camera module 380, or the antenna module 397) may be implemented as a single component (e.g., the display module 360).

The processor 320 may execute, for example, software (e.g., a program 340) to control at least one other component (e.g., a hardware or software component) of the electronic device 301 coupled with the processor 320, and may perform various data processing or computation. According to one embodiment of the disclosure, as at least part of the data processing or computation, the processor 320 may store a command or data received from another component (e.g., the sensor module 376 or the communication module 390) in a volatile memory 332, process the command or the data stored in the volatile memory 332, and store resulting data in a non-volatile memory 334. According to an embodiment of the disclosure, the processor 320 may include a main processor 321 (e.g., a central processing unit (CPU) or an application processor (AP)), or an auxiliary processor 323 (e.g., a graphics processing unit (GPU), a neural processing unit (NPU), an image signal processor (ISP), a sensor hub processor, or a communication processor (CP)) that is operable independently from, or in conjunction with, the main processor 321. For example, when the electronic device 301 includes the main processor 321 and the auxiliary processor 323, the auxiliary processor 323 may be adapted to consume less power than the main processor 321, or to be specific to a specified function. The auxiliary processor 323 may be implemented as separate from, or as part of the main processor 321.

The auxiliary processor 323 may control at least some of functions or states related to at least one component (e.g., the display module 360, the sensor module 376, or the communication module 390) among the components of the electronic device 301, instead of the main processor 321 while the main processor 321 is in an inactive (e.g., sleep) state, or together with the main processor 321 while the main processor 321 is in an active state (e.g., executing an application). According to an embodiment of the disclosure, the auxiliary processor 323 (e.g., an image signal processor or a communication processor) may be implemented as part of another component (e.g., the camera module 380 or the communication module 390) functionally related to the auxiliary processor 323. According to an embodiment of the disclosure, the auxiliary processor 323 (e.g., the neural processing unit) may include a hardware structure specified for artificial intelligence model processing. An artificial intelligence model may be generated by machine learning. Such learning may be performed, e.g., by the electronic device 301 where the artificial intelligence is performed or via a separate server (e.g., the server 308). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 330 may store various data used by at least one component (e.g., the processor 320 or the sensor module 376) of the electronic device 301. The various data may include, for example, software (e.g., the program 340) and input data or output data for a command related thereto. The memory 330 may include the volatile memory 332 or the non-volatile memory 334.

The program 340 may be stored in the memory 330 as software, and may include, for example, an operating system (OS) 342, middleware 344, or an application 346.

The input module 350 may receive a command or data to be used by another component (e.g., the processor 320) of the electronic device 301, from the outside (e.g., a user) of the electronic device 301. The input module 350 may include, for example, a microphone, a mouse, a keyboard, a key (e.g., a button), or a digital pen (e.g., a stylus pen).

The sound output module 355 may output sound signals to the outside of the electronic device 301. The sound output module 355 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 360 may visually provide information to the outside (e.g., a user) of the electronic device 301. The display module 360 may include, for example, a display, a hologram device, or a projector and control circuitry to control a corresponding one of the display, hologram device, and projector. According to an embodiment of the disclosure, the display module 360 may include a touch sensor adapted to detect a touch, or a pressure sensor adapted to measure the intensity of force incurred by the touch.

The audio module 370 may convert a sound into an electrical signal and vice versa. According to an embodiment of the disclosure, the audio module 370 may obtain the sound via the input module 350, or output the sound via the sound output module 355 or a headphone of an external electronic device (e.g., an electronic device 302) directly (e.g., wiredly) or wirelessly coupled with the electronic device 301.

The sensor module 376 may detect an operational state (e.g., power or temperature) of the electronic device 301 or an environmental state (e.g., a state of a user) external to the electronic device 301, and then generate an electrical signal or data value corresponding to the detected state. According to an embodiment of the disclosure, the sensor module 376 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 377 may support one or more specified protocols to be used for the electronic device 301 to be coupled with the external electronic device (e.g., the electronic device 302) directly (e.g., wiredly) or wirelessly. According to an embodiment of the disclosure, the interface 377 may include, for example, a high definition multimedia interface (HDMI), a universal serial bus (USB) interface, a secure digital (SD) card interface, or an audio interface.

A connecting terminal 378 may include a connector via which the electronic device 301 may be physically connected with the external electronic device (e.g., the electronic device 302). According to an embodiment of the disclosure, the connecting terminal 378 may include, for example, a HDMI connector, a USB connector, a SD card connector, or an audio connector (e.g., a headphone connector).

The haptic module 379 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 379 may include, for example, a motor, a piezoelectric element, or an electric stimulator.

The camera module 380 may capture a still image or moving images. According to an embodiment of the disclosure, the camera module 380 may include one or more lenses, image sensors, image signal processors, or flashes.

The power management module 388 may manage power supplied to the electronic device 301. According to one embodiment of the disclosure, the power management module 388 may be implemented as at least part of, for example, a power management integrated circuit (PMIC).

The battery 389 may supply power to at least one component of the electronic device 301. According to an embodiment of the disclosure, the battery 389 may include, for example, a primary cell which is not rechargeable, a secondary cell which is rechargeable, or a fuel cell.

The communication module 390 may support establishing a direct (e.g., wired) communication channel or a wireless communication channel between the electronic device 301 and the external electronic device (e.g., the electronic device 302, the electronic device 304, or the server 308) and performing communication via the established communication channel. The communication module 390 may include one or more communication processors that are operable independently from the processor 320 (e.g., the application processor (AP)) and supports a direct (e.g., wired) communication or a wireless communication. According to an embodiment of the disclosure, the communication module 390 may include a wireless communication module 392 (e.g., a cellular communication module, a short-range wireless communication module, or a global navigation satellite system (GNSS) communication module) or a wired communication module 394 (e.g., a local area network (LAN) communication module or a power line communication (PLC) module). A corresponding one of these communication modules may communicate with the external electronic device via the first network 398 (e.g., a short-range communication network, such as Bluetooth™, wireless-fidelity (Wi-Fi) direct, or infrared data association (IrDA)) or the second network 399 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 392 may identify and authenticate the electronic device 301 in a communication network, such as the first network 398 or the second network 399, using subscriber information (e.g., international mobile subscriber identity (IMSI)) stored in the subscriber identification module 396.

The wireless communication module 392 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 392 may support a high-frequency band (e.g., the mmWave band) to achieve, e.g., a high data transmission rate. The wireless communication module 392 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 392 may support various requirements specified in the electronic device 301, an external electronic device (e.g., the electronic device 304), or a network system (e.g., the second network 399). According to an embodiment of the disclosure, the wireless communication module 392 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1ms or less) for implementing URLLC.

The antenna module 397 may transmit or receive a signal or power to or from the outside (e.g., the external electronic device) of the electronic device 301. According to an embodiment of the disclosure, the antenna module 397 may include an antenna including a radiating element including a conductive material or a conductive pattern formed in or on a substrate (e.g., a printed circuit board (PCB)). According to an embodiment of the disclosure, the antenna module 397 may include a plurality of antennas (e.g., array antennas). In such a case, at least one antenna appropriate for a communication scheme used in the communication network, such as the first network 398 or the second network 399, may be selected, for example, by the communication module 390 (e.g., the wireless communication module 392) from the plurality of antennas. The signal or the power may then be transmitted or received between the communication module 390 and the external electronic device via the selected at least one antenna. According to an embodiment of the disclosure, another component (e.g., a radio frequency integrated circuit (RFIC)) other than the radiating element may be additionally formed as part of the antenna module 397.

According to various embodiments of the disclosure, the antenna module 397 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 301 and the external electronic device 304 via the server 308 coupled with the second network 399. Each of the electronic devices 302 or 304 may be a device of a same type as, or a different type, from the electronic device 301. According to an embodiment of the disclosure, all or some of operations to be executed at the electronic device 301 may be executed at one or more of the external electronic devices 302, 304, or 308. For example, if the electronic device 301 should perform a function or a service automatically, or in response to a request from a user or another device, the electronic device 301, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 301. The electronic device 301 may provide the outcome, with or without further processing of the outcome, as at least part of a reply to the request. To that end, a cloud computing, distributed computing, mobile edge computing (MEC), or client-server computing technology may be used, for example. The electronic device 301 may provide ultra low-latency services using, e.g., distributed computing or mobile edge computing. In another embodiment of the disclosure, the external electronic device 304 may include an internet-of-things (IoT) device. The server 308 may be an intelligent server using machine learning and/or a neural network. According to an embodiment of the disclosure, the external electronic device 304 or the server 308 may be included in the second network 399. The electronic device 301 may be applied to intelligent services (e.g., smart home, smart city, smart car, or healthcare) based on 5G communication technology or IoT-related technology.

An electronic device 100 according to an embodiment of the disclosure may include a first structure 110, a second structure 140 coupled to the first structure 110 so as to be slidable in a first direction D1 or a second direction D2 opposite to the first direction D1, a display 160 including one portion disposed on the first structure 110 and another portion accommodated in the second structure 140, the display 160 being configured such that a size of an exposed region that forms a front side of the electronic device 100 varies in response to a sliding motion of the second structure 140, a display support member 170 disposed on a rear surface of a partial region of the display 160 to support the partial region of the display 160, a first driving member 210 that connects one side of the first structure 110 and one side of the second structure 140 and provides a first driving force F_1 to the second structure 140 to move the second structure 140 in the first direction D1 relative to the first structure 110, and a second driving member 220 that is disposed on at least one of the first structure 110 and the display support member 170 and that provides a second driving force F_2 to the display support member 170 to move a portion of the display support member 170 in the first direction D1 relative to the first structure 110.

In various embodiments of the disclosure, the electronic device 100 may include a first state S1 in which the exposed region has a first size, a second state S2 in which the exposed region is expanded to a second size greater than the first size as the second structure 140 slides in the first direction D1 in respect to the first state, and a deformation interval TS defined as a state between the first state S1 and the second state S2. The deformation interval TS may include an interval in which the first driving member 210 and the second driving member 220 simultaneously operate.

In various embodiments of the disclosure, the deformation interval TS may include a third state S3 defined as a predetermined point in the deformation interval TS, a first interval TS1 defined between the first state S1 and the third state S3, and a second interval TS2 defined between the second state S2 and the third state S3. The first driving member 210 may provide the first driving force F_1 in the first interval TS1, the second interval TS2, and the third state S3. The second driving member 220 may provide the second driving force F_2 in the first interval TS1.

In various embodiments of the disclosure, the electronic device 100 may further include a support bar 180 that is coupled to the second structure 140 and that moves together with the second structure 140. The display 160 may be configured such that at least a portion thereof moves through a space between a sidewall of the second structure 140 and the support bar 180 in response to the sliding motion of the second structure 140. The first driving member 210 may be connected to a portion of the first structure 110 and the support bar 180.

In various embodiments of the disclosure, the first structure 110 may include a first case 120 that surrounds at least a portion of the second structure 140 and a bracket 130 coupled to the first case 120. The support bar 180 may extend in a direction perpendicular to the sliding direction and may be disposed to be spaced apart from the sidewall of the second structure 140 by a predetermined gap. The first driving member 210 may be coupled to the bracket 130 at one portion thereof and coupled to the support bar 180 at another portion thereof to connect the bracket 130 and the support bar 180.

In various embodiments of the disclosure, the first driving member 210 may include a first arm 211 connected to the bracket 130, a second arm 212 connected to the support bar 180, a rotary shaft 213 that rotatably connects one end of the first arm 211 and one end of the second arm 212, and a first elastic member 214 that provides an elastic force to the first arm 211 and the second arm 212.

In various embodiments of the disclosure, the first arm 211 may include a first connecting shaft 215 formed at an opposite end of the first arm 211 and connected to the bracket 130. The second arm 212 may include a second connecting shaft 216 formed at an opposite end of the second arm 212 and connected to the support bar 180. The first elastic member 214 may apply an elastic force to the first arm 211 and the second arm 212 in a direction in which the first connecting shaft 215 and the second connecting shaft 216 move away from each other. A distance between the first connecting shaft 215 and the second connecting shaft 216 may vary between a first length L1 and a second length L2 greater than the first length L1 in response to the sliding motion of the second structure 140.

In various embodiments of the disclosure, the first driving member 210 may be configured such that the first arm 211 rotates about the first connecting shaft 215 in a first rotational direction, the second arm 212 rotates about the second connecting shaft 216 in a second rotational direction opposite to the first rotational direction, and the rotary shaft 213 moves in a direction perpendicular to the sliding direction.

In various embodiments of the disclosure, the second driving member 220 may include a fixed member 221 fixed to the first structure 110, a movable member 222 coupled to the fixed member 221 so as to be movable, and a second elastic member 223 disposed between the fixed member 221 and the movable member 222. The second elastic member 223 may provide an elastic force to move the movable member 222 in the first direction D1 relative to the fixed member 221. The movable member 222 may move in the first direction D1 by a specified length by the elastic force to provide the second driving force F_2 to the display support member 170.

In various embodiments of the disclosure, the electronic device 100 may include a first state S1 in which the exposed region has a first size, a second state S2 in which the exposed region is expanded to a second size greater than the first size, and a third state S3 in which a size of the exposed region is greater than the first size and smaller than the second size. The second driving member 220 may be configured such that when the electronic device 100 is changed from the first state S1 to the third state S3, the second elastic member 223 extends by a third length L3 and the movable member 222 moves in the first direction D1 by the third length L3.

In various embodiments of the disclosure, the movable member 222 may be configured such that a movement in the first direction D1 is limited by the fixed member 221 in the third state S3. When the electronic device 100 is changed from the third state S3 to the second state S2, a portion of the display support member 170 may be spaced apart from the movable member 222 in the first direction D1, and a length of the second elastic member 223 may remain substantially the same.

In various embodiments of the disclosure, the movable member 222 may remain brought into contact with the display support member 170 in the first state S1, the third state S3, and a first interval TS1 defined as an interval between the first state S1 and the third state S3. The movable member 222 may be separated from the display support member 170 in the second state S2 and a second interval TS2 defined as an interval between the third state S3 and the second state S2.

In various embodiments of the disclosure, the display support member 170 may include a first portion 171 including a plurality of bars extending in a direction perpendicular to the first direction D1 and a second portion 172 extending from the first portion 171 in the second direction D2 opposite to the first direction D1. At least a portion of the second portion 172 may form an end portion of the display support member 170, and the second driving force F_2 may be provided to the second portion 172.

In various embodiments of the disclosure, the second driving member 220 may include a third elastic member 241 disposed on the second portion 172 of the display support member 170. The third elastic member 241 may be located between the second portion 172 and one side of the first structure 110 and may move the second portion 172 in the first direction D1 relative to the first structure 110 by providing an elastic force to the first structure 110 in the second direction D2.

In various embodiments of the disclosure, the electronic device 100 may further include a guide member 192 coupled to the second structure 140 to move together with the second structure 140. The first structure 110 may include a first case 120 and a bracket 130 coupled to the first case 120. The guide member 192 may include a guide groove 1921 into which at least a portion of the display support member 170 is inserted such that a movement of the display support member 170 is guided. The display support member 170 may move along the guide groove 1921 when the second structure 140 slides.

In various embodiments of the disclosure, the electronic device 100 may further include a third driving member 250 disposed between one side of the bracket 130 and one side of the guide member 192. The third driving member 250 may include a first magnet 251 coupled to the bracket 130 and a second magnet 252 coupled to the guide member 192 to face the first magnet 251. The first magnet 251 and the second magnet 252 may be disposed such that identical magnetic poles face each other to generate a repulsive force between the first magnet 251 and the second magnet 252.

In various embodiments of the disclosure, the repulsive force may act in a direction parallel to the first direction D1, and a magnitude of the repulsive force may decrease with an increase in distance between the first magnet 251 and the second magnet 252.

An electronic device 100 according to an embodiment of the disclosure may include a first structure 110, a second structure 140 coupled to the first structure 110 so as to be slidable in a first direction D1 or a second direction D2 opposite to the first direction D1, a display 160 having an exposed region that forms a front side of the electronic device 100, the width W of the exposed region being varied in response to a sliding motion of the second structure 140 relative to the first structure 110, and the display 160 being configured such that the width W of the exposed region increases as the second structure 140 slides in the first direction D1 and the width W of the exposed region decreases as the second structure 140 slides in the second direction D2, a display support member 170 disposed on a rear surface of a partial region of the display 160, a first driving member 210 that provides a first driving force F_1 to the second structure 140, and a second driving member 220 that provides a second driving force F_2 to a portion of the display support member 170. The electronic device 100 may include a first state S1 in which the width W of the exposed region is a first width W1, a second state S2 in which the width W of the exposed region is a second width W2 greater than the first width W1, and a third state S3 in which the width W of the exposed region is a third width W3 greater than the first width W1 and smaller than the second width W2. The first driving member 210 may provide the first driving force F_1 to the second structure 140 in the first direction D1 in a deformation interval TS defined between the first stat S1 and the second state S2, when the electronic device 100 is changed from the first state S1 to the second state S2. The second driving member 220 may provide the second driving force F_2 to the display support member 170 in the first direction D1 in a first interval TS1 defined between the first state S1 and the third state S3 in the deformation interval TS, when the electronic device 100 is changed from the first state S1 to the second state S2.

In various embodiments of the disclosure, a magnitude of each of the first driving force F_1 and the second driving force F_2 may linearly decrease with an increase in the width W of the exposed region. A slope that is a ratio of an amount of decrease in a resultant force of the first driving force F_1 and the second driving force F_2 to an amount of increase in the width W of the exposed region may be defined. The slope may have a first slope in the first interval TS1 and may have a second slope smaller than the first slope in the second interval TS2.

In various embodiments of the disclosure, a magnitude of the second driving force F_2 applied to the display support member 170 may be substantially 0 in a second interval TS2 defined between the third state S3 and the second state S2 in the deformation interval TS.

The electronic device according to various embodiments may be one of various types of electronic devices. The electronic devices may include, for example, a portable communication device (e.g., a smailphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 340) including one or more instructions that are stored in a storage medium (e.g., an internal memory 336 or an external memory 338) that is readable by a machine (e.g., the electronic device 301). For example, a processor (e.g., the processor 320) of the machine (e.g., the electronic device 301) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
a first structure;
a second structure coupled to the first structure so as to be slidable in a first direction or a second direction opposite to the first direction;
a display including one portion disposed on the first structure and another portion accommodated in the second structure, the display being configured such that a size of an exposed region configured to form a front side of the electronic device varies in response to a sliding motion of the second structure;
a display support member disposed on a rear surface of a partial region of the display to support the partial region of the display;
a first driving member configured to connect one side of the first structure and one side of the second structure and provide a first driving force to the second structure to move the second structure in the first direction relative to the first structure; and
a second driving member disposed to face one end portion of the display support member and configured to provide a second driving force to the one end portion of the display support member to move a portion of the display support member in the first direction relative to the first structure.

2. The electronic device of claim 1,
wherein the electronic device includes:
   a first state in which the exposed region has a first size,
   a second state in which the exposed region is expanded to a second size greater than the first size as the second structure slides in the first direction with respect to the first state, and
   a deformation interval defined as a state between the first state and the second state, and
wherein the deformation interval includes an interval in which the first driving member and the second driving member simultaneously operate.

3. The electronic device of claim 2,
wherein the deformation interval includes a third state defined as a predetermined point in the deformation interval, a first interval defined between the first state and the third state, and a second interval defined between the second state and the third state,
wherein the first driving member is configured to provide the first driving force in the first interval, the second interval, and the third state, and
wherein the second driving member is configured to provide the second driving force in the first interval.

4. The electronic device of claim 1, further comprising:
a support bar coupled to the second structure and configured to move together with the second structure,
wherein the display is configured such that at least a portion thereof moves through a space between a sidewall of the second structure and the support bar in response to the sliding motion of the second structure, and
wherein the first driving member is connected to a portion of the first structure and the support bar.

5. The electronic device of claim 4,
wherein the first structure includes a first case configured to surround at least a portion of the second structure and a bracket coupled to the first case,
wherein the support bar extends in a direction perpendicular to the sliding direction and is disposed to be spaced apart from the sidewall of the second structure by a predetermined gap, and
wherein the first driving member is coupled to the bracket at one portion thereof and coupled to the support bar at another portion thereof to connect the bracket and the support bar.

6. The electronic device of claim 5, wherein the first driving member includes a first arm connected to the bracket, a second arm connected to the support bar, a rotary shaft configured to rotatably connect one end of the first arm and one end of the second arm, and a first elastic member configured to provide an elastic force to the first arm and the second arm.

7. The electronic device of claim 6,
wherein the first arm includes a first connecting shaft formed at an opposite end of the first arm and connected to the bracket,
wherein the second arm includes a second connecting shaft formed at an opposite end of the second arm and connected to the support bar,
wherein the first elastic member is configured to apply an elastic force to the first arm and the second arm in a direction in which the first connecting shaft and the second connecting shaft move away from each other, and
wherein a distance between the first connecting shaft and the second connecting shaft varies between a first length and a second length greater than the first length in response to the sliding motion of the second structure.

8. The electronic device of claim 7, wherein the first driving member is configured such that:
the first arm rotates about the first connecting shaft in a first rotational direction;
the second arm rotates about the second connecting shaft in a second rotational direction opposite to the first rotational direction; and
the rotary shaft moves in a direction perpendicular to the sliding direction.

9. The electronic device of claim 1,
wherein the second driving member includes a fixed member fixed to the first structure, a movable member coupled to the fixed member so as to be movable, and a second elastic member disposed between the fixed member and the movable member,
wherein the second elastic member provides an elastic force to move the movable member in the first direction relative to the fixed member, and
wherein the movable member is configured to move in the first direction by a specified length by the elastic force to provide the second driving force to the display support member.

10. The electronic device of claim 9,
wherein the electronic device includes a first state in which the exposed region has a first size, a second state in which the exposed region is expanded to a second size greater than the first size, and a third state in which a size of the exposed region is greater than the first size and smaller than the second size,
wherein the second driving member is configured such that when the electronic device is changed from the first state to the third state, and
wherein the second elastic member extends by a third length and the movable member moves in the first direction by the third length.

11. The electronic device of claim 10,
wherein the movable member is configured such that a movement in the first direction is limited by the fixed member in the third state, and
wherein when the electronic device is changed from the third state to the second state, a portion of the display support member is spaced apart from the movable member in the first direction, and a length of the second elastic member remains the same.

12. The electronic device of claim 10,
wherein the movable member remains in contact with the display support member in the first state, the third state, and a first interval defined as an interval between the first state and the third state, and wherein the movable member is separated from the display support member in the second state and a second interval defined as an interval between the third state and the second state.

13. The electronic device of claim 1, wherein the display support member includes a first portion including a plurality of bars extending in a direction perpendicular to the first direction and a second portion extending from the first portion in the second direction opposite to the first direction, and wherein at least a portion of the second portion forms the one end portion of the display support member which the second driving force is provided.

14. The electronic device of claim 13, wherein the second driving member includes a third elastic member disposed on the second portion of the display support member, and wherein the third elastic member is located between the second portion and one side of the first structure and is configured to move the second portion in the first direction relative to the first structure by providing an elastic force to the first structure in the second direction.

15. The electronic device of claim 1, wherein the first structure includes a first case and a bracket coupled to the first case, wherein the second structure includes a second case at least a portion of which is disposed inside the first case and a guide member coupled to the second case, wherein the guide member includes a guide groove into which at least a portion of the display support member is inserted such that a movement of the display support member is guided, and wherein the display support member is configured to move along the guide groove when the second structure slides.

16. The electronic device of claim 15, further comprising:

a third driving member disposed between one side of the bracket and one side of the guide member, wherein the third driving member includes a first magnet coupled to the bracket and a second magnet coupled to the guide member to face the first magnet, and wherein the first magnet and the second magnet are disposed such that identical magnetic poles face each other to generate a repulsive force between the first magnet and the second magnet.

17. The electronic device of claim 16, wherein the repulsive force acts in a direction parallel to the first direction, and wherein a magnitude of the repulsive force decreases with an increase in distance between the first magnet and the second magnet.

18. An electronic device comprising:

a first structure;

a second structure coupled to the first structure so as to be slidable in a first direction or a second direction opposite to the first direction;

a display having an exposed region configured to form a front side of the electronic device, a width of the exposed region being varied in response to a sliding motion of the second structure relative to the first structure, wherein the display is configured such that the width of the exposed region increases as the second structure slides in the first direction and the width of the exposed region decreases as the second structure slides in the second direction;

a display support member disposed on a rear surface of a partial region of the display;

a first driving member configured to provide a first driving force to the second structure; and a second driving member disposed to face one end portion of the display support member and configured to provide a second driving force to the one end portion of the display support member, wherein the electronic device includes a first state in which the width of the exposed region is a first width, a second state in which the width of the exposed region is a second width greater than the first width, and a third state in which the width of the exposed region is a third width greater than the first width and smaller than the second width, wherein the first driving member is configured to provide the first driving force to the second structure in the first direction in a deformation interval defined between the first state and the second state, when the electronic device is changed from the first state to the second state, and wherein the second driving member is configured to provide the second driving force to the display support member in the first direction in a first interval defined between the first state and the third state in the deformation interval, when the electronic device is changed from the first state to the third state.

19. The electronic device of claim 18, wherein a magnitude of each of the first driving force and the second driving force linearly decreases with an increase in the width of the exposed region, wherein a slope that is a ratio of an amount of decrease in a resultant force of the first driving force and the second driving force to an amount of increase in the width of the exposed region is defined, and wherein the slope has a first slope in the first interval and has a second slope smaller than the first slope in the rest of the deformation interval other than the first interval.

20. The electronic device of claim 18, wherein a magnitude of the second driving force applied to the display support member is 0 in a second interval defined between the third state and the second state in the deformation interval.

* * * * *